(12) United States Patent
Yamazaki et al.

(10) Patent No.: US 10,796,903 B2
(45) Date of Patent: Oct. 6, 2020

(54) SEMICONDUCTOR DEVICE, MANUFACTURING METHOD THEREOF, AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Tochigi (JP); Kenichi Okazaki, Tochigi (JP); Masami Jintyou, Shimotsuga (JP); Yukinori Shima, Tatebayashi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/194,664

(22) Filed: Nov. 19, 2018

(65) Prior Publication Data
US 2019/0103497 A1  Apr. 4, 2019

Related U.S. Application Data

(62) Division of application No. 15/451,804, filed on Mar. 7, 2017, now Pat. No. 10,134,914.

(30) Foreign Application Priority Data

Mar. 11, 2016 (JP) ................................ 2016-048704
Jun. 24, 2016 (JP) ................................ 2016-125378

(51) Int. Cl.
*H01L 21/02* (2006.01)
*H01L 29/786* (2006.01)
(Continued)

(52) U.S. Cl.
CPC ...... *H01L 21/02323* (2013.01); *G02F 1/1368* (2013.01); *H01L 21/0226* (2013.01);
(Continued)

(58) Field of Classification Search
CPC ............. H01L 29/786; H01L 29/78618; H01L 29/78621; H01L 29/7869; H01L 29/78693;
(Continued)

(56) References Cited

U.S. PATENT DOCUMENTS 5,459,347 A * 10/1995 Omura .............. H01L 29/66772
257/347
8,421,083 B2 4/2013 Yamazaki et al.
(Continued)

FOREIGN PATENT DOCUMENTS

CN 101826559 A 9/2010
CN 104867981 A 8/2015
(Continued)

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
(Continued)

*Primary Examiner* — Eduardo A Rodela
(74) *Attorney, Agent, or Firm* — Robinson Intellectual Property Law Office; Eric J. Robinson

(57) ABSTRACT

To improve field-effect mobility and reliability of a transistor including an oxide semiconductor film. Provided is a semiconductor device including an oxide semiconductor film. The semiconductor device includes a first insulating film, the oxide semiconductor film over the first insulating film, a second insulating film and a third insulating film over the oxide semiconductor film, and a gate electrode over the
(Continued)

second insulating film. The oxide semiconductor film includes a first oxide semiconductor film, a second oxide semiconductor film over the first oxide semiconductor film, and a third oxide semiconductor film over the second oxide semiconductor film. The first to third oxide semiconductor films contain the same element. The second oxide semiconductor film includes a region where the crystallinity is lower than the crystallinity of one or both of the first oxide semiconductor film and the third oxide semiconductor film.

8 Claims, 48 Drawing Sheets

(51) Int. Cl.
- G02F 1/1368 (2006.01)
- H01L 27/12 (2006.01)
- H01L 29/04 (2006.01)
- H01L 29/24 (2006.01)
- H01L 29/66 (2006.01)
- G02F 1/1333 (2006.01)
- H01L 27/32 (2006.01)

(52) U.S. Cl.
CPC .. *H01L 21/02263* (2013.01); *H01L 21/02266* (2013.01); *H01L 21/02565* (2013.01); *H01L 21/02631* (2013.01); *H01L 27/1225* (2013.01); *H01L 29/045* (2013.01); *H01L 29/24* (2013.01); *H01L 29/66969* (2013.01); *H01L 29/786* (2013.01); *H01L 29/7869* (2013.01); *H01L 29/78618* (2013.01); *H01L 29/78621* (2013.01); *H01L 29/78648* (2013.01); *H01L 29/78693* (2013.01); *H01L 29/78696* (2013.01); *G02F 1/13338* (2013.01); *G02F 2001/133357* (2013.01); *G02F 2201/123* (2013.01); *H01L 27/3262* (2013.01)

(58) Field of Classification Search
CPC ........... H01L 29/78696; H01L 21/0226; H01L 21/02323; H01L 29/78687
See application file for complete search history.

(56) References Cited

U.S. PATENT DOCUMENTS

| | | |
|---|---|---|
| 8,546,182 B2 | 10/2013 | Akimoto et al. |
| 8,552,434 B2 | 10/2013 | Akimoto et al. |
| 8,629,434 B2 | 1/2014 | Arai |
| 8,633,492 B2 | 1/2014 | Akimoto et al. |
| 8,686,425 B2 | 4/2014 | Yamazaki et al. |
| 8,704,216 B2 | 4/2014 | Godo et al. |
| 8,723,176 B2 | 5/2014 | Yamazaki |
| 8,748,886 B2 | 6/2014 | Yamazaki et al. |
| 8,759,167 B2 | 6/2014 | Akimoto et al. |
| 8,785,928 B2 | 7/2014 | Yamazaki et al. |
| 8,796,683 B2 | 8/2014 | Yamazaki |
| 8,890,159 B2 | 11/2014 | Yamazaki et al. |
| 8,901,557 B2 | 12/2014 | Yamazaki |
| 8,921,853 B2 | 12/2014 | Yamazaki |
| 8,937,306 B2 | 1/2015 | Yamazaki et al. |
| 8,946,702 B2 | 2/2015 | Yamazaki et al. |
| 8,946,704 B2 | 2/2015 | Yamazaki |
| 8,952,377 B2 | 2/2015 | Yamazaki et al. |
| 8,952,381 B2 | 2/2015 | Yamazaki |
| 8,963,148 B2 | 2/2015 | Matsubayashi et al. |
| 8,981,372 B2 | 3/2015 | Yamazaki |
| 8,987,731 B2 | 3/2015 | Yamazaki |
| 9,018,624 B2 | 4/2015 | Yamazaki |
| 9,054,134 B2 | 6/2015 | Yamazaki et al. |
| 9,059,219 B2 | 6/2015 | Sasagawa et al. |
| 9,064,899 B2 | 6/2015 | Godo et al. |
| 9,064,966 B2 | 6/2015 | Yamazaki et al. |
| 9,082,863 B2 | 7/2015 | Yamazaki |
| 9,112,043 B2 | 8/2015 | Arai |
| 9,123,573 B2 | 9/2015 | Yamazaki et al. |
| 9,130,047 B2 | 9/2015 | Sakakura et al. |
| 9,153,436 B2 | 10/2015 | Yamazaki et al. |
| 9,153,649 B2 | 10/2015 | Sasaki et al. |
| 9,153,699 B2 | 10/2015 | Yamazaki |
| 9,166,021 B2 | 10/2015 | Tezuka et al. |
| 9,166,060 B2 | 10/2015 | Yamazaki et al. |
| 9,166,061 B2 | 10/2015 | Yamazaki |
| 9,184,245 B2 | 11/2015 | Yamazaki |
| 9,190,525 B2 | 11/2015 | Yamazaki |
| 9,190,527 B2 | 11/2015 | Tezuka et al. |
| 9,196,745 B2 | 11/2015 | Yamazaki et al. |
| 9,209,256 B2 | 12/2015 | Tokunaga et al. |
| 9,209,307 B2 | 12/2015 | Yamazaki et al. |
| 9,214,474 B2 | 12/2015 | Yamazaki |
| 9,214,566 B2 | 12/2015 | Yamazaki |
| 9,219,161 B2 | 12/2015 | Yamazaki |
| 9,224,758 B2 | 12/2015 | Yamazaki et al. |
| 9,231,111 B2 | 1/2016 | Yamazaki et al. |
| 9,240,492 B2 | 1/2016 | Yamazaki |
| 9,245,958 B2 | 1/2016 | Yamazaki |
| 9,246,011 B2 | 1/2016 | Yamazaki et al. |
| 9,252,283 B2 | 2/2016 | Matsubayashi et al. |
| 9,252,287 B2 | 2/2016 | Yamazaki |
| 9,257,569 B2 | 2/2016 | Yamazaki et al. |
| 9,269,821 B2 | 2/2016 | Yamazaki |
| 9,281,408 B2 | 3/2016 | Yamazaki et al. |
| 9,281,409 B2 | 3/2016 | Yamazaki et al. |
| 9,281,412 B2 | 3/2016 | Takemura |
| 9,287,117 B2 | 3/2016 | Yamazaki et al. |
| 9,287,410 B2 | 3/2016 | Sasagawa et al. |
| 9,287,411 B2 | 3/2016 | Koezuka et al. |
| 9,293,540 B2 | 3/2016 | Yamazaki |
| 9,293,541 B2 | 3/2016 | Yamazaki et al. |
| 9,293,592 B2 | 3/2016 | Yamazaki |
| 9,293,602 B2 | 3/2016 | Yamazaki |
| 9,298,057 B2 | 3/2016 | Hosaka et al. |
| 9,318,618 B2 | 4/2016 | Endo et al. |
| 9,324,875 B2 | 4/2016 | Yamazaki |
| 9,324,876 B2 | 4/2016 | Kobayashi et al. |
| 9,331,100 B2 | 5/2016 | Yamazaki |
| 9,337,344 B2 | 5/2016 | Hanaoka |
| 9,343,579 B2 | 5/2016 | Yamazaki et al. |
| 9,349,593 B2 | 5/2016 | Yamazaki |
| 9,349,751 B2 | 5/2016 | Yamazaki et al. |
| 9,349,869 B2 | 5/2016 | Koezuka et al. |
| 9,349,874 B2 | 5/2016 | Akimoto et al. |
| 9,349,875 B2 | 5/2016 | Tsubuku et al. |
| 9,362,415 B2 | 6/2016 | Yamazaki |
| 9,368,516 B2 | 6/2016 | Yamazaki |
| 9,368,607 B2 | 6/2016 | Yamazaki et al. |
| 9,368,636 B2 | 6/2016 | Kurata et al. |
| 9,368,640 B2 | 6/2016 | Yamazaki |
| 9,373,711 B2 | 6/2016 | Yamazaki et al. |
| 9,391,095 B2 | 7/2016 | Yamazaki et al. |
| 9,391,096 B2 | 7/2016 | Yamazaki et al. |
| 9,391,157 B2 | 7/2016 | Suzuki et al. |
| 9,397,149 B2 | 7/2016 | Yamazaki et al. |
| 9,397,153 B2 | 7/2016 | Tanaka et al. |
| 9,401,432 B2 | 7/2016 | Kobayashi et al. |
| 9,401,714 B2 | 7/2016 | Yamazaki et al. |
| 9,412,876 B2 | 8/2016 | Koezuka et al. |
| 9,412,877 B2 | 8/2016 | Tanaka et al. |
| 9,419,018 B2 | 8/2016 | Sasagawa et al. |
| 9,431,547 B2 | 8/2016 | Yamazaki et al. |
| 9,437,747 B2 | 9/2016 | Yamazaki |
| 9,437,749 B2 | 9/2016 | Yamazaki |
| 9,443,592 B2 | 9/2016 | Kato et al. |
| 9,443,934 B2 | 9/2016 | Kobayashi et al. |
| 9,450,102 B2 | 9/2016 | Noda et al. |
| 9,455,349 B2 | 9/2016 | Suzawa et al. |
| 9,461,179 B2 | 10/2016 | Kobayashi et al. |
| 9,466,615 B2 | 10/2016 | Miyairi et al. |
| 9,472,678 B2 | 10/2016 | Yamazaki et al. |
| 9,472,679 B2 | 10/2016 | Yamazaki et al. |
| 9,472,681 B2 | 10/2016 | Yamazaki |

(56) References Cited

U.S. PATENT DOCUMENTS

| | | |
|---|---|---|
| 9,472,683 B2 | 10/2016 | Takemura |
| 9,477,294 B2 | 10/2016 | Nishijima et al. |
| 9,490,369 B2 | 11/2016 | Yamazaki |
| 9,496,408 B2 | 11/2016 | Yamazaki et al. |
| 9,496,411 B2 | 11/2016 | Yamazaki et al. |
| 9,496,412 B2 | 11/2016 | Koezuka et al. |
| 9,502,580 B2 | 11/2016 | Yamazaki |
| 9,530,892 B2 | 12/2016 | Koezuka et al. |
| 9,530,894 B2 | 12/2016 | Koezuka et al. |
| 9,530,897 B2 | 12/2016 | Yamazaki et al. |
| 9,553,202 B2 | 1/2017 | Kurata et al. |
| 9,559,213 B2 | 1/2017 | Yamazaki |
| 9,570,622 B2 | 2/2017 | Sasagawa et al. |
| 9,570,625 B2 | 2/2017 | Yamazaki |
| 9,583,570 B2 | 2/2017 | Yamazaki et al. |
| 9,583,601 B2 | 2/2017 | Yamazaki et al. |
| 9,583,634 B2 | 2/2017 | Tokunaga et al. |
| 9,595,435 B2 | 3/2017 | Tsubuku et al. |
| 9,601,632 B2 | 3/2017 | Yamazaki et al. |
| 9,620,650 B2 | 4/2017 | Yamazaki |
| 9,627,413 B2 | 4/2017 | Okazaki et al. |
| 9,627,418 B2 | 4/2017 | Yamazaki et al. |
| 9,627,545 B2 | 4/2017 | Yamazaki et al. |
| 9,660,102 B2 | 5/2017 | Godo et al. |
| 2003/0036234 A1* | 2/2003 | Doi ............ H01L 27/105 438/266 |
| 2008/0258141 A1* | 10/2008 | Park ............ H01L 29/78618 257/43 |
| 2009/0294772 A1* | 12/2009 | Jeong ............ H01L 27/1225 257/59 |
| 2010/0219410 A1 | 9/2010 | Godo et al. |
| 2010/0283049 A1* | 11/2010 | Sato ............ H01L 29/78606 257/43 |
| 2011/0220894 A1* | 9/2011 | Furukawa ........ H01L 21/0335 257/57 |
| 2011/0240987 A1* | 10/2011 | Lee ............ H01L 29/78648 257/43 |
| 2012/0126227 A1* | 5/2012 | Maeda ............ H01L 27/1225 257/43 |
| 2013/0161611 A1 | 6/2013 | Yamazaki et al. |
| 2013/0334533 A1 | 12/2013 | Yamazaki |
| 2014/0014947 A1 | 1/2014 | Yamazaki |
| 2014/0027762 A1 | 1/2014 | Tsurume et al. |
| 2014/0030846 A1 | 1/2014 | Akimoto et al. |
| 2014/0042434 A1 | 2/2014 | Yamazaki |
| 2014/0110703 A1 | 4/2014 | Yamazaki |
| 2014/0175435 A1 | 6/2014 | Yamazaki et al. |
| 2014/0239296 A1 | 8/2014 | Tokunaga et al. |
| 2014/0252345 A1 | 9/2014 | Tsubuku et al. |
| 2014/0264324 A1 | 9/2014 | Yamazaki |
| 2014/0306221 A1 | 10/2014 | Yamazaki et al. |
| 2014/0319516 A1 | 10/2014 | Tanaka et al. |
| 2014/0339544 A1 | 11/2014 | Hanaoka et al. |
| 2015/0001533 A1 | 1/2015 | Kuwabara et al. |
| 2015/0008428 A1 | 1/2015 | Yamamoto et al. |
| 2015/0011046 A1 | 1/2015 | Tanaka et al. |
| 2015/0028330 A1 | 1/2015 | Yamazaki et al. |
| 2015/0034949 A1 | 2/2015 | Yamazaki |
| 2015/0076496 A1 | 3/2015 | Tanaka et al. |
| 2015/0079728 A1 | 3/2015 | Yamazaki |
| 2015/0079729 A1 | 3/2015 | Yamazaki |
| 2015/0097181 A1 | 4/2015 | Yamazaki |
| 2015/0109019 A1 | 4/2015 | Matsuda et al. |
| 2015/0118790 A1 | 4/2015 | Yamazaki et al. |
| 2015/0123127 A1 | 5/2015 | Yamazaki |
| 2015/0155363 A1 | 6/2015 | Nakazawa et al. |
| 2015/0179803 A1 | 6/2015 | Yamazaki et al. |
| 2015/0194532 A1 | 7/2015 | Yamazaki |
| 2015/0243738 A1 | 8/2015 | Shimomura et al. |
| 2015/0255310 A1 | 9/2015 | Yamazaki et al. |
| 2015/0311347 A1 | 10/2015 | Yamazaki |
| 2015/0325439 A1* | 11/2015 | Manthiram ........ C23C 18/1216 427/553 |
| 2015/0325708 A1 | 11/2015 | Yakubo et al. |
| 2015/0333160 A1 | 11/2015 | Yamazaki et al. |
| 2015/0349132 A1 | 12/2015 | Yamazaki |
| 2015/0372184 A1* | 12/2015 | Ogino ............ H01L 31/1804 438/57 |
| 2016/0027924 A1 | 1/2016 | Sasaki et al. |
| 2016/0049521 A1 | 2/2016 | Tezuka et al. |
| 2016/0064525 A1 | 3/2016 | Yamazaki |
| 2016/0079430 A1 | 3/2016 | Yamazaki |
| 2016/0079431 A1 | 3/2016 | Yamazaki |
| 2016/0079432 A1 | 3/2016 | Yamazaki et al. |
| 2016/0099353 A1 | 4/2016 | Yamazaki |
| 2016/0111053 A1 | 4/2016 | Yamazaki et al. |
| 2016/0111545 A1 | 4/2016 | Tanaka et al. |
| 2016/0111546 A1 | 4/2016 | Tezuka et al. |
| 2016/0111547 A1 | 4/2016 | Yamazaki et al. |
| 2016/0111548 A1 | 4/2016 | Yamazaki |
| 2016/0141422 A1 | 5/2016 | Matsubayashi et al. |
| 2016/0147099 A1 | 5/2016 | Hosaka et al. |
| 2016/0149055 A1 | 5/2016 | Yamazaki et al. |
| 2016/0155759 A1 | 6/2016 | Yamazaki et al. |
| 2016/0155854 A1 | 6/2016 | Yamazaki |
| 2016/0163742 A1 | 6/2016 | Yamazaki et al. |
| 2016/0163870 A1 | 6/2016 | Ito et al. |
| 2016/0172500 A1 | 6/2016 | Yamazaki et al. |
| 2016/0181438 A1 | 6/2016 | Yamazaki et al. |
| 2016/0190232 A1 | 6/2016 | Yamazaki et al. |
| 2016/0190330 A1 | 6/2016 | Yamazaki |
| 2016/0190346 A1 | 6/2016 | Kawata et al. |
| 2016/0190347 A1 | 6/2016 | Sasagawa et al. |
| 2016/0190348 A1 | 6/2016 | Koezuka et al. |
| 2016/0218219 A1 | 7/2016 | Asami et al. |
| 2016/0233339 A1 | 8/2016 | Okazaki |
| 2016/0233340 A1 | 8/2016 | Shimomura et al. |
| 2016/0240683 A1 | 8/2016 | Miyake et al. |
| 2016/0240684 A1 | 8/2016 | Yamazaki et al. |
| 2016/0240693 A1 | 8/2016 | Yamazaki |
| 2016/0247832 A1 | 8/2016 | Suzawa et al. |
| 2016/0247928 A1 | 8/2016 | Yamazaki |
| 2016/0247929 A1 | 8/2016 | Noda |
| 2016/0247930 A1 | 8/2016 | Akimoto et al. |
| 2016/0247934 A1 | 8/2016 | Hanaoka |
| 2016/0247935 A1 | 8/2016 | Yamazaki et al. |
| 2016/0254291 A1 | 9/2016 | Yamazaki et al. |
| 2016/0254371 A1 | 9/2016 | Koezuka et al. |
| 2016/0254386 A1 | 9/2016 | Yamazaki et al. |
| 2016/0254387 A1 | 9/2016 | Yamazaki |
| 2016/0260822 A1 | 9/2016 | Okamoto et al. |
| 2016/0260835 A1 | 9/2016 | Yamazaki et al. |
| 2016/0260837 A1 | 9/2016 | Koezuka et al. |
| 2016/0260838 A1 | 9/2016 | Yamazaki |
| 2016/0276488 A1 | 9/2016 | Yamazaki |
| 2016/0284823 A1 | 9/2016 | Yamazaki |
| 2016/0284854 A1 | 9/2016 | Okazaki et al. |
| 2016/0284856 A1 | 9/2016 | Shimomura et al. |
| 2016/0284862 A1 | 9/2016 | Yamazaki et al. |
| 2016/0293640 A1 | 10/2016 | Yamazaki |
| 2016/0293766 A1 | 10/2016 | Kurata et al. |
| 2016/0293768 A1 | 10/2016 | Yamazaki et al. |
| 2016/0293773 A1 | 10/2016 | Yamazaki et al. |
| 2016/0300952 A1 | 10/2016 | Toriumi et al. |
| 2016/0322505 A1 | 11/2016 | Yamazaki |
| 2016/0329436 A1 | 11/2016 | Kobayashi et al. |
| 2016/0343867 A1 | 11/2016 | Tsubuku et al. |
| 2016/0343868 A1 | 11/2016 | Koezuka et al. |
| 2016/0351589 A1 | 12/2016 | Sasagawa et al. |
| 2016/0359051 A1 | 12/2016 | Yamazaki |
| 2016/0365454 A1 | 12/2016 | Noda et al. |
| 2016/0380108 A1 | 12/2016 | Yamazaki et al. |
| 2017/0005202 A1 | 1/2017 | Kobayashi et al. |
| 2017/0012135 A1 | 1/2017 | Tanaka et al. |
| 2017/0012138 A1 | 1/2017 | Suzawa et al. |
| 2017/0018647 A1 | 1/2017 | Yamazaki |
| 2017/0018648 A1 | 1/2017 | Yamazaki |
| 2017/0018656 A1 | 1/2017 | Takemura |
| 2017/0025548 A1 | 1/2017 | Yamazaki |
| 2017/0033226 A1 | 2/2017 | Yamazaki et al. |
| 2017/0033229 A1 | 2/2017 | Yamazaki et al. |
| 2017/0033230 A1 | 2/2017 | Yamazaki et al. |
| 2017/0033238 A1 | 2/2017 | Koezuka et al. |

(56) References Cited

U.S. PATENT DOCUMENTS

| | | |
|---|---|---|
| 2017/0038826 A1 | 2/2017 | Nishijima et al. |
| 2017/0047435 A1 | 2/2017 | Koezuka et al. |
| 2017/0053950 A1 | 2/2017 | Koezuka et al. |
| 2017/0054031 A1 | 2/2017 | Yamazaki |
| 2017/0062620 A1 | 3/2017 | Yamazaki et al. |
| 2017/0069765 A1 | 3/2017 | Yamazaki et al. |
| 2017/0077313 A1 | 3/2017 | Yamazaki et al. |
| 2017/0256654 A1 | 9/2017 | Yamazaki et al. |

FOREIGN PATENT DOCUMENTS

| | | |
|---|---|---|
| JP | 2010-226101 A | 10/2010 |
| JP | 2014-007399 A | 1/2014 |
| JP | 2015-053477 A | 3/2015 |
| JP | 2016-074580 A | 5/2016 |
| KR | 2010-0098306 A | 9/2010 |
| KR | 2015-0099467 A | 8/2015 |
| TW | 201101490 | 1/2011 |
| TW | 201544458 | 12/2015 |

OTHER PUBLICATIONS

International Search Report (Application No. PCT/IB2017/051280) dated Jun. 13, 2017.
Written Opinion (Application No. PCT/IB2017/051280) dated Jun. 13, 2017.

\* cited by examiner

FIG. 21A Sample X2: 130°C, O₂=10%
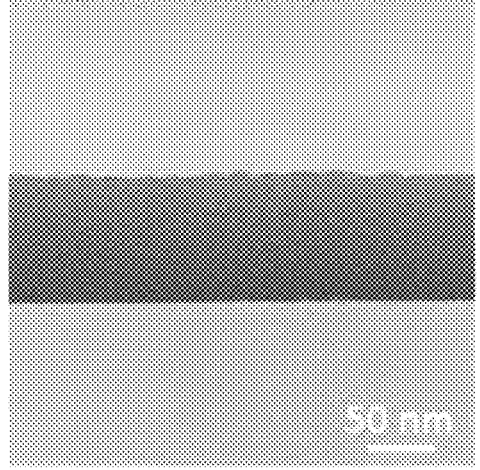
FIG. 21B Sample X2: 130°C, O₂=10%
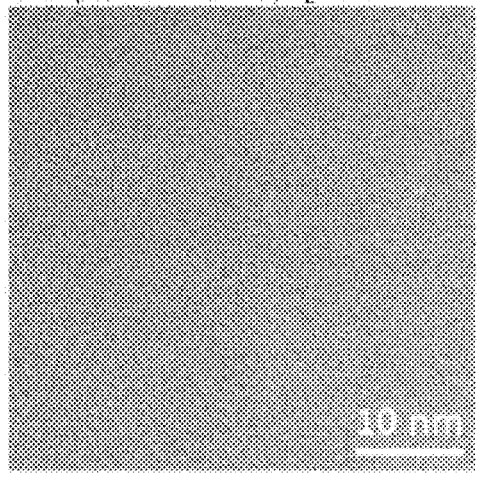
FIG. 21C Sample X2: 130°C, O₂=10%
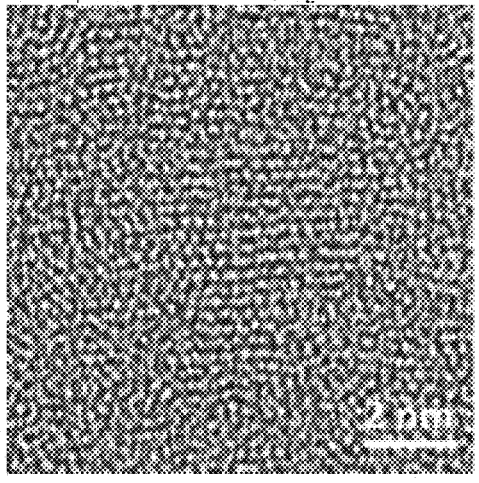

FIG. 22A  Sample X3: R.T., O₂=10%
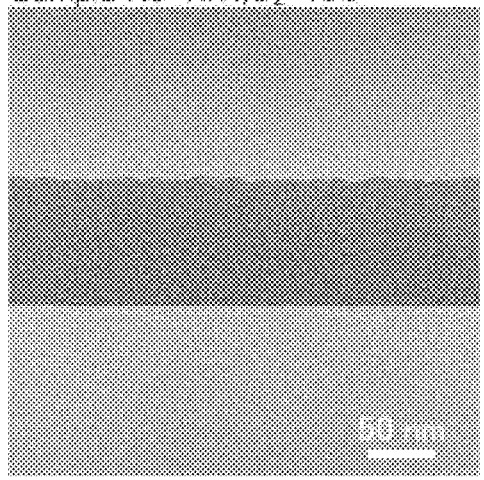
FIG. 22B  Sample X3: R.T., O₂=10%
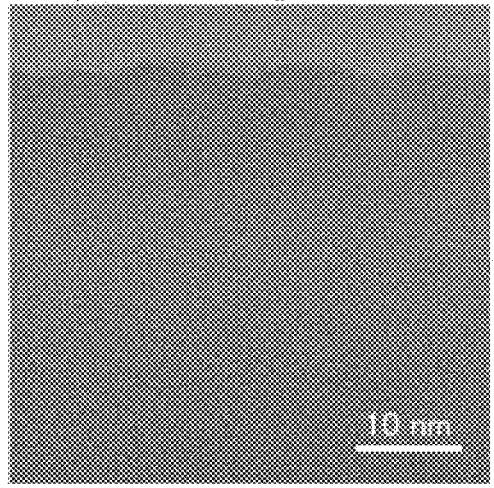
FIG. 22C  Sample X3: R.T., O₂=10%
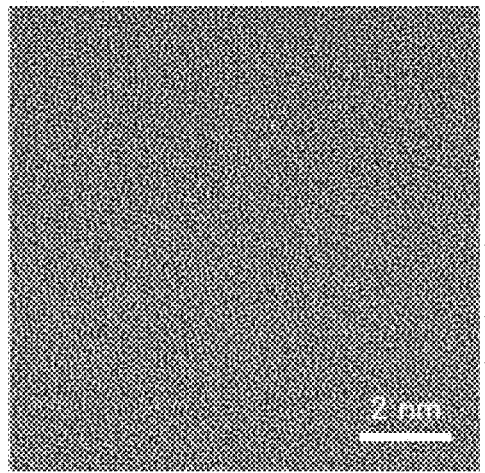

FIG. 24A  Sample X2:130°C,O₂=10%
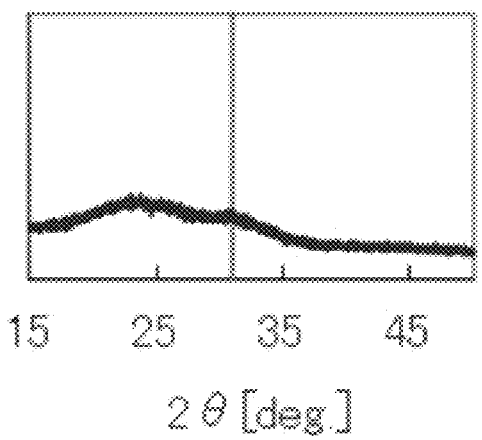
FIG. 24B  Sample X2:130°C,O₂=10%
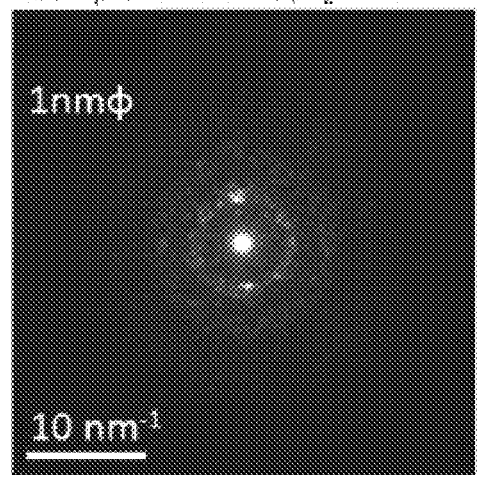
FIG. 24C  Sample X2:130°C,O₂=10%
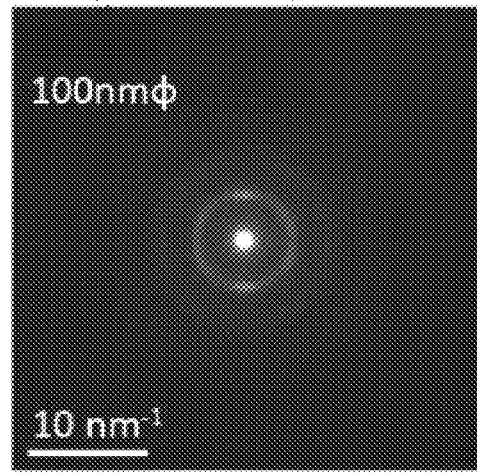

Raw Image

Contrast Controlled

FIG. 29A1
Sample X1: 170°C, O₂=30%
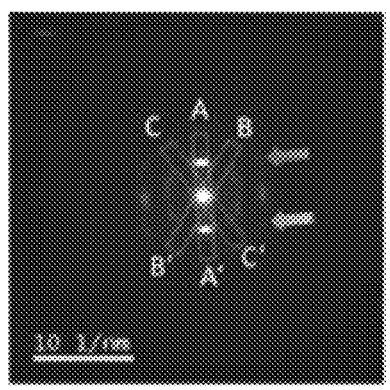
FIG. 29A2
Sample X1: 170°C, O₂=30%
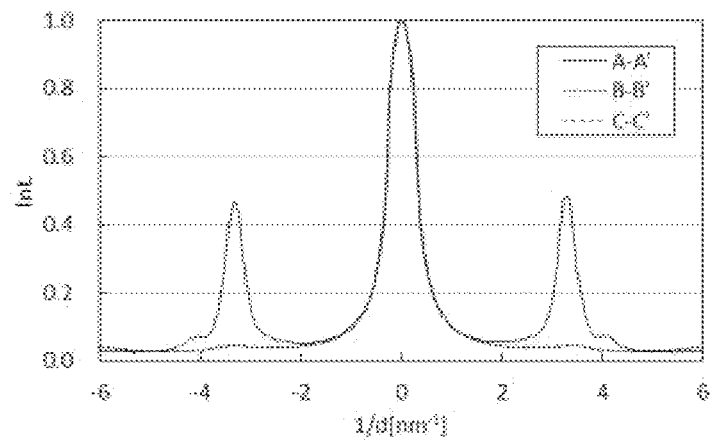
FIG. 29B1
Sample X2: 130°C, O₂=10%
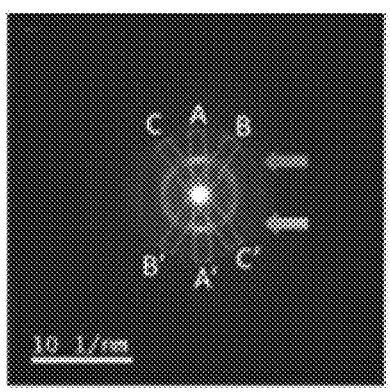
FIG. 29B2
Sample X2: 130°C, O₂=10%
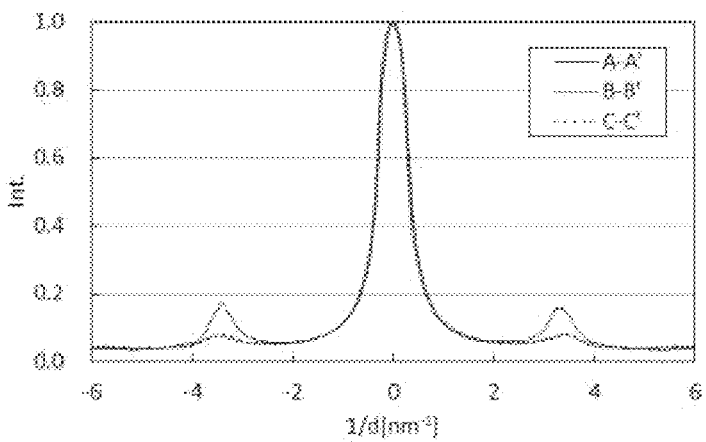
FIG. 29C1
Sample X3: R.T., O₂=10%
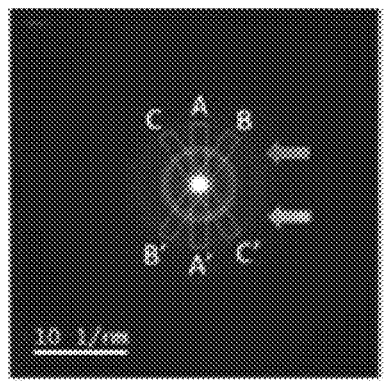
FIG. 29C2
Sample X3: R.T., O₂=10%
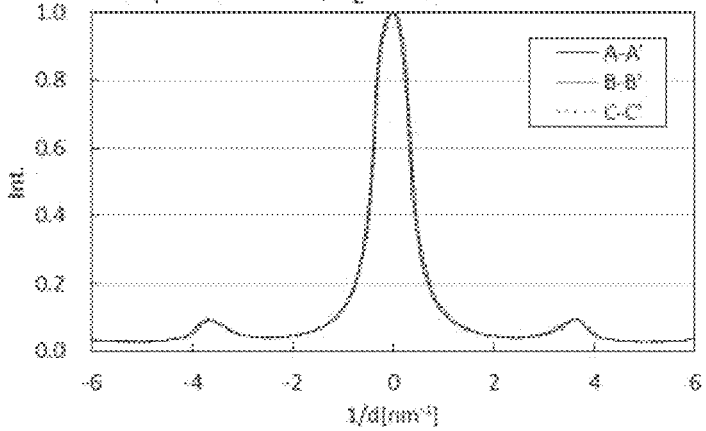

FIG. 31A1
Sample X1: 170°C, $O_2$=30%
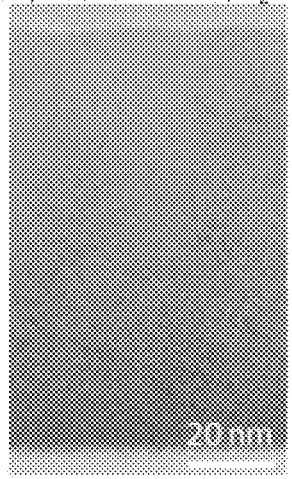
FIG. 31A2
Sample X1: 170°C, $O_2$=30%
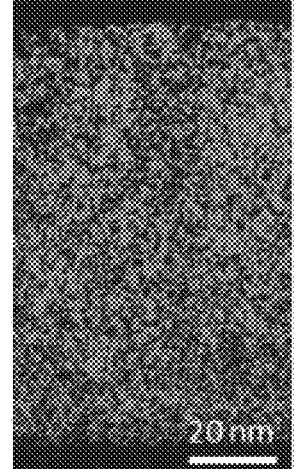
FIG. 31B1
Sample X2: 130°C, $O_2$=10%
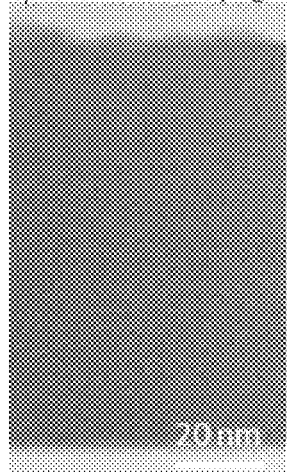
FIG. 31B2
Sample X2: 130°C, $O_2$=10%
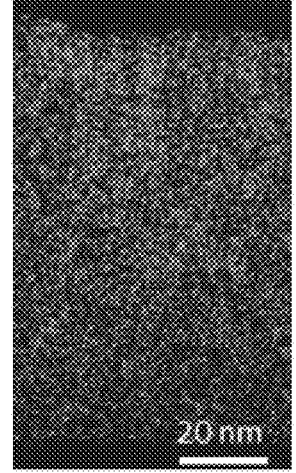
FIG. 31C1
Sample X3: R.T., $O_2$=10%
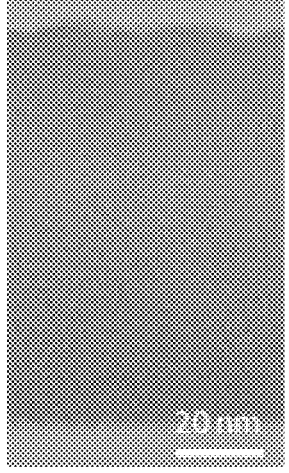
FIG. 31C2
Sample X3: R.T., $O_2$=10%
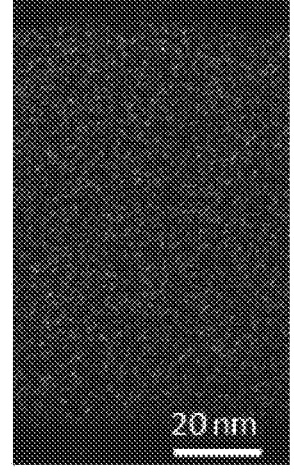

9100

9200

9101

9201

9102

9201

9201

SEMICONDUCTOR DEVICE, MANUFACTURING METHOD THEREOF, AND DISPLAY DEVICE INCLUDING THE SEMICONDUCTOR DEVICE

TECHNICAL FIELD

One embodiment of the present invention relates to a semiconductor device including an oxide semiconductor film and a manufacturing method of the semiconductor device. Another embodiment of the present invention relates to a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

As a semiconductor material that can be used in a transistor, an oxide semiconductor has been attracting attention. For example, Patent Document 1 discloses a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range of a homologous series. For example, in the solid solution range of the homologous series in the case where m=1, x ranges from −0.33 to 0.08, and in the solid solution range of the homologous series in the case where m=2, x ranges from −0.68 to 0.32.

REFERENCE

Patent Document

[Patent Document 1] Japanese Published Patent Application No. 2014-007399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315.

DISCLOSURE OF INVENTION

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and a current flows through the transistor.

Furthermore, in a transistor that uses an oxide semiconductor film in a channel region, oxygen vacancies which are formed in the oxide semiconductor film adversely affect the transistor characteristics. For example, hydrogen is trapped in oxygen vacancies formed in the oxide semiconductor film to serve as a carrier supply source. The carrier supply source generated in the oxide semiconductor film causes a change in the electrical characteristics, typically, shift in the threshold voltage, of the transistor including the oxide semiconductor film.

When the amount of oxygen vacancies in the oxide semiconductor film is too large, for example, the threshold voltage of the transistor is shifted in the negative direction, and the transistor has normally-on characteristics. Thus, especially in the channel region of the oxide semiconductor film, the amount of oxygen vacancies is preferably small or the amount with which the normally-on characteristics are not exhibited.

In view of the foregoing problems, an object of one embodiment of the present invention is to improve field-effect mobility and reliability of a transistor including an oxide semiconductor film. Another object of one embodiment of the present invention is to prevent a change in electrical characteristics of a transistor including an oxide semiconductor film and to improve reliability of the transistor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all of these objects. Objects other than the above objects will be apparent from and can be derived from the description of the specification and the like.

One embodiment of the present invention is a semiconductor device including an oxide semiconductor film. The semiconductor device includes a first insulating film, an oxide semiconductor film over the first insulating film, a second insulating film and a third insulating film over the oxide semiconductor film, and a gate electrode over the second insulating film. The oxide semiconductor film includes a first oxide semiconductor film, a second oxide semiconductor film over the first oxide semiconductor film, and a third oxide semiconductor film over the second oxide semiconductor film. The first to third oxide semiconductor films contain the same element. The second oxide semiconductor film includes a region where the crystallinity is lower than the crystallinity of one or both of the first oxide semiconductor film and the third oxide semiconductor film.

Another embodiment of the present invention is a semiconductor device including an oxide semiconductor film.

The semiconductor device includes a first gate electrode, a first insulating film over the first gate electrode, an oxide semiconductor film over the first insulating film, a second insulating film and a third insulating film over the oxide semiconductor film, and a second gate electrode over the second insulating film. The oxide semiconductor film includes a first oxide semiconductor film, a second oxide semiconductor film over the first oxide semiconductor film, and a third oxide semiconductor film over the second oxide semiconductor film. The first to third oxide semiconductor films contain the same element. The second oxide semiconductor film includes a region where the crystallinity is lower than the crystallinity of one or both of the first oxide semiconductor film and the third oxide semiconductor film.

Another embodiment of the present invention is a semiconductor device including an oxide semiconductor film. The semiconductor device includes a first gate electrode, a first insulating film over the first gate electrode, an oxide semiconductor film over the first insulating film, a second insulating film and a third insulating film over the oxide semiconductor film, and a second gate electrode over the second insulating film. The first gate electrode and the second gate electrode are connected through an opening provided in the first insulating film and the second insulating film. The first gate electrode and the second gate electrode each include a region positioned outside an edge portion of the oxide semiconductor film. The oxide semiconductor film includes a first oxide semiconductor film, a second oxide semiconductor film over the first oxide semiconductor film, and a third oxide semiconductor film over the second oxide semiconductor film. The first to third oxide semiconductor films contain the same element. The second oxide semiconductor film includes a region where the crystallinity is lower than the crystallinity of one or both of the first oxide semiconductor film and the third oxide semiconductor film.

In the above embodiments, it is preferable that the first to third oxide semiconductor films separately contain In, M (M is Al, Ga, Y, or Sn), and Zn.

In the above embodiments, it is preferable that their atomic ratio be In:M:Zn=4:2:3 or in its neighborhood. It is preferable that M be greater than or equal to 1.5 and less than or equal to 2.5 and Zn be greater than or equal to 2 and less than or equal to 4 when In is 4. In the above embodiments, it is preferable that their atomic ratio be In:M:Zn=5:1:6 or in its neighborhood. It is preferable that M be greater than or equal to 0.5 and less than or equal to 1.5 and Zn be greater than or equal to 5 and less than or equal to 7 when In is 5.

In the above embodiments, it is preferable that the second oxide semiconductor film be a composite oxide semiconductor that includes a first region and a second region. The first region contains $In_aM_bZn_cO_d$ (M represents Al, Ga, Y, or Sn, and a, b, c, and d each represent a given number). The second region contains $In_xZn_yO_z$ (x, y, and z each represent a given number). In the above embodiments, it is preferable that the second oxide semiconductor film include a region thicker than one or both of the first oxide semiconductor film and the third oxide semiconductor film.

In the above embodiments, it is preferable that one or both of the first oxide semiconductor film and the third oxide semiconductor film contain a crystal part. The crystal part preferably has c-axis alignment.

Another embodiment of the present invention is a display device including a display element and the semiconductor device described in any one of the above embodiments. Another embodiment of the present invention is a display module including the display device and a touch sensor. Another embodiment of the present invention is an electronic device including the display device, the display module, or the semiconductor device described in any one of the above embodiments. The electronic device further includes an operation key or a battery.

Another embodiment of the present invention is a manufacturing method of a semiconductor device including an oxide semiconductor film. The method includes the following steps: forming a first insulating film, forming an oxide semiconductor film over the first insulating film, forming a second insulating film and a third insulating film over the oxide semiconductor film, and forming a gate electrode over the second insulating film. The step of forming the oxide semiconductor film includes the following steps: forming a first oxide semiconductor film, forming a second oxide semiconductor film over the first oxide semiconductor film, and forming a third oxide semiconductor film over the second oxide semiconductor film. The first to third oxide semiconductor films are successively formed with a sputtering apparatus in vacuum.

In the above embodiment, it is preferable that the oxygen partial pressure of the second oxide semiconductor film be lower than the oxygen partial pressure of one or both of the first oxide semiconductor film and the third oxide semiconductor film.

One embodiment of the present invention can improve field-effect mobility and reliability of a transistor including an oxide semiconductor film. One embodiment of the present invention can prevent a change in electrical characteristics of a transistor including an oxide semiconductor film and improve the reliability of the transistor. One embodiment of the present invention can provide a semiconductor device with low power consumption. One embodiment of the present invention can provide a novel semiconductor device. One embodiment of the present invention can provide a novel display device.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 21A to 21C are cross-sectional TEM images and an HR-TEM image of an oxide semiconductor film.

FIGS. 22A to 22C are cross-sectional TEM images and an HR-TEM image of an oxide semiconductor film.

FIGS. 24A to 24C show XRD measurement results and electron diffraction patterns of an oxide semiconductor film.

FIGS. 29A1, 29A2, 29B1, 29B2, 29C1, and 29C2 show electron diffraction patterns and luminance profiles.

FIGS. 31A1, 31A2, 31B1, 31B2, 31C1, and 31C2 show cross-sectional TEM images and cross-sectional TEM images obtained through analysis thereof.

BEST MODE FOR CARRYING OUT THE INVENTION

Figure 1A:
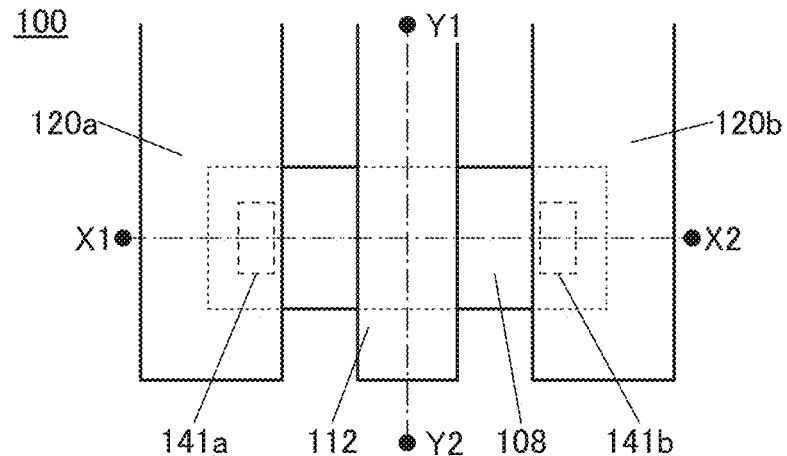
FIGS. 1A to 1C are a top view and cross-sectional views illustrating a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in an off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in an off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$-√$I_d$ characteristics). Alternatively, the threshold voltage of a transistor may refer to a gate voltage ($V_g$) at which the value of $I_d$ [A]×L [αm]/W [μm] is $1\times10^{-9}$ [A] where L is channel length and W is channel width.

In this specification and the like, a "semiconductor" can have characteristics of an "insulator" when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both of the nano crystal (nc) crystal structure and the CAAC crystal structure. Furthermore, tIGZO has the nc crystal structure. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of greater than or equal to 0.5 nm and less than or equal to 10 nm, preferably greater than or equal to 0.5 nm and less than or equal to 3 nm and are dispersed in the material, in some cases.

Embodiment 1

In this embodiment, a semiconductor device of one embodiment of the present invention and a manufacturing method of the semiconductor device are described with reference to FIGS. 1A to 1C to FIGS. 12A and 12B.

1-1. Structural Example 1 of Semiconductor Device

Figure 1B:
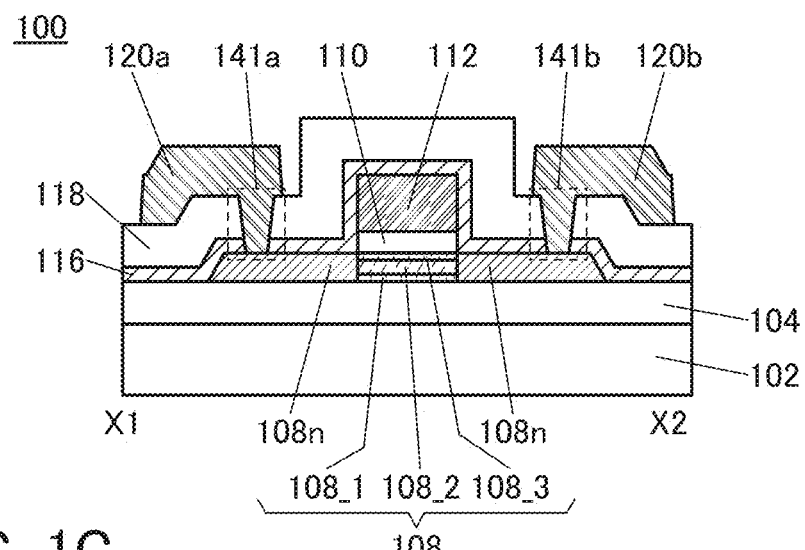
Figure 1C:
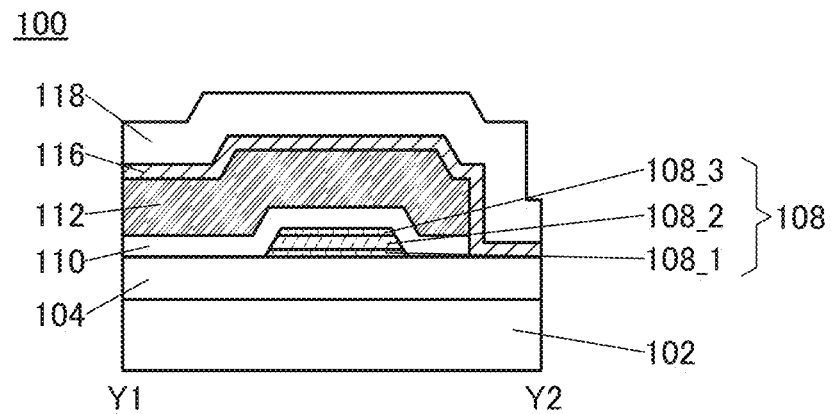

FIG. 1A is a top view of a transistor 100 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. Furthermore, the direction of the dashed dotted line X1-X2 may be referred to as a channel length direction, and the direction of the dashed dotted line Y1-Y2 may be referred to as a channel width direction. As in FIG. 1A, some components are not illustrated in some cases in top views of transistors described below.

The transistor 100 illustrated in FIGS. 1A to 1C is a top-gate transistor.

The transistor 100 includes an insulating film 104 over a substrate 102; an oxide semiconductor film 108 over the insulating film 104; an insulating film 110 over the oxide semiconductor film 108; a conductive film 112 over the insulating film 110; and an insulating film 116 over the insulating film 104, the oxide semiconductor film 108, and the conductive film 112.

A region of the oxide semiconductor film 108 which overlaps with the conductive film 112 includes an oxide semiconductor film 108_1 over the insulating film 104, an oxide semiconductor film 108_2 over the oxide semiconductor film 108_1, and an oxide semiconductor film 108_3 over the oxide semiconductor film 108_2. Note that the oxide semiconductor films 108_1 to 108_3 contain the same element. For example, it is preferable that the oxide semiconductor films 108_1 to 108_3 each independently contain In, M (M is Al, Ga, Y, or Sn), and Zn.

The oxide semiconductor film 108 includes regions 108n which do not overlap with the conductive film 112 and is in contact with the insulating film 116. The regions 108n are regions where the oxide semiconductor film 108_1, the oxide semiconductor film 108_2, and the oxide semiconductor film 108_3 become n-type. Note that the regions 108n are in contact with the insulating film 116. The insulating film 116 contains nitrogen or hydrogen. Nitrogen or hydrogen in the insulating film 116 is added to the regions 108n to increase the carrier density, thereby making the regions 108n n-type.

In addition, it is preferable that the oxide semiconductor film 108_1, the oxide semiconductor film 108_2, and the oxide semiconductor film 108_3 each independently include a region in which the atomic proportion of In is greater than the atomic proportion of M For example, the atomic ratio of In, M, and Zn in the oxide semiconductor film 108_1 is preferably In:M:Zn=4:2:3 or in its neighborhood. The atomic ratio of In, M, and Zn in the oxide semiconductor film 108_2 is preferably In:M:Zn=4:2:3 or in its neighborhood. The atomic ratio of In, M, and Zn in the oxide semiconductor film 108_3 is preferably In:M:Zn=4:2:3 or in its neighborhood. The term "neighborhood" includes the following: when In is 4, M is greater than or equal to 1.5 and less than or equal to 2.5, and Zn is greater than or equal to 2 and less than or equal to 4. The oxide semiconductor film 108_1, the oxide semiconductor film 108_2, and the oxide semiconductor film 108_3 can be formed using the same sputtering target owing to their substantially the same compositions. This can reduce manufacturing cost.

Note that the compositions of the oxide semiconductor films 108_1, 108_2, and 108_3 are not limited to these. For example, the oxide semiconductor films 108_1, 108_2, and 108_3 may have an atomic ratio of In:M:Zn=5:1:6 or in its neighborhood. The term "neighborhood" includes the following: when In is 5, M is greater than or equal to 0.5 and less than or equal to 1.5, and Zn is greater than or equal to 5 and less than or equal to 7.

When the oxide semiconductor film 108_1, the oxide semiconductor film 108_2, and the oxide semiconductor film 108_3 each independently include a region in which the atomic proportion of In is higher than the atomic proportion of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

On the other hand, even when the oxide semiconductor film 108_1, the oxide semiconductor film 108_2, and the oxide semiconductor film 108_3 each independently include a region in which the atomic proportion of In is higher than the atomic proportion of M, the field-effect mobility might be low if the oxide semiconductor film 108_1, the oxide semiconductor film 108_2, and the oxide semiconductor film 108_3 have low crystallinity.

However, in the semiconductor device of one embodiment of the present invention, the oxide semiconductor film 108_2 includes a region having lower crystallinity than one or both of the oxide semiconductor film 108_1 and the oxide semiconductor film 108_3. Note that the crystallinity of the oxide semiconductor film 108 can be determined by analysis by X-ray diffraction (XRD) or with a transmission electron microscope (TEM).

In the case where the oxide semiconductor film 108_2 has a region with low crystallinity, the following effects can be achieved.

First, oxygen vacancies that might be formed in the oxide semiconductor film 108 will be described.

Oxygen vacancies formed in the oxide semiconductor film 108 adversely affect the transistor characteristics and therefore cause a problem. For example, hydrogen is trapped in oxygen vacancies formed in the oxide semiconductor film 108 to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the amount of oxygen vacancies in the oxide semiconductor film 108 be as small as possible.

In one embodiment of the present invention, the insulating film in the vicinity of the oxide semiconductor film 108 contains excess oxygen. Specifically, one or both of the insulating film 110 which is formed over the oxide semiconductor film 108 and the insulating film 104 which is formed below the oxide semiconductor film 108 contain excess oxygen. Oxygen or excess oxygen is transferred from the insulating film 104 and/or the insulating film 110 to the oxide semiconductor film 108, whereby oxygen vacancies in the oxide semiconductor film can be reduced.

Figure 12A:
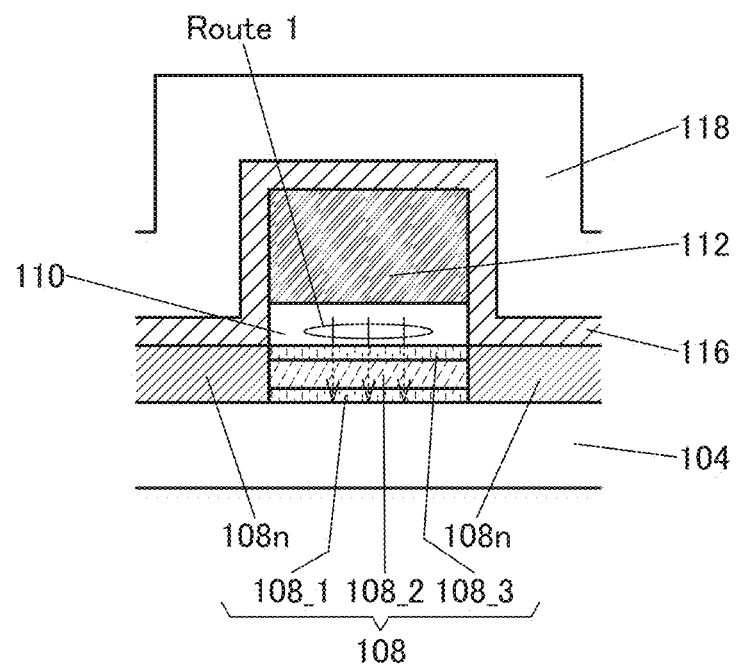
FIGS. 12A and 12B are schematic views illustrating diffusion paths of oxygen or excess oxygen diffused into an oxide semiconductor film.
Figure 12B:
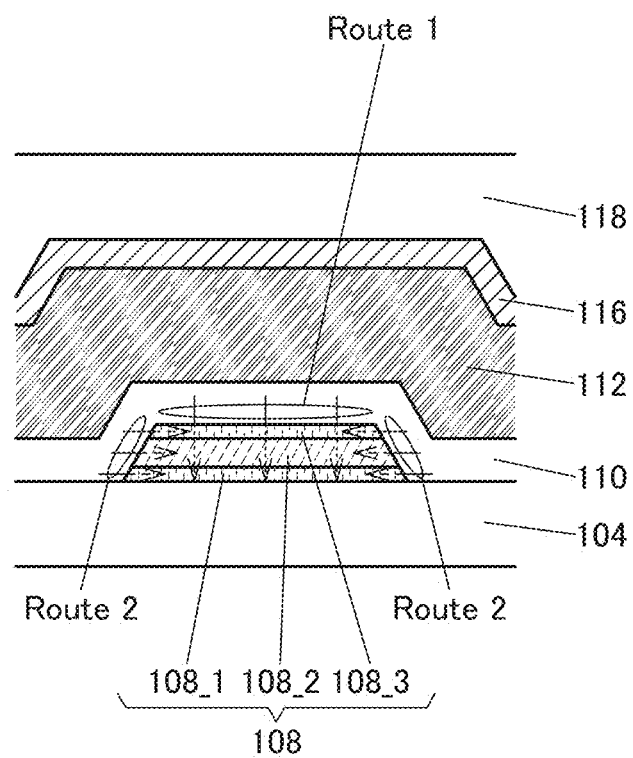

Here, the path of oxygen or excess oxygen diffused into the oxide semiconductor film 108 will be described with reference to FIGS. 12A and 12B. FIGS. 12A and 12B are schematic views illustrating the diffusion paths of oxygen or excess oxygen diffused into the oxide semiconductor film 108. FIG. 12A is the schematic view in the channel length direction and FIG. 12B is that in the channel width direction.

Oxygen or excess oxygen of the insulating film 110 is diffused to the oxide semiconductor film 108_2 and the oxide semiconductor film 108_1 from above, i.e., through the oxide semiconductor film 108_3 (Route 1 in FIGS. 12A and 12B).

Alternatively, oxygen or excess oxygen of the insulating film 110 is diffused into the oxide semiconductor film 108 through the side surfaces of the oxide semiconductor film 108_1, the oxide semiconductor film 108_2, and the oxide semiconductor film 108_3 (Route 2 in FIG. 12B).

For example, diffusion of oxygen or excess oxygen by Route 1 shown in FIGS. 12A and 12B is sometimes prevented when the oxide semiconductor film 108_3 has high crystallinity. In contrast, oxygen or excess oxygen can be diffused to the oxide semiconductor film 108_1, the oxide semiconductor film 108_2, and the oxide semiconductor film 108_3 through the side surfaces of the oxide semiconductor film 108_1, the oxide semiconductor film 108_2, and the oxide semiconductor film 108_3 by Route 2 shown in FIG. 12B.

Since the oxide semiconductor film 108_2 includes a region having lower crystallinity than the oxide semiconductor film 108_1 and the oxide semiconductor film 108_3, the region serves as a diffusion path of excess oxygen, so that excess oxygen can also be diffused to the oxide semiconductor film 108_1 and the oxide semiconductor film 108_3 that have higher crystallinity than the oxide semiconductor film 108_2 by Route 2 shown in FIG. 12B. It is thus preferable that the oxide semiconductor film 108_2 be thicker than the oxide semiconductor film 108_1 and the oxide semiconductor film 108_3 to widen the oxygen diffusion path. Although not shown in FIGS. 12A and 12B, when the insulating film 104 contains oxygen or excess oxygen, the oxygen or excess oxygen might also be diffused from the insulating film 104 into the oxide semiconductor film 108.

As described above, a stacked-layer structure that includes the oxide semiconductor films having different crystal structures is formed in a semiconductor device of one embodiment of the present invention and the region with low crystallinity serves as a diffusion path of excess oxygen, whereby the semiconductor device can be highly reliable.

If the oxide semiconductor film 108 only includes an oxide semiconductor film with low crystallinity, impurities (e.g., hydrogen or moisture) may enter the oxide semiconductor film 108, or the oxide semiconductor film 108 may be damaged. Impurities such as hydrogen or moisture entering the oxide semiconductor film 108 adversely affect the transistor characteristics to cause a problem. For this reason, the less the oxide semiconductor film 108 contains impurities such as hydrogen or moisture, the better.

In view of this, the crystallinity of each of the lower oxide semiconductor film (the oxide semiconductor film 108_1) and the upper oxide semiconductor film (the oxide semiconductor film 108_3) is increased in one embodiment of the present invention. Owing to this, impurities that might enter the oxide semiconductor film 108_2 can be suppressed. Particularly when the oxide semiconductor film 108_3 has high crystallinity, damage that might be caused when the insulating film 110 is formed can be suppressed. The surface of the oxide semiconductor film 108, that is, the surface of the oxide semiconductor film 108_3 is easily damaged because it is the formation surface of the insulating film 110. However, the damage that might be caused when the insulating film 110 is formed can be suppressed because the oxide semiconductor film 108_3 includes a high-crystallinity region.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ µm and a channel length of 10 µm, the off-state current can be less than or equal to the measurement limit of a semiconductor parameter analyzer, that is, less than or equal to $1\times10-13$ A, at a voltage (drain voltage) between a source electrode and a drain electrode of from 1 V to 10 V.

By including a region having lower crystallinity than the oxide semiconductor film 108_1 and the oxide semiconductor film 108_3, the oxide semiconductor film 108_2 sometimes has a high carrier density.

When the oxide semiconductor film 108_2 has a high carrier density, the Fermi level is sometimes high relative to the conduction band of the oxide semiconductor film 108_2. This lowers the conduction band minimum of the oxide semiconductor film 108_2, so that the energy difference between the conduction band minimum of the oxide semiconductor film 108_2 and the trap level, which might be formed in a gate insulating film (here, the insulating film 110), is increased in some cases. The increase of the energy difference can reduce trap of charges in the gate insulating film and reduce variation in the threshold voltage of the transistor, in some cases. In addition, when the oxide semiconductor film 108_2 has a higher carrier density, the oxide semiconductor film 108 can have higher field-effect mobility.

It is favorable to use a composite oxide semiconductor that includes a first region containing $In_aM_bZn_cO_d$ (M represents Al, Ga, Y, or Sn, and a, b, c, and d each represent a given number) and a second region containing $In_xZn_yO_z$ (x, y, and z each represent a given number) as the oxide semiconductor film 108_2. The details of the composite oxide semiconductor film will be described in Embodiment 2.

As illustrated in FIGS. 1A to 1C, the transistor 100 may further include an insulating film 118 over the insulating film 116, a conductive film 120a electrically connected to the region 108n through an opening 141a formed in the insulating films 116 and 118; and a conductive film 120b electrically connected to the region 108n through an opening 141b formed in the insulating films 116 and 118.

Note that in this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive films 112, 120a, and 120b function as a gate electrode, a source electrode, and a drain electrode, respectively.

The insulating film 110 functions as a gate insulating film. The insulating film 110 includes an excess oxygen region. Since the insulating film 110 includes the excess oxygen region, excess oxygen can be supplied to the oxide semiconductor film 108. As a result, oxygen vacancies that might be formed in the oxide semiconductor film 108 can be filled with excess oxygen, and the semiconductor device can have high reliability.

To supply excess oxygen to the oxide semiconductor film 108, excess oxygen may be supplied to the insulating film 104 that is formed below the oxide semiconductor film 108. In that case, excess oxygen contained in the insulating film 104 might also be supplied to the regions 108n, which is not desirable because the resistance of the regions 108n might be increased. In contrast, in the structure in which the insulating film 110 formed over the oxide semiconductor film 108 contains excess oxygen, excess oxygen can be selectively supplied only to a region overlapping with the conductive film 112.

1-2. Components of Semiconductor Device

Next, components of the semiconductor device in this embodiment are described in detail.
[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure including an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased. In addition, interface states at the interface between the insulating film 104 and the oxide semiconductor film 108 and oxygen vacancies included in the oxide semiconductor film 108 can be reduced.

For example, the insulating film 104 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Conductive Film]

The conductive film 112 functioning as a gate electrode and the conductive films 120a and 120b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

It is particularly preferred to use the oxide conductor described above as the conductive film 112, in which case excess oxygen can be added to the insulating film 110.

A Cu—X alloy film (X is Mn, Ni, Cr, Fe, Co, Mo, Ta, or Ti) may be used as the conductive films 112, 120a, and 120b. The use of a Cu—X alloy film results in lower fabrication costs because the film can be processed by wet etching.

Among the above-mentioned metal elements, any one or more elements selected from titanium, tungsten, tantalum, and molybdenum are preferably included in the conductive films 112, 120a, and 120b. A tantalum nitride film is particularly preferable as each of the conductive films 112, 120a, and 120b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Second Insulating Film]

As the insulating film 110 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 110 may have a layered structure of two or more layers.

The insulating film 110 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 110 is an insulating film capable of releasing oxygen. In order to provide the oxygen-excess region in the insulating film 110, the insulating film 110 is formed in an oxygen atmosphere, or the deposited insulating film 110 is subjected to heat treatment in an oxygen atmosphere, for example.

In the case of using a stacked-layer structure containing hafnium oxide for the insulating film 110, the following effects are attained. Hafnium oxide has higher dielectric constant than silicon oxide and silicon oxynitride. Therefore, by using hafnium oxide, the thickness of the insulating film 110 can be made large as compared with the case of using silicon oxide; thus, leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

In addition to the above-described signal, a signal due to nitrogen dioxide (NO$_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide (NO$_2$) is higher than or equal to $1 \times 10^{17}$ spins/cm$^3$ and lower than $1 \times 10^{18}$ spins/cm$^3$ as the insulating film 110, for example.

Note that a nitrogen oxide (NO$_x$) such as nitrogen dioxide (NO$_2$) forms a state in the insulating film 110. The state is positioned in the energy gap of the oxide semiconductor film 108. Thus, when nitrogen oxide (NO$_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide (NO$_x$), for example, a silicon oxynitride film can be used. The silicon oxynitride film releases more ammonia than nitrogen oxide (NO$_x$) in thermal desorption spectroscopy (TDS) analysis; the typical released amount of ammonia is greater than or equal to $1 \times 10^{18}$ molecules/cm$^3$ and less than or equal to $5 \times 10^{19}$ molecules/cm$^3$. Note that the released amount of ammonia is the total amount of ammonia released by heat treatment in a range of 50° C. to 650° C. or 50° C. to 550° C. in TDS analysis.

Since nitrogen oxide (NO$_x$) reacts with ammonia and oxygen in heat treatment, the use of an insulating film that releases a large amount of ammonia reduces nitrogen oxide (NO$_x$).

Note that in the case where the insulating film 110 is analyzed by SIMS, the nitrogen concentration in the film is preferably lower than or equal to $6 \times 10^{20}$ atoms/cm$^3$.

[Oxide Semiconductor Film]

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In >M The atomic ratio of metal elements in such a sputtering target is, for example, In:M:Zn=2:1:3, In:M:Zn=3:1:2, In:M:Zn=4:2:4.1, or In:M:Zn=5:1:7.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratio of metal elements in the formed oxide semiconductor film 108 varies from the above atomic ratios of metal elements of the sputtering targets in a range of ±40%. For example, when a sputtering target used for the oxide semiconductor film 108 has an atomic ratio of In:Ga:Zn=4:2:4.1, the atomic ratio of the oxide semiconductor film 108 may be 4:2:3 or in its neighborhood. When a sputtering target used for the oxide semiconductor film 108 has an atomic ratio of In:Ga:Zn=5:1:7, the atomic ratio of the oxide semiconductor film 108 may be 5:1:6 or in its neighborhood.

The energy gap of the oxide semiconductor film 108 is 2 eV or more, preferably 2.5 eV or more. With the use of an oxide semiconductor having such a wide energy gap, the off-state current of the transistor 100 can be reduced.

Furthermore, the oxide semiconductor film 108 may have a non-single-crystal structure. Examples of the non-single-crystal structure include a c-axis-aligned crystalline oxide semiconductor (CAAC-OS) which will be described later, a polycrystalline structure, a microcrystalline structure, and an amorphous structure. Among the non-single-crystal structures, an amorphous structure has the highest density of defect states, whereas CAAC-OS has the lowest density of defect states.

[Third Insulating Film]

The insulating film 116 contains nitrogen or hydrogen. A nitride insulating film can be used as the insulating film 116, for example. The nitride insulating film can be formed using silicon nitride, silicon nitride oxide, silicon oxynitride, or the like. The hydrogen concentration in the insulating film 116 is preferably higher than or equal to $1 \times 10^{22}$ atoms/cm$^3$. The insulating film 116 is in contact with the region 108n of the oxide semiconductor film 108. Thus, the concentration of an impurity (nitrogen or hydrogen) in the region 108n in contact with the insulating film 116 is increased, leading to an increase in the carrier density of the region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

1-3. Structure Example 2 of Transistor

Next, a structure of a transistor different from that in FIGS. 1A to 1C will be described with reference to FIGS. 2A to 2C.

Figure 2A:
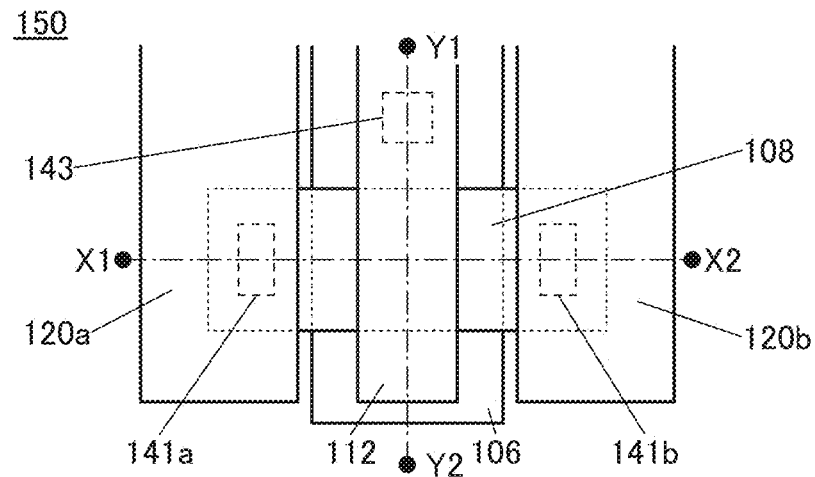
FIGS. 2A to 2C are a top view and cross-sectional views illustrating a semiconductor device.

FIG. 2A is a top view of the transistor 150. FIG. 2B is a cross-sectional view taken along a dashed-dotted line X1-X2 in FIG. 2A. FIG. 2C is a cross-sectional view taken along a dashed-dotted line Y1-Y2 in FIG. 2A.

Figure 2B:
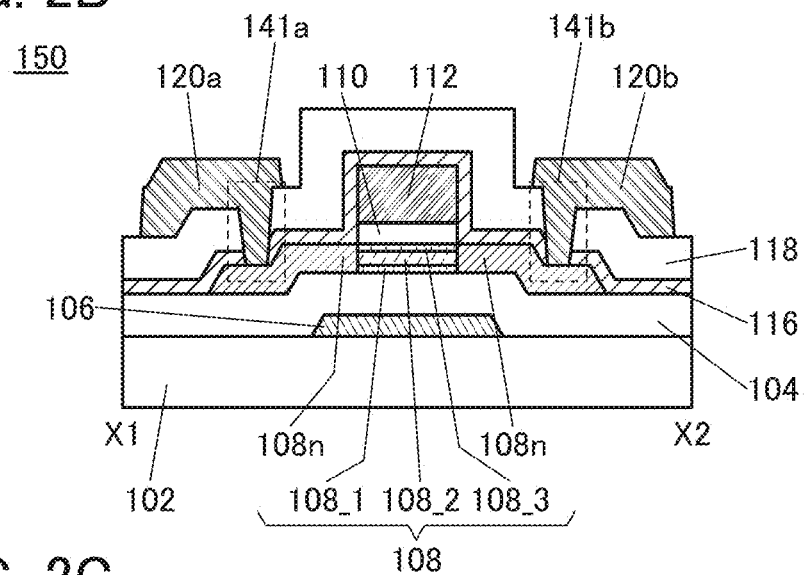
Figure 2C:
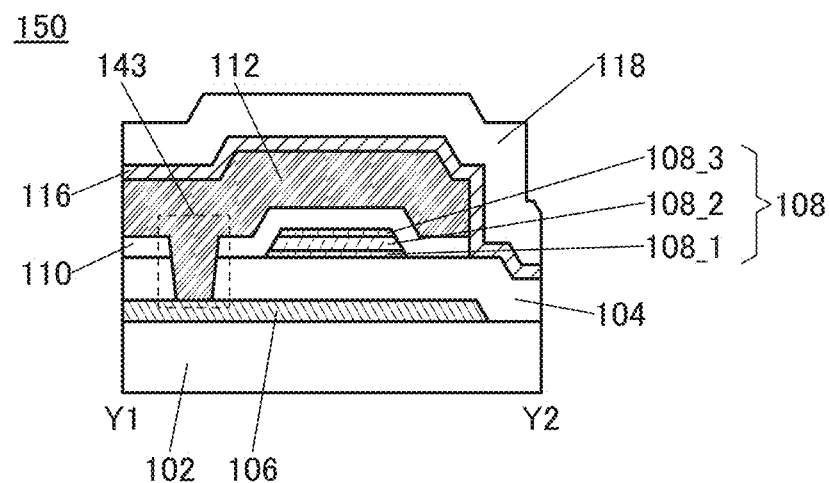

The transistor 150 illustrated in FIGS. 2A to 2C includes the conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112.

Note that the oxide semiconductor film 108 has a structure similar that in the transistor 100 shown in FIGS. 1A to 1C. The transistor 150 shown in FIGS. 2A to 2C includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light from the bottom that irradiates the oxide semiconductor film 108 where a channel region is formed can be reduced.

In the case of the structure of the transistor 150, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 150 as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 150, but also as power source supply wirings, signal supply wirings, connection wirings, or the like of the display device.

In this manner, unlike the transistor 100 described above, the transistor 150 in FIGS. 2A to 2C has a structure in which conductive films functioning as a gate electrode are provided over and under the oxide semiconductor film 108. As in the transistor 150, a semiconductor device of one embodiment of the present invention may have a plurality of gate electrodes.

As illustrated in FIGS. 2B and 2C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the oxide semiconductor film 108.

Such a structure enables the oxide semiconductor film 108 included in the transistor 150 to be electrically surrounded by electric fields of the conductive film 106 functioning as a first gate electrode and the conductive film 112 functioning as a second gate electrode. A device structure of a transistor, like that of the transistor 150, in which electric fields of the first gate electrode and the second gate electrode electrically surround the oxide semiconductor film 108 in which a channel region is formed can be referred to as a surrounded channel (S-channel) structure.

Since the transistor 150 has the S-channel structure, an electric field for inducing a channel can be effectively applied to the oxide semiconductor film 108 by the conductive film 106 or the conductive film 112; thus, the current drive capability of the transistor 150 can be improved and high on-state current characteristics can be obtained. As a result of the high on-state current, it is possible to reduce the size of the transistor 150. Furthermore, since the transistor 150 has a structure in which the oxide semiconductor film 108 is surrounded by the conductive film 106 and the conductive film 112, the mechanical strength of the transistor 150 can be increased.

When seen in the channel width direction of the transistor 150, an opening different from the opening 143 may be formed on the side of the oxide semiconductor film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3-V4) may be larger than the potential amplitude of the signal A (V1-V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 150 are similar to those of the transistor 100 described above and have similar effects.

Figure 3A:
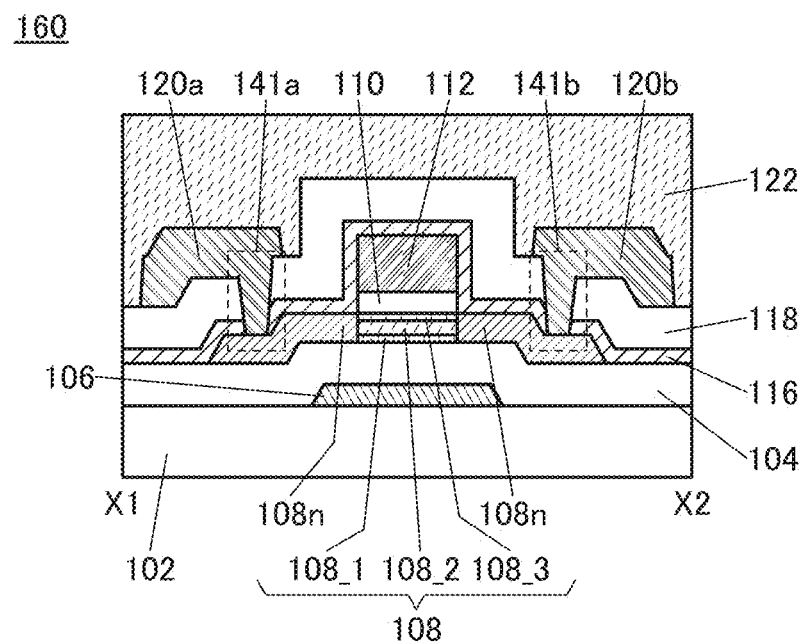
FIGS. 3A and 3B are cross-sectional views illustrating a semiconductor device.
Figure 3B:
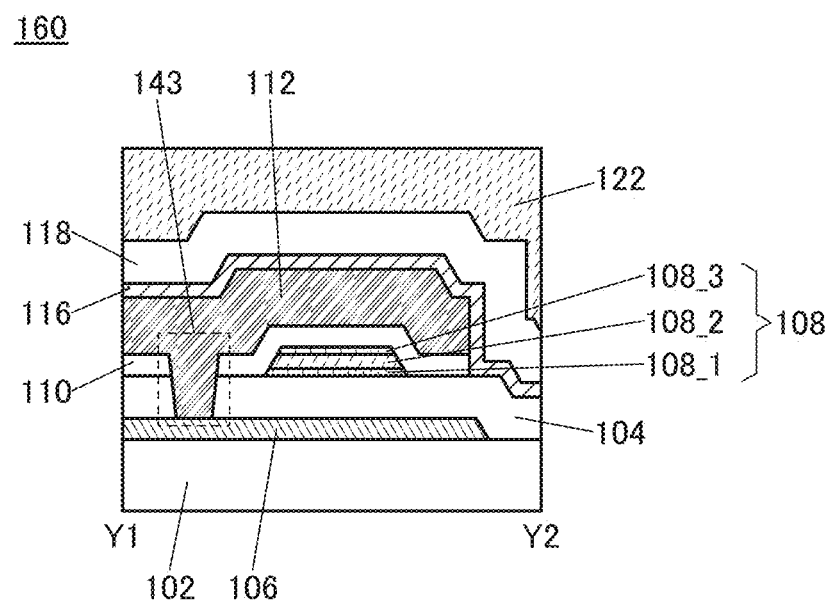

An insulating film may further be formed over the transistor 150. An example of such a case is illustrated in FIGS. 3A and 3B. FIGS. 3A and 3B are cross-sectional views of a transistor 160. The top view of the transistor 160 is not illustrated because it is similar to that of the transistor 150 in FIG. 2A.

The transistor 160 illustrated in FIGS. 3A and 3B includes an insulating film 122 over the conductive films 120a and 120b and the insulating film 118. The other components of the transistor 160 are similar to those of the transistor 150 and have similar effects.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

1-4. Structure Example 3 of Transistor

Next, a structure of a transistor different from that of the transistor 150 in FIGS. 2A to 2C will be described with reference to FIGS. 4A and 4B.

Figure 4A:
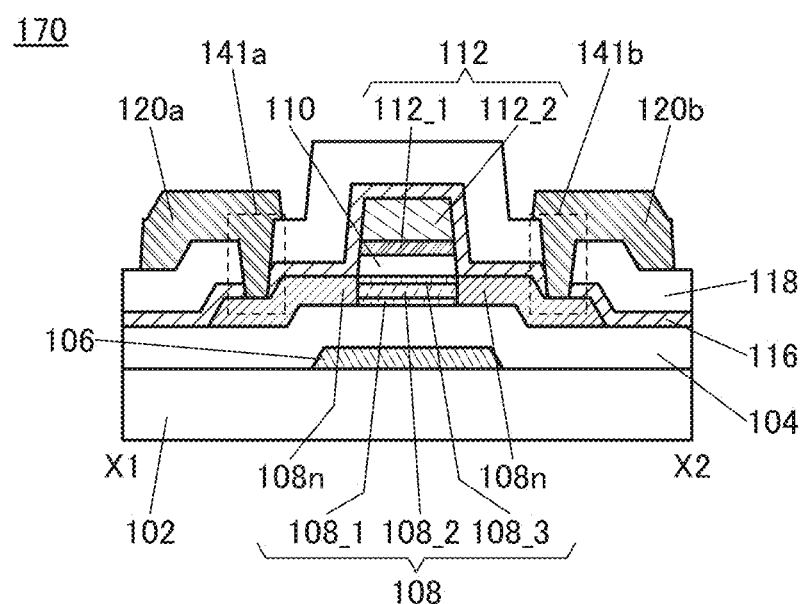
FIGS. 4A and 4B are cross-sectional views illustrating a semiconductor device.
Figure 4B:
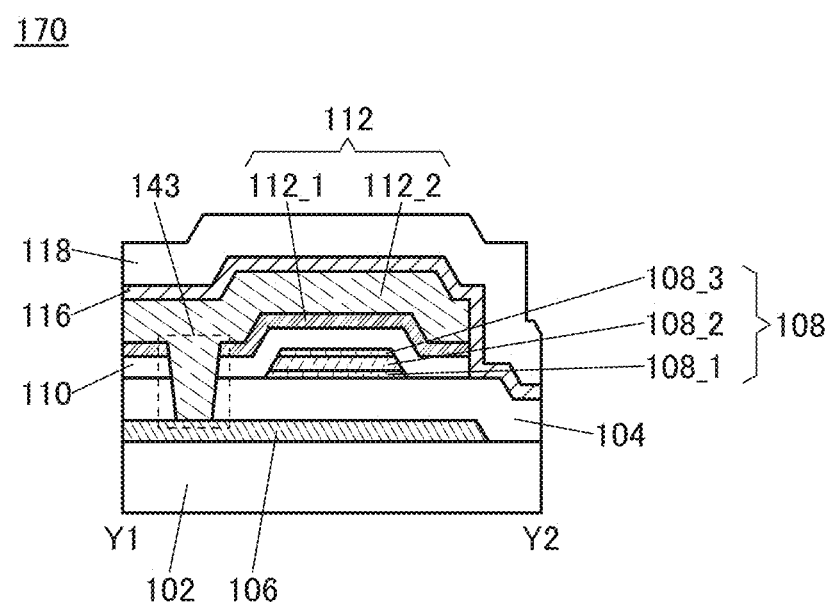

FIGS. 4A and 4B are cross-sectional views of a transistor 170. The top view of the transistor 170 is not illustrated because it is similar to that of the transistor 150 in FIG. 2A.

The transistor 170 illustrated in FIGS. 4A and 4B is different from the transistor 150 in the stacked-layer structure of the conductive film 112, the shape of the conductive film 112, and the shape of the insulating film 110.

The conductive film 112 in the transistor 170 includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc, or the like can be used, for example.

As illustrated in FIG. 4B, the conductive film 112_2 is connected to the conductive film 106 through the opening 143. By forming the opening 143 after a conductive film to be the conductive film 112_1 is formed, the shape illustrated in FIG. 4B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 170 have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

As compared with the transistor 170 in which the conductive film 112 and the insulating film 110 have a rectangular shape, the transistor 170 in which the conductive film 112 and the insulating film 110 have a tapered shape is favorable because of better coverage with the insulating film 116.

The other components of the transistor 170 are similar to those of the transistor 150 described above and have similar effects.

1-5. Structure Example 4 of Transistor

Next, modification examples of the transistors shown in FIGS. 1A to 1C to FIGS. 4A and 4B are described.

Although the transistors 100, 150, 160, and 170 in FIGS. 1A to 1C to FIGS. 4A and 4B each include the oxide semiconductor film 108 having a three-layer structure of the oxide semiconductor films 108_1 to 108_3, one embodiment of the present invention is not limited thereto. For example, the oxide semiconductor film 108 may have a two-layer structure of the oxide semiconductor films 108_2 and 108_3 as shown in FIGS. 5A and 5B to FIGS. 8A and 8B.

Figure 5A:
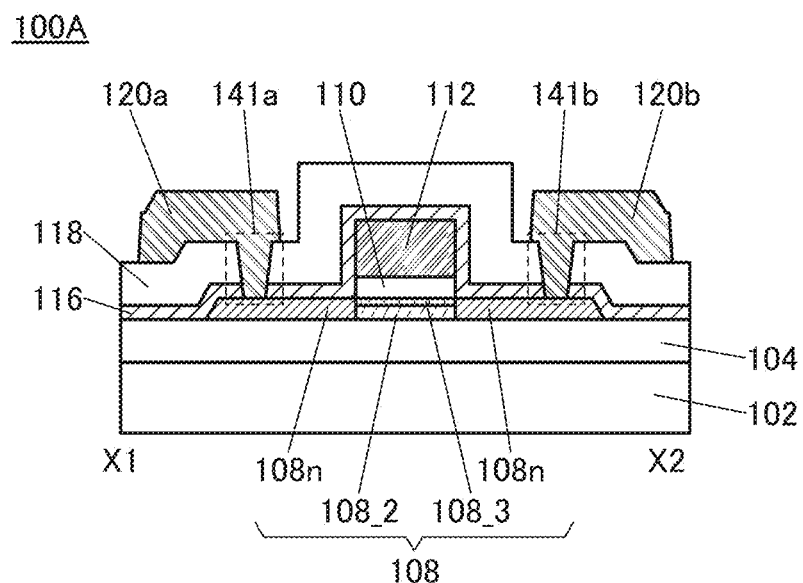
FIGS. 5A and 5B are cross-sectional views illustrating a semiconductor device.
Figure 5B:
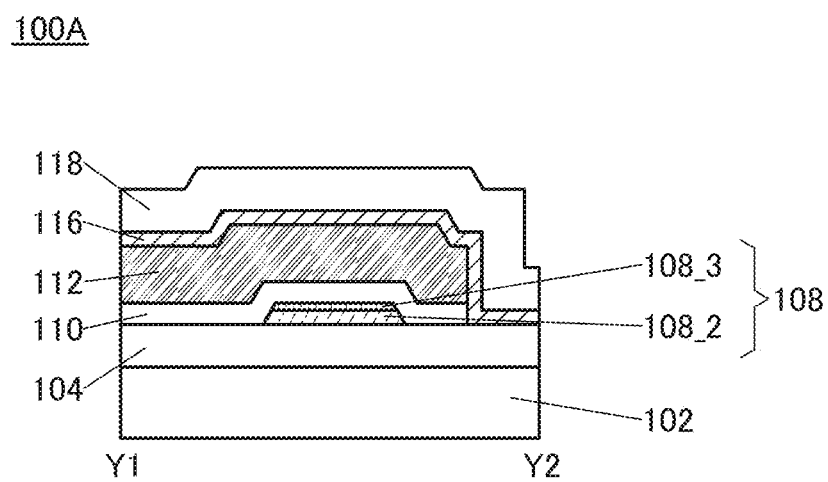

FIGS. 5A and 5B are cross-sectional views of a transistor 100A. FIG. 5A is a cross-sectional view in the channel length direction. FIG. 5B is a cross-sectional view in the channel width direction. Note that the transistor 100A has a structure similar to that of the transistor 100 except that the oxide semiconductor film 108 has a two-layer structure.

Figure 6A:
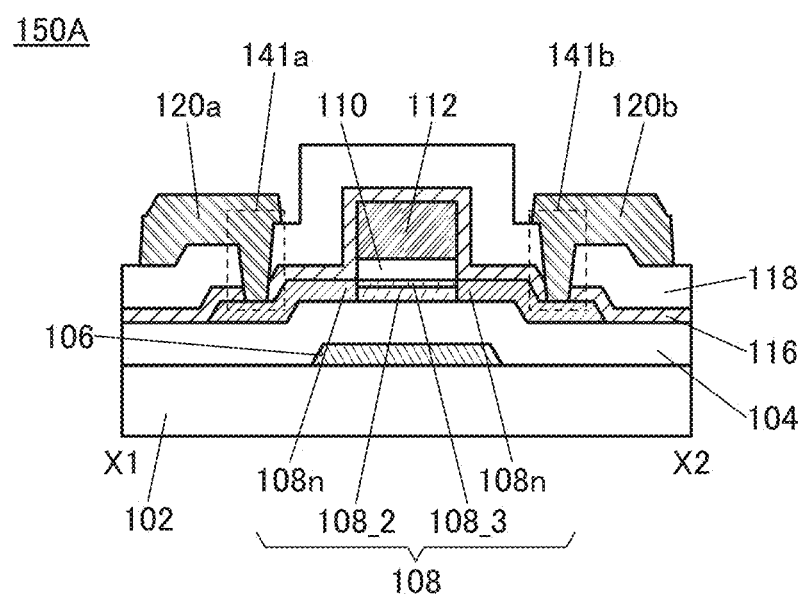
FIGS. 6A and 6B are cross-sectional views illustrating a semiconductor device.
Figure 6B:
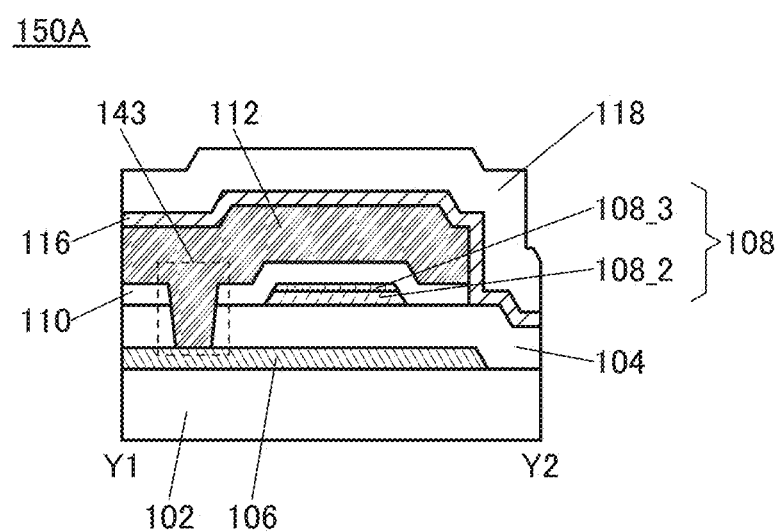

FIGS. 6A and 6B are cross-sectional views of a transistor 150A. FIG. 6A is a cross-sectional view in the channel length direction. FIG. 6B is a cross-sectional view in the channel width direction. Note that the transistor 150A has a structure similar to that of the transistor 150 except that the oxide semiconductor film 108 has a two-layer structure.

Figure 7A:
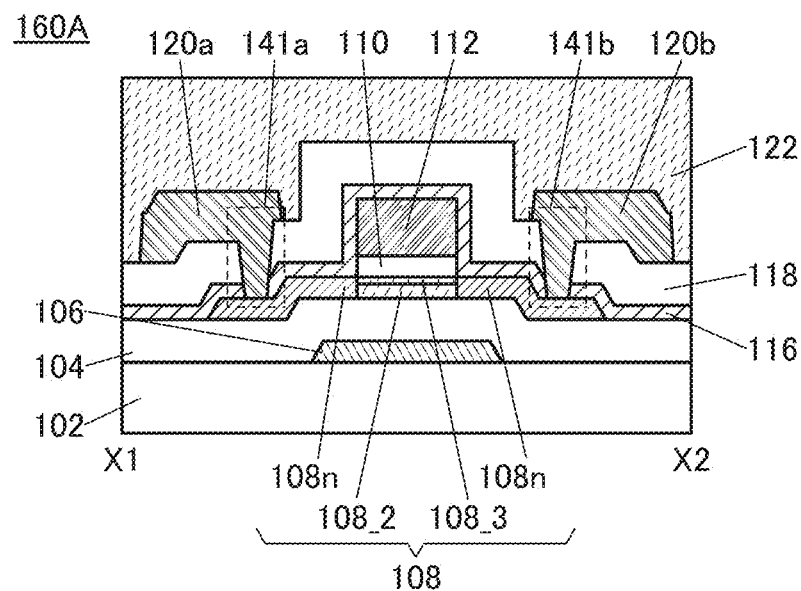
FIGS. 7A and 7B are cross-sectional views illustrating a semiconductor device.
Figure 7B:
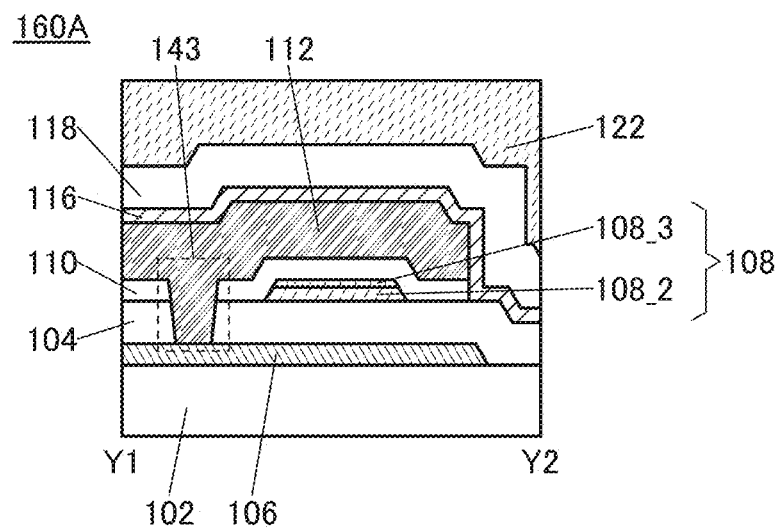

FIGS. 7A and 7B are cross-sectional views of a transistor 160A. FIG. 7A is a cross-sectional view in the channel length direction. FIG. 7B is a cross-sectional view in the channel width direction. Note that the transistor 160A has a structure similar to that of the transistor 160 except that the oxide semiconductor film 108 has a two-layer structure.

Figure 8A:
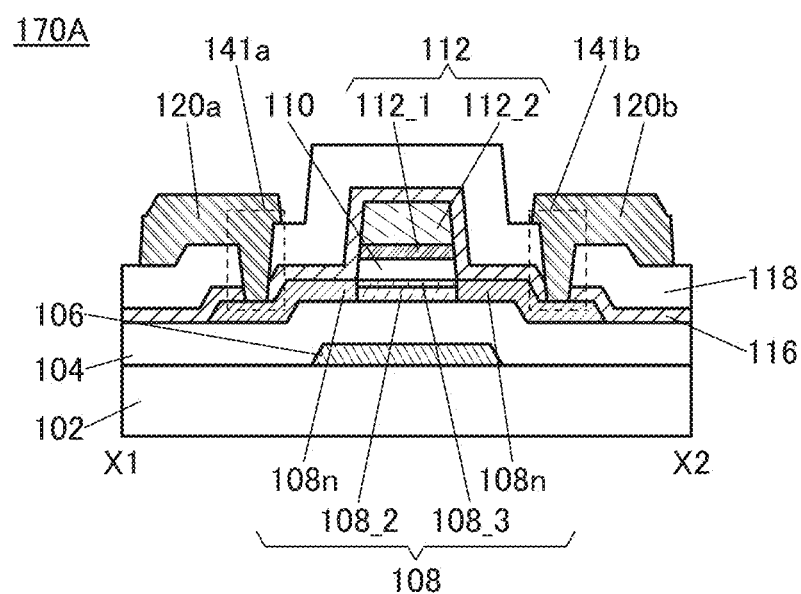
FIGS. 8A and 8B are cross-sectional views illustrating a semiconductor device.
Figure 8B:
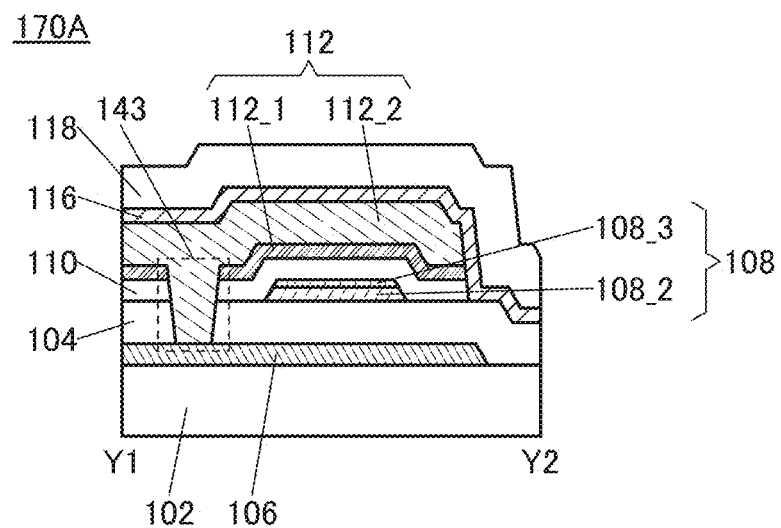

FIGS. 8A and 8B are cross-sectional views of a transistor 170A. FIG. 8A is a cross-sectional view in the channel length direction. FIG. 8B is a cross-sectional view in the channel width direction. Note that the transistor 170A has a structure similar to that of the transistor 170 except that the oxide semiconductor film 108 has a two-layer structure.

Even in the semiconductor device of one embodiment of the present invention that includes an oxide semiconductor film having a two-layer structure with different crystallinity as shown above, characteristics equivalent to those of the semiconductor devices shown in FIGS. 1A to 1C to FIGS. 4A and 4B can be obtained. In this way, the improvement of both field-effect mobility and reliability of a transistor can be achieved in the semiconductor device of one embodiment of the present invention.

1-6. Manufacturing Method of Semiconductor Device

Next, an example of a manufacturing method of the transistor 150 illustrated in FIGS. 2A to 2C is described with reference to FIGS. 9A to 9D to FIGS. 11A to 11C. Note that FIGS. 9A to 9D to FIGS. 11A to 11C are cross-sectional views in the channel length direction and the channel width direction illustrating the manufacturing method of the transistor 150.

First, the conductive film 106 is formed over the substrate 102. Then, the insulating film 104 is formed over the substrate 102 and the conductive film 106. A first oxide semiconductor film, a second oxide semiconductor film, and a third oxide semiconductor film are formed over the insulating film 104. Then, the first to third oxide semiconductor films are processed into an island shape to form oxide semiconductor films 108_1a, 108_2a, and 108_3a (see FIG. 9A).

The conductive film 106 can be formed using a material selected from the above-mentioned materials. In this embodiment, as the conductive film 106, a layered film of a 50-nm-thick tungsten film and a 400-nm-thick copper film is formed with a sputtering apparatus.

To process the conductive film to be the conductive film 106, a wet etching method and/or a dry etching method can be used. In this embodiment, in the processing of the conductive film into the conductive film 106, the copper film is etched by a wet etching method and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

The oxide semiconductor films 108_1*a*, 108_2*a*, and 108_3*a* are preferably formed successively in a vacuum using a sputtering apparatus. By successive formation of the oxide semiconductor films 108_1*a*, 108_2*a*, and 108_3*a* in a vacuum using a sputtering apparatus, impurities (such as hydrogen and water) that can be attached to their interfaces can be reduced.

The oxygen partial pressure of the oxide semiconductor film 108_2*a* is preferably lower than that of the oxide semiconductor film 108_1*a* and/or the oxide semiconductor film 108_3*a*.

When the oxide semiconductor films 108_1*a*, 108_2*a*, and 108_3*a* are formed, an inert gas (e.g., a helium gas, an argon gas, or a xenon gas) and the oxygen gas may be mixed. Note that the proportion of the oxygen gas in the whole deposition gas (hereinafter also referred to as oxygen flow rate ratio) in forming the oxide semiconductor film 108_1*a* is higher than or equal to 70% and lower than or equal to 100%, preferably higher than or equal to 80% and lower than or equal to 100%, further preferably higher than or equal to 90% and lower than or equal to 100%. The oxygen flow rate ratio in forming the oxide semiconductor film 108_2*a* is higher than 0% and lower than or equal to 20%, preferably higher than or equal to 5% and lower than or equal to 15%. The oxygen flow rate ratio in forming the oxide semiconductor film 108_3*a* is higher than or equal to 70% and lower than or equal to 100%, preferably higher than or equal to 80% and lower than or equal to 100%, further preferably higher than or equal to 90% and lower than or equal to 100%.

Note that the oxide semiconductor film 108_2*a* may be formed at a lower substrate temperature than the oxide semiconductor film 108_1*a* and/or the oxide semiconductor film 108_3*a*.

Specifically, the oxide semiconductor film 108_2*a* is formed at a substrate temperature higher than or equal to room temperature and lower than 150° C., preferably higher than or equal to room temperature and lower than or equal to 140° C. In addition, the oxide semiconductor film 108_1*a* and the oxide semiconductor film 108_3*a* are formed at a substrate temperature higher than or equal to room temperature and lower than or equal to 300° C., preferably higher than or equal to room temperature and lower than or equal to 200° C. Note that the substrate temperatures when the metal oxides 108_1*a*, 108_2*a*, and 108_3*a* are formed are preferably the same (e.g., higher than or equal to room temperature and lower than 150° C.) because the productivity is increased.

Under the above-described conditions, the oxide semiconductor film 108_2*a* can have a region with lower crystallinity than the metal oxides 108_1*a* and 108_3*a*.

The thickness of the oxide semiconductor film 108_1*a* is greater than or equal to 1 nm and less than 20 nm, preferably greater than or equal to 5 nm and less than or equal to 10 nm. The thickness of the oxide semiconductor film 108_2*a* is greater than or equal to 20 nm and less than or equal to 100 nm, preferably greater than or equal to 20 nm and less than or equal to 50 nm. The thickness of the oxide semiconductor film 108_3*a* is greater than or equal to 1 nm and less than 20 nm, preferably greater than or equal to 5 nm and less than or equal to 15 nm.

When the oxide semiconductor film 108 is formed while being heated, the crystallinity of the oxide semiconductor film 108 can be increased. However, in the case where a large-sized glass substrate (e.g., the 6th generation to the 10th generation) is used as the substrate 102 and the oxide semiconductor film 108 is formed at a substrate temperature higher than or equal to 200° C. and lower than or equal to 300° C., the substrate 102 might be changed in shape (distorted or warped). In the case where a large-sized glass substrate is used, the change in the shape of the glass substrate can be suppressed by forming the oxide semiconductor film 108 at a substrate temperature higher than or equal to 100° C. and lower than 200° C.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the oxide semiconductor film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

In this embodiment, the oxide semiconductor films 108_1*a*, 108_2*a*, and 108_3*a* are formed in the following conditions.

The oxide semiconductor film 108_1*a* is formed by a sputtering method using an In—Ga—Zn metal oxide target (In:Ga:Zn=4:2:4.1 in an atomic ratio). When the oxide semiconductor film 108_1*a* is formed, the substrate temperature is room temperature, and an oxygen gas at a flow rate of 200 sccm is used as a deposition gas (percentage of oxygen flow rate: 100%).

The oxide semiconductor film 108_2*a* is formed by a sputtering method using an In—Ga—Zn metal oxide target (In:Ga:Zn=4:2:4.1 in an atomic ratio). When the oxide semiconductor film 108_2*a* is formed, the substrate temperature is room temperature, and an oxygen gas at a flow rate of 20 sccm and an argon gas at a flow rate of 180 sccm is used as a deposition gas (percentage of oxygen flow rate: 10%).

The oxide semiconductor film 108_3*a* is formed by a sputtering method using an In—Ga—Zn metal oxide target (In:Ga:Zn=4:2:4.1 in an atomic ratio). When the oxide semiconductor film 108_3a is formed, the substrate temperature is room temperature, and an oxygen gas at a flow rate of 200 sccm is used as a deposition gas (percentage of oxygen flow rate: 100%).

A wet etching method and/or a dry etching method can be used for processing the first to third oxide semiconductor films into the oxide semiconductor films 108_1a to 108_3a, respectively.

The oxide semiconductor films 108_1a, 108_2a, and 108_3a are formed and then may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 9A:
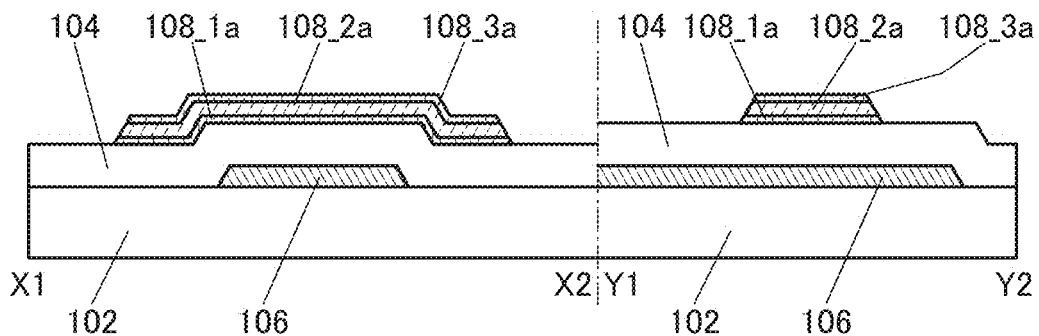
FIGS. 9A to 9D are cross-sectional views illustrating a method for manufacturing a semiconductor device.
Figure 9B:
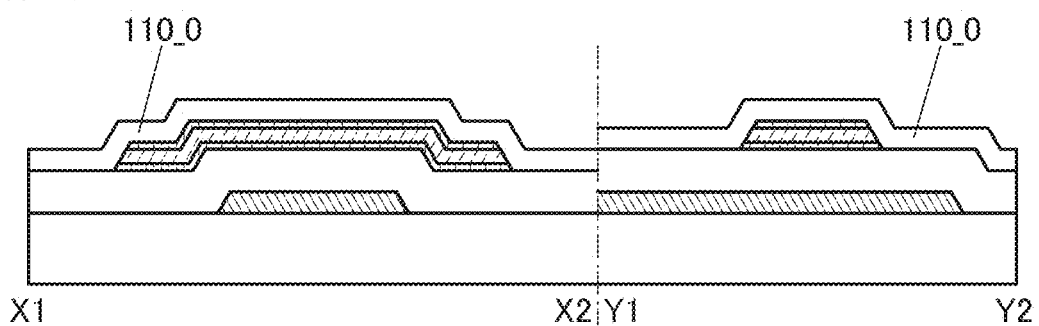

Next, an insulating film 110_0 is formed over the insulating film 104 and the oxide semiconductor film 108 (see FIG. 9B).

As the insulating film 110_0, a silicon oxide film or a silicon oxynitride film can be formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulating film 110_0 with a PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa, or lower than or equal to 50 Pa.

As the insulating film 110_0, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulating film 110_0 having high coverage can be formed.

In this embodiment, as the insulating film 110_0, a 100-nm-thick silicon oxynitride film is formed with a PECVD apparatus.

Figure 9C:
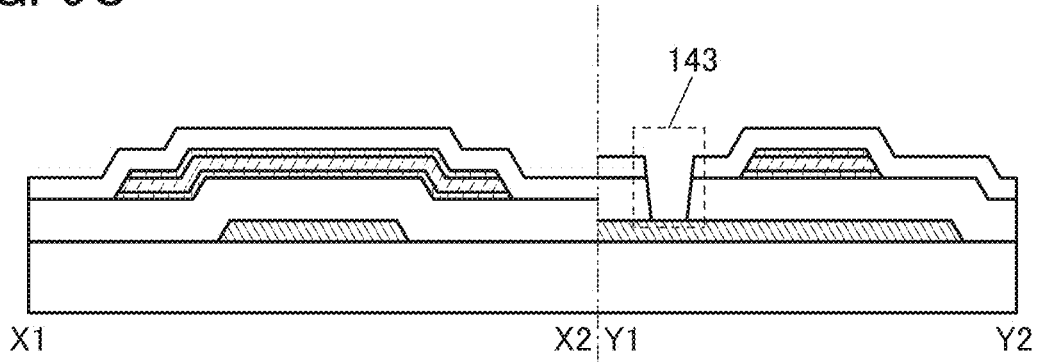

Subsequently, a mask is formed by lithography in a desired position over the insulating film 110_0, and then, the insulating film 110_0 and the insulating film 104 are partly etched, so that the opening 143 reaching the conductive film 106 is formed (see FIG. 9C).

To form the opening 143, a wet etching method and/or a dry etching method can be used. In this embodiment, the opening 143 is formed by a dry etching method.

Next, a conductive film 112_0 is formed over the conductive film 106 and the insulating film 110_0 so as to cover the opening 143. In the case where a metal oxide film is used as the conductive film 112_0, for example, oxygen might be added to the insulating film 110_0 during the formation of the conductive film 112_0 (see FIG. 9D).

Figure 9D:
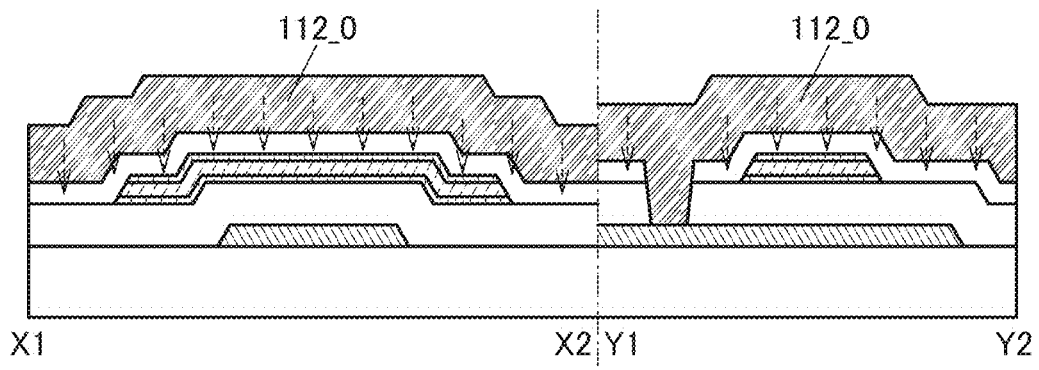

In FIG. 9D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 1120, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and other methods such as an ALD method may be used.

In this embodiment, a 100-nm-thick IGZO film containing an In—Ga—Zn oxide (In:Ga:Zn=4:2:4.1 [atomic ratio]) is formed as the conductive film 112_0 by a sputtering method. Note that oxygen addition treatment may be performed on the insulating film 110_0 before or after the formation of the conductive film 112_0. The oxygen addition treatment can be performed in a manner similar to that of the oxygen addition that can be performed after the formation of the insulating film 104.

Figure 10A:
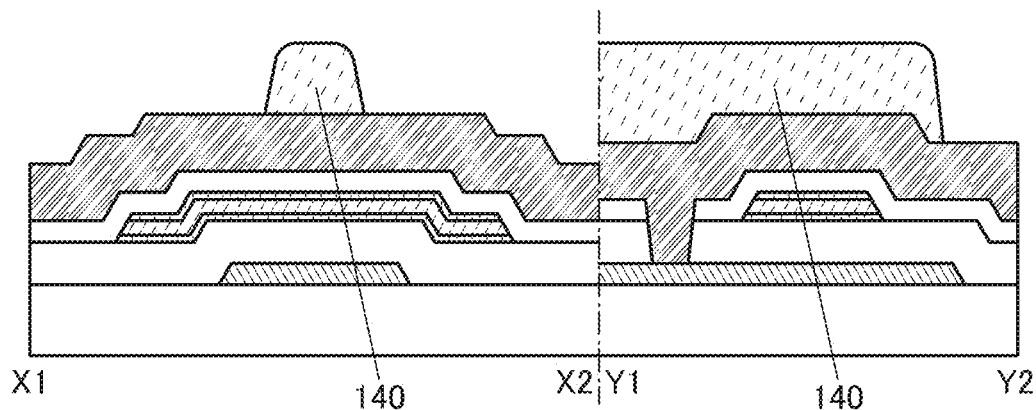
FIGS. 10A to 10C are cross-sectional views illustrating a method for manufacturing a semiconductor device.

Subsequently, a mask 140 is formed by a lithography process in a desired position over the conductive film 112_0 (see FIG. 10A).

Figure 10B:
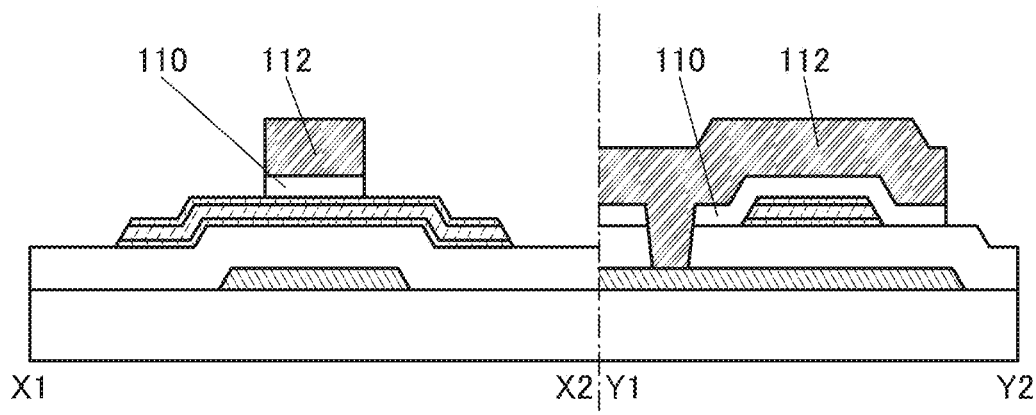

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 10B).

In this embodiment, the conductive film 112_0 and the insulating film 110_0 are processed by a dry etching method.

In the processing into the conductive film 112 and the insulating film 110, the thickness of the oxide semiconductor film 108 in a region not overlapping with the conductive film 112 is decreased in some cases. In other cases, in the processing into the conductive film 112 and the insulating film 110, the thickness of the insulating film 104 in a region not overlapping with the oxide semiconductor film 108 is decreased. In the processing of the conductive film 112_0 and the insulating film 110_0, an etchant or an etching gas (e.g., chlorine) might be added to the oxide semiconductor film 108 or the constituent element of the conductive film 112_0 or the insulating film 110_0 might be added to the oxide semiconductor film 108.

Figure 10C:
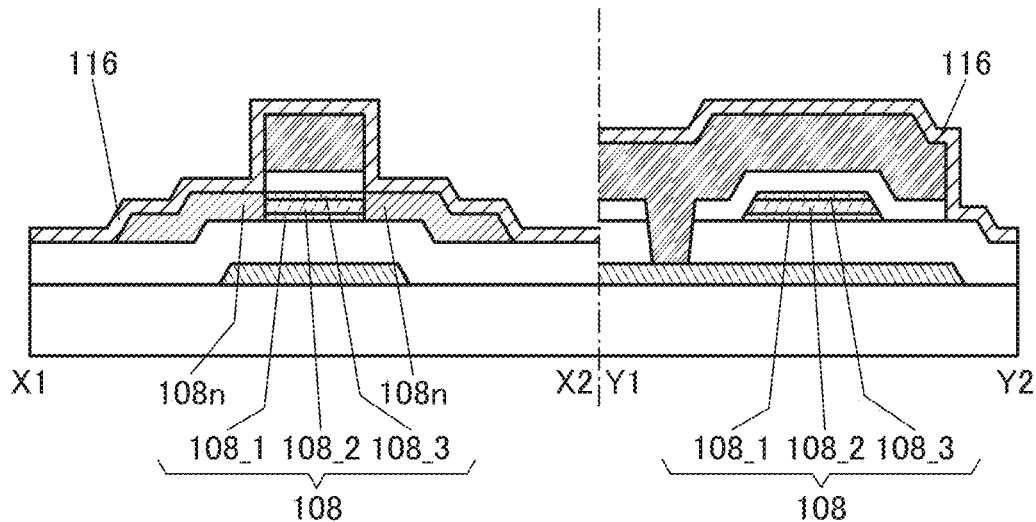

Next, the insulating film 116 is formed over the insulating film 104, the oxide semiconductor film 108, and the conductive film 112, whereby part of the oxide semiconductor film 108, which is in contact with the insulating film 116 becomes the region 108n. Furthermore, the oxide semiconductor film 108 overlapping with the conductive film 112 includes oxide semiconductor films 108_1, 108_2, and 108_3 (see FIG. 10C).

The insulating film 116 can be formed using a material selected from the above-mentioned materials. In this embodiment, as the insulating film 116, a 100-nm-thick silicon nitride oxide film is formed with a PECVD apparatus. In the formation of the silicon nitride oxide film, plasma treatment and deposition treatment are performed at 220° C. The plasma treatment is performed before deposition under the following conditions: an argon gas at a flow rate of 100 sccm and a nitrogen gas at a flow rate of 1000 sccm are introduced into a chamber, the pressure in the chamber is set to 40 Pa, and power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and power of 1000 W is supplied to the RF power source (27.12 MHz).

When the insulating film 116 includes a silicon nitride oxide film, nitrogen or hydrogen in the silicon nitride oxide film can be supplied to the region 108n in contact with the insulating film 116. Moreover, when the temperature in forming the insulating film 116 is the above-mentioned temperature, release of excess oxygen contained in the insulating film 110 to the outside can be suppressed.

Figure 11A:
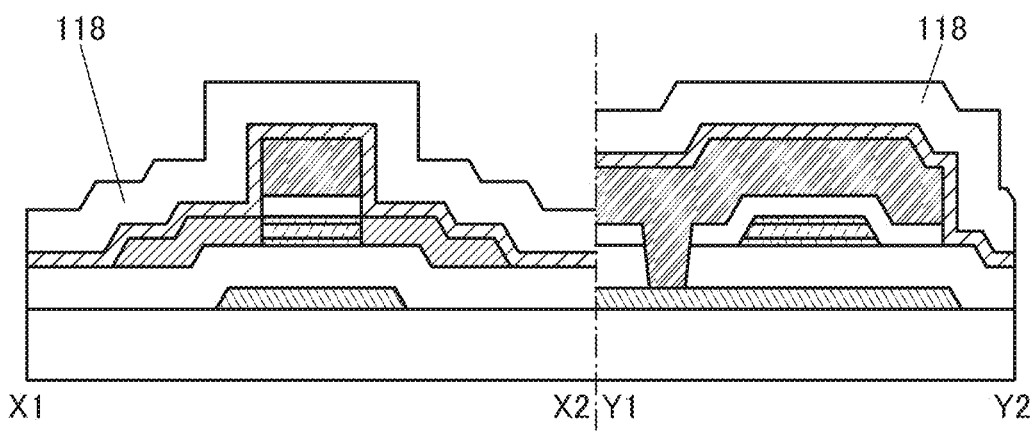
FIGS. 11A to 11C are cross-sectional views illustrating a method for manufacturing a semiconductor device.
Figure 11B:
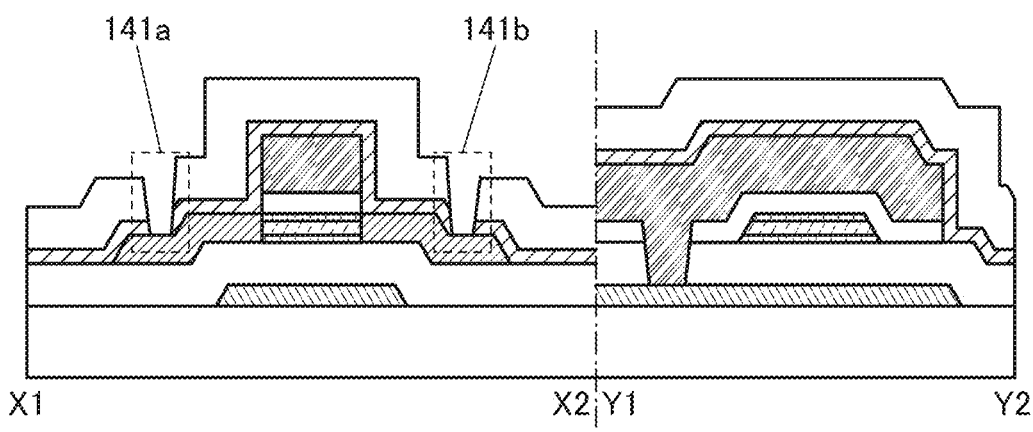

Next, the insulating film 118 is formed over the insulating film 116 (see FIG. 11A).

The insulating film 118 can be formed using a material selected from the above-mentioned materials. In this embodiment, as the insulating film 118, a 300-nm-thick silicon oxynitride film is formed with a PECVD apparatus.

Then, a mask is formed over desired positions of the insulating film 118 by lithography, and the insulating film 118 and the insulating film 116 are partly etched. Thus, the openings 141a and 141b reaching the region 108n are formed (see FIG. 11B).

To etch the insulating films 118 and 116, a wet etching method and/or a dry etching method can be used. In this embodiment, the insulating films 118 and 116 are processed by a dry etching method.

Figure 11C:
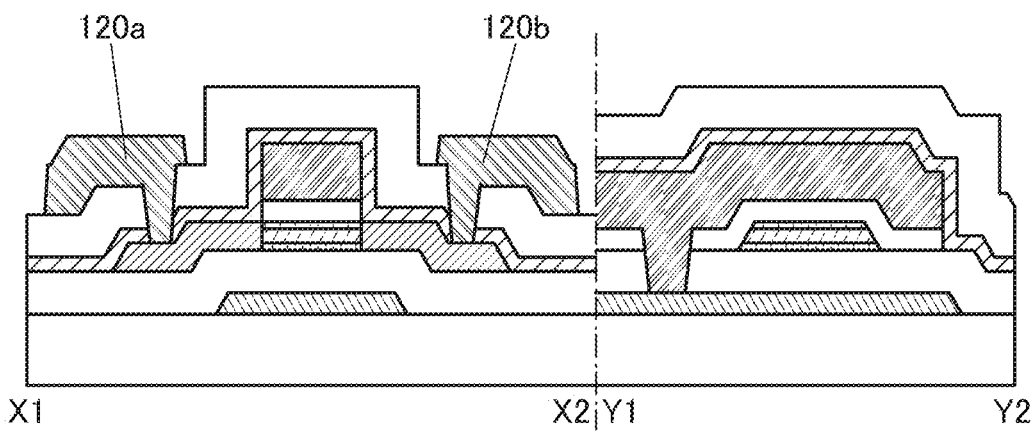

Next, a conductive film is formed over the region 108n and the insulating film 118 to cover the openings 141a and 141b, and processed into desired shapes, so that the conductive films 120a and 120b are formed (see FIG. 11C).

The conductive films 120a and 120b can be formed using a material selected from the above-mentioned materials. In this embodiment, as the conductive films 120a and 120b, a layered film including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method and then the tungsten film is etched by a dry etching method.

Through the above process, the transistor 150 in FIGS. 2A to 2C can be fabricated.

Note that the films included in the transistor 150 (the insulating film, the metal oxide film, the oxide semiconductor film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although the sputtering method and a plasma-enhanced chemical vapor deposition (PECVD) method are typical examples of the film formation method, a thermal CVD method may be used. As an example of a thermal CVD method, a metal organic chemical vapor deposition (MOCVD) method can be given.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, a thermal CVD method has an advantage that no defect due to plasma damage is caused.

The films such as the conductive films, the insulating films, the oxide semiconductor films, and the metal oxide films that are described above can be formed by a thermal CVD method such as an MOCVD method. For example, in the case where an In—Ga—Zn—O film is formed, trimethylindium (In($CH_3$)$_3$), trimethylgallium (Ga($CH_3$)$_3$), and dimethylzinc (Zn($CH_3$)$_2$) are used. Without limitation to the above combination, triethylgallium (Ga($C_2H_5$)$_3$) can be used instead of trimethylgallium and diethylzinc (Zn($C_2H_5$)$_2$) can be used instead of dimethylzinc.

In the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide or hafnium amide such as tetrakis(dimethylamide)hafnium (TDMAH, Hf[N($CH_3$)$_2$]$_4$) or tetrakis(ethylmethylamide) hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

In the case where an oxide semiconductor film such as an In—Ga—Zn—O film is formed with a deposition apparatus employing an ALD method, an $In(CH_3)_3$ gas and an $O_3$ gas) are used to form an In—O layer, a $Ga(CH_3)_3$ gas and an $O_3$ gas) are used to form a Ga—O layer, and then, a $Zn(CH_3)_2$ gas and an $O_3$ gas) are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas), it is preferable to use an $O_3$ gas), which does not contain H.

One embodiment of the present invention is not limited to the example described in this embodiment, in which the transistor includes an oxide semiconductor film. In one embodiment of the present invention, the transistor does not necessarily include an oxide semiconductor film. For example, a channel region, the vicinity of the channel region, a source region, or a drain region of the transistor may be formed using a material containing silicon (Si), germanium (Ge), silicon germanium (SiGe), gallium arsenide (GaAs), or the like.

At least part of this embodiment can be implemented in combination with any of the other embodiments and the other examples described in this specification as appropriate.

Embodiment 2

In this embodiment, an oxide semiconductor film of one embodiment of the present invention will be described with reference to FIGS. 13A and 13B to FIGS. 32A to 32C.

An oxide semiconductor film of one embodiment of the present invention preferably contains at least indium and zinc. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor film contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M in some cases.

2-1. Schematic View of Top Surface and Cross Section of Oxide Semiconductor Film FIGS. 13A and 13B, FIGS. 14A and 14B, FIGS. 15A and 15B, and FIGS. 16A and 16B are schematic views of oxide semiconductor films of embodiments of the present invention. Note that FIG. 13A, FIG. 14A, FIG. 15A, and FIG. 16A are schematic views of top surfaces of the oxide semiconductor films (a-b plane direction) and FIG. 13B, FIG. 14B, FIG. 15B, and FIG. 16B are schematic views of cross sections of oxide semiconductor films (c-axis direction) each formed over a substrate (Sub.).

Figure 13A:
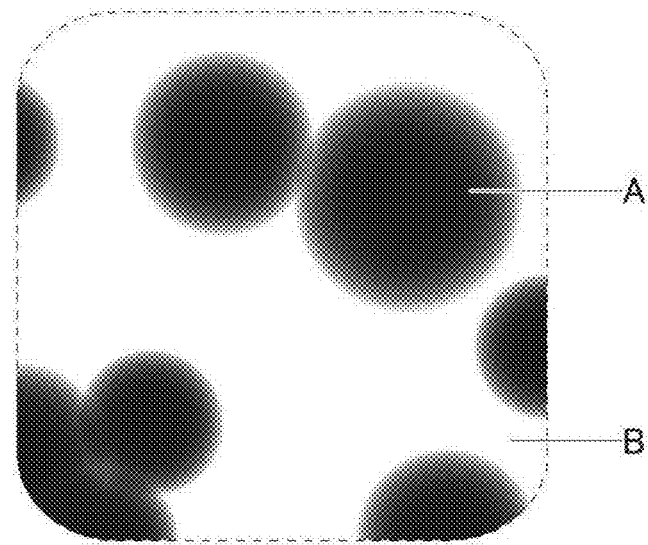
FIGS. 13A and 13B are schematic views illustrating a top structure and a cross-sectional structure of an oxide semiconductor film.
Figure 13B:
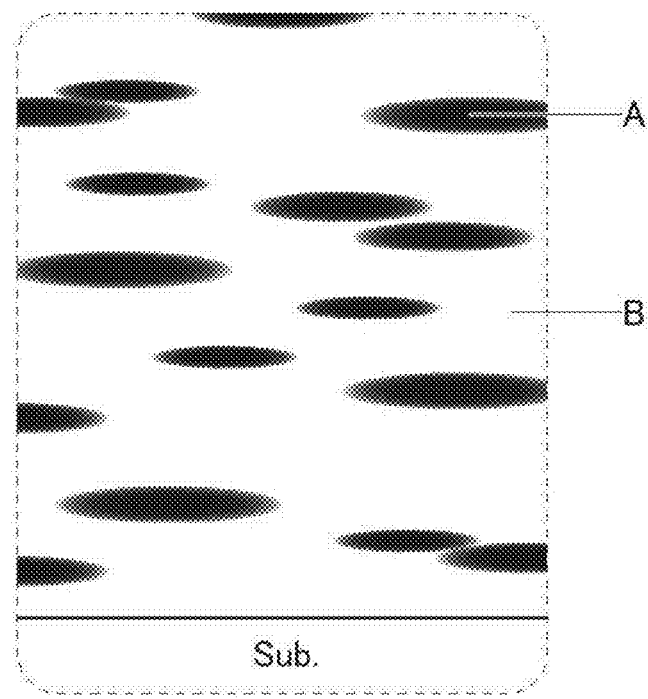

First, description is made with reference to FIGS. 13A and 13B.

As shown in FIGS. 13A and 13B, an oxide semiconductor film of one embodiment of the present invention includes Region A and Region B. That is, an oxide semiconductor film of one embodiment of the present invention is a composite oxide semiconductor in which Region A and Region B are mixed. Note that Region A is represented by $In_xZn_yO_z$ (x, y, and z each represent a given number) and Region B is represented by $In_aM_bZn_cO_d$ (M represents Al, Ga, Y, or Sn and a, b, c, and d each represent a given number). Note that Region A may contain M.

Note that the In concentration in Region A is higher than that in Region B. In other words, Region A is In-rich and Region B is In-poor. For example, it is preferable that the In concentration in Region A be greater than or equal to 1.1 times, further preferably greater than or equal to two times and less than or equal to 10 times the In concentration in Region B.

As shown in FIG. 13A, Region A is basically formed to have an almost circular shape in the a-b plane direction. As shown in FIG. 13B, Region A is basically formed to have an almost elliptical shape in the c-axis direction. In other words, Region A has an island-like shape and is surrounded by Region B. As shown in FIGS. 13A and 13B, Regions A are unevenly distributed in Region B. For this reason, two or more Regions A might be connected to be shaped like connected circles or connected ellipses. Note that the switching characteristics of the transistor are degraded (for example, the off-state current of the transistor is increased) when all of Regions A are connected in the c-axis direction; thus, Regions A are preferably scattered as shown in FIGS. 13A and 13B.

Figure 14A:
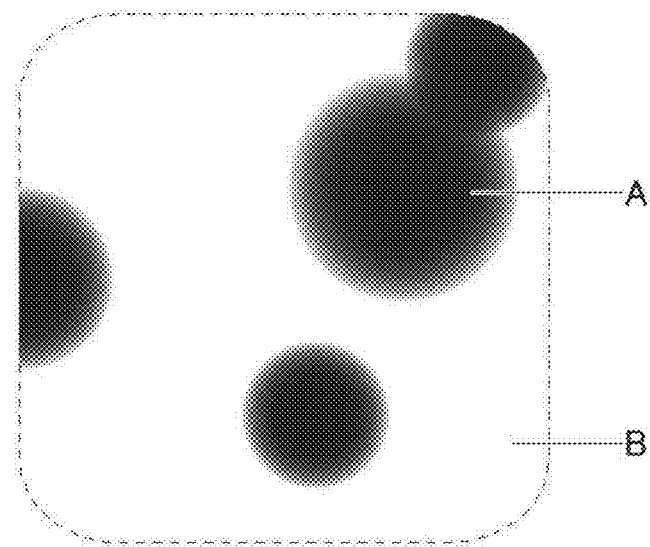
FIGS. 14A and 14B are schematic views illustrating a top structure and a cross-sectional structure of an oxide semiconductor film.
Figure 14B:
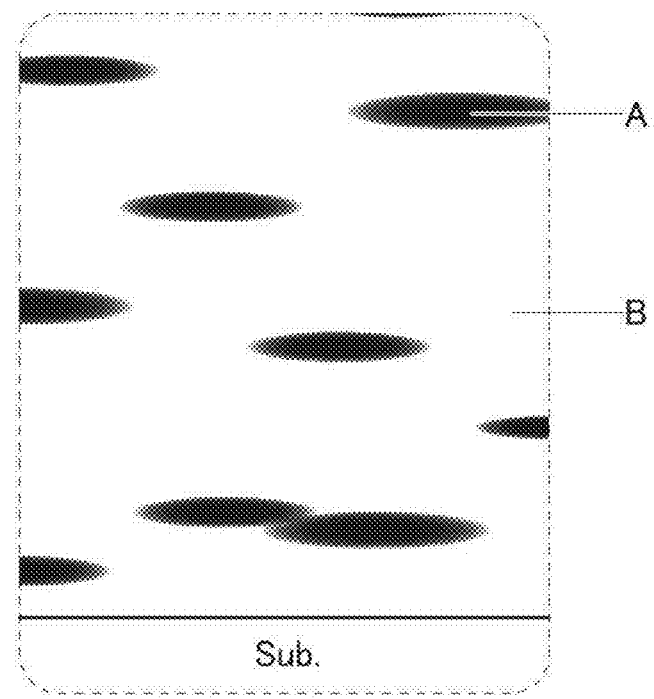
Figure 15A:
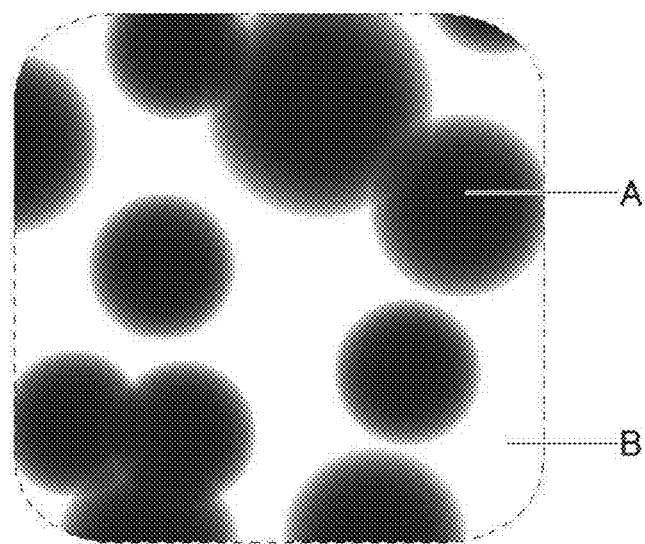
FIGS. 15A and 15B are schematic views illustrating a top structure and a cross-sectional structure of an oxide semiconductor film.
Figure 15B:
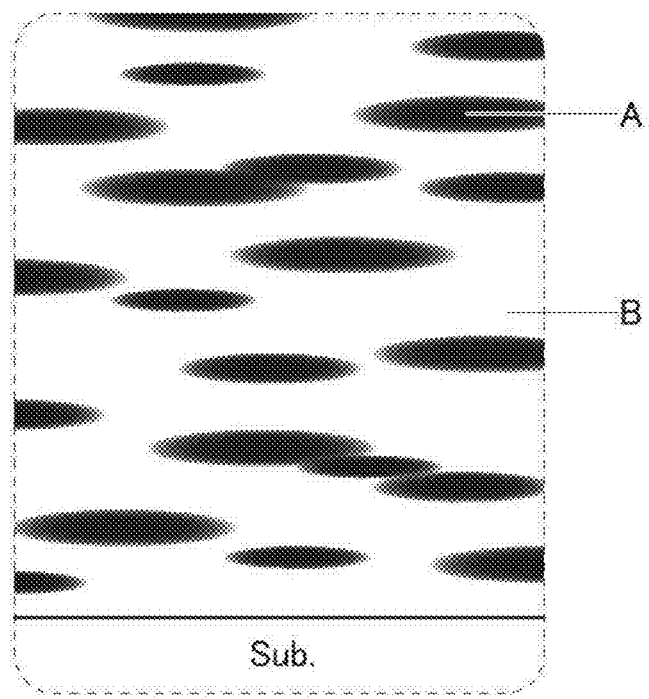

Note that the proportion of scattered Regions A can be adjusted by changing, for example, the formation conditions or composition of the composite oxide semiconductor. For example, it is possible to form a composite oxide semiconductor in which the proportion of Regions A is low as shown in FIGS. 14A and 14B or a composite oxide semiconductor in which the proportion of Regions A is high as shown in FIGS. 15A and 15B. In a composite oxide semiconductor, the proportion of Regions A is not always lower than that of Region B. In a composite oxide semiconductor with an extremely high proportion of Regions A, depending on the observation range, Region B is sometimes formed in Region A.

Figure 16A:
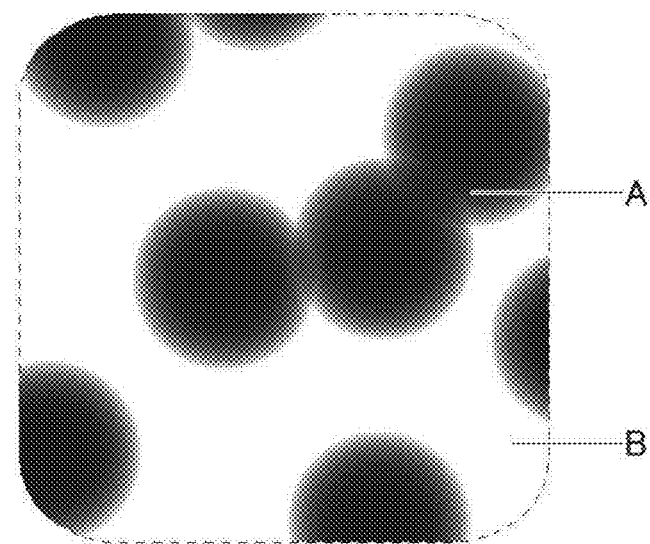
FIGS. 16A and 16B are schematic views illustrating a top structure and a cross-sectional structure of an oxide semiconductor film.
Figure 16B:
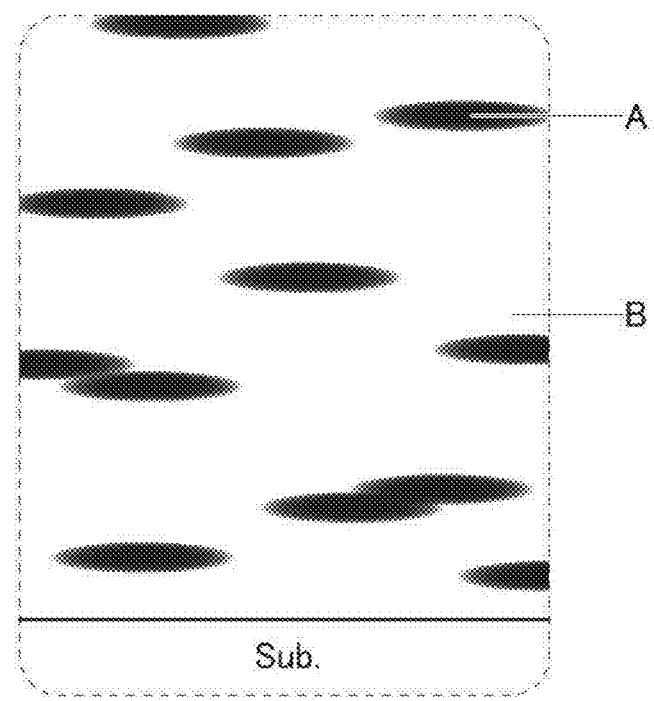

The size of the island-like shape of Region A can be adjusted by changing, for example, the formation conditions or composition of the composite oxide semiconductor. Although the island-like regions have various sizes in the schematic views in FIGS. 13A and 13B, FIGS. 14A and 14B, and FIGS. 15A and 15B, Regions A with substantially the same size are scattered as shown in FIGS. 16A and 16B in some cases.

As shown in FIGS. 13A and 13B, the boundary between Region A and Region B is not clear or cannot be observed in some cases. The thickness of each of Region A and Region B can be examined with an EDX mapping image of a cross-sectional photograph. Note that Region A is sometimes observed as having a size of greater than or equal to 0.1 nm and less than or equal to 5 nm or greater than or equal to 0.3 nm and less than or equal to 3 nm in an EDX mapping image of a cross-sectional photograph.

Since Region A is In-rich, it has a function of increasing carrier mobility. Thus, a transistor that uses an oxide semiconductor film including Region A can have increased on-state current and increased field-effect mobility. In contrast, since Region B is In-poor, it has a function of reducing carrier mobility. Thus, a transistor that uses an oxide semiconductor film including Region B can have reduced off-state current. In other words, Region A contributes to the on-state current and field-effect mobility of a transistor and Region B contributes to the switching characteristics of the transistor.

As described above, an oxide semiconductor film of one embodiment of the present invention is a composite oxide semiconductor in which Region A and Region B are mixed and have different functions that are complementary. For example, when an oxide semiconductor film of one embodiment of the present invention is an In—Ga—Zn oxide (hereinafter referred to as IGZO), in which Ga is used as the element M, the oxide semiconductor film can be called complementary IGZO (abbreviation: C/IGZO).

In contrast, when Region A and Region B are stacked in a layered manner, for example, interaction does not take place or is unlikely to take place between Region A and Region B, so that the function of Region A and that of Region B are independently performed in some cases. In that case, even when the field-effect mobility is increased owing to Regions A, the off-state current of the transistor might be increased. Therefore, in the case where an oxide semiconductor film of one embodiment of the present invention is the above-described composite oxide semiconductor or C/IGZO, a function of achieving high field-effect mobility and a function of achieving excellent switching characteristics can be obtained at the same time. This is an advantageous effect obtained by using the oxide semiconductor film of one embodiment of the present invention.

FIGS. 13A and 13B illustrate an example in which the oxide semiconductor film is formed over the substrate; however, one embodiment of the present invention is not limited to this example and an insulating film such as a base film or an interlayer film or another semiconductor film such as an oxide semiconductor film may be formed between the substrate and the oxide semiconductor film.

2-2. Atomic Ratio of Oxide Semiconductor Film

Next, the atomic ratio of an oxide semiconductor film of one embodiment of the present invention is described with reference to FIG. 17.

Figure 17:
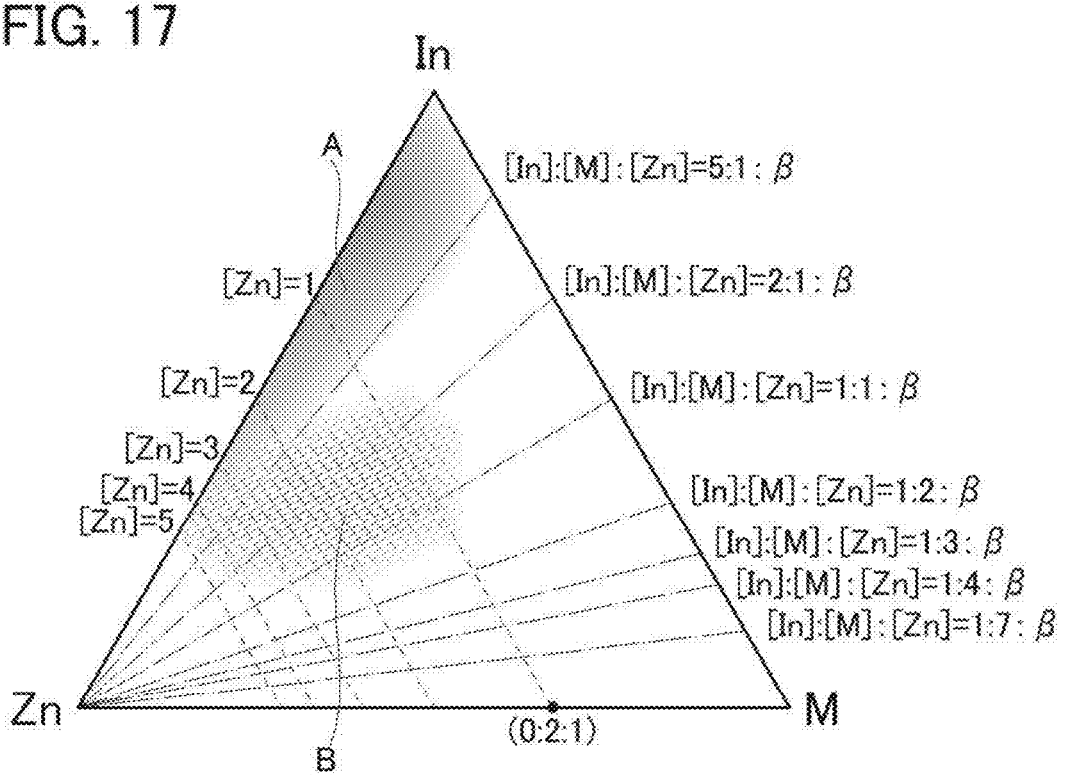
FIG. 17 illustrates an atomic ratio of an oxide semiconductor film.

The phase diagram in FIG. 17 can be used to show the atomic ratio of an element X to an element Y to an element Z in a substance. The atomic ratio of the element X to the element Y to the element Z is denoted by x:y:z. This atomic ratio can be shown as coordinates (x:y:z) in FIG. 17. Note that the proportion of oxygen atoms is not shown in FIG. 17.

In FIG. 17, broken lines indicate a line where the atomic ratio [In]:[M]:[Zn] is $(1+\alpha):(1-\alpha):1$, where $-1 \le \alpha \le 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+a):(1-\alpha):4$, and a line where the atomic ratio [In]:[M]:[Zn] is $(1+a):(1-\alpha):5$.

Dashed-dotted lines indicate a line where the atomic ratio [In]:[M]:[Zn] is $1:1:\beta$, where $\beta \ge 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, a line where the atomic ratio [In]:[M]:[Zn] is $5:1:\beta$, and a line where the atomic ratio [In]:[M]:[Zn] is $1:7:\beta$.

The oxide semiconductor film shown in FIG. 17 with an atomic ratio of [In]:[M]:[Zn]=0:2:1 or an atomic ratio that is in the neighborhood thereof tends to have a spinel crystal structure.

Region A in FIG. 17 is an example of a preferable range of the atomic ratio of In to M to Zn in a region with a high proportion of In (a region where [In]:[M]:[Zn]=x:y:z ($x>0$, $y \ge 0$, $z \ge 0$)). Note that Region A includes a line where the atomic ratio [In]:[M]:[Zn] is $(1+\gamma):0:(1-\gamma)$ ($-1 \le \gamma \le 1$).

Region B in FIG. 17 is an example of a preferable range of the atomic ratio of In to M to Zn in a region that contains a lower proportion of In than Region A (a region where [In]: [M]: [Zn]=m:n:l ($m>0$, $n \ge 0$, $l \ge 0$)). Note that Region B includes an atomic ratio of [In]:[M]:[Zn]=4:2:3 to 4.1 and the neighborhood thereof. The neighborhood includes an atomic ratio of [In]:[M]:[Zn]=5:3:4. Note that Region B includes an atomic ratio of [In]:[M]:[Zn]=5:1:6 and the neighborhood thereof. An oxide semiconductor film with an atomic ratio represented by Region B is an oxide semiconductor film that has high crystallinity.

In the case where the oxide semiconductor film is formed with a sputtering apparatus, a film having an atomic ratio different from the atomic ratio of the target is formed in some cases. Specifically, depending on the substrate temperature during deposition, the atomic proportion of [Zn] in a deposited film is lower than that of [Zn] in the target in some cases.

2-3. Sputtering Apparatus

Here, an example of the sputtering apparatus is described with reference to FIGS. 18A and 18B.

Figure 18A:
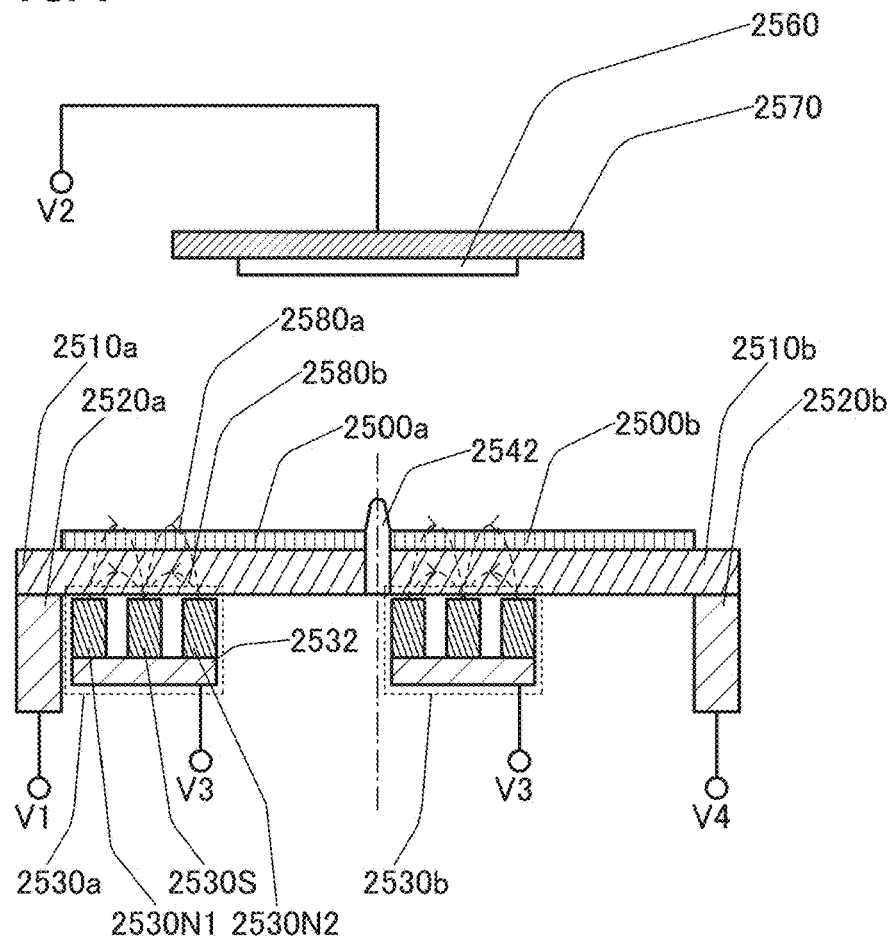
FIGS. 18A and 18B illustrate a sputtering apparatus.

FIG. 18A is a cross-sectional view of a deposition chamber 2501 of the sputtering apparatus. FIG. 18B is a plan view of a magnet unit 2530a and a magnet unit 2530b of the sputtering apparatus.

The deposition chamber 2501 illustrated in FIG. 18A includes a target holder 2520a, a target holder 2520b, a backing plate 2510a, a backing plate 2510b, a target 2500a, a target 2500b, a member 2542, and a substrate holder 2570. Note that the target 2500a is placed over the backing plate 2510a. The backing plate 2510a is placed over the target holder 2520a. The magnet unit 2530a is placed under the target 2500a with the backing plate 2510a therebetween. The target 2500b is placed over the backing plate 2510b. The backing plate 2510b is placed over the target holder 2520b. The magnet unit 2530b is placed under the target 2500b with the backing plate 2510b therebetween.

Figure 18B:
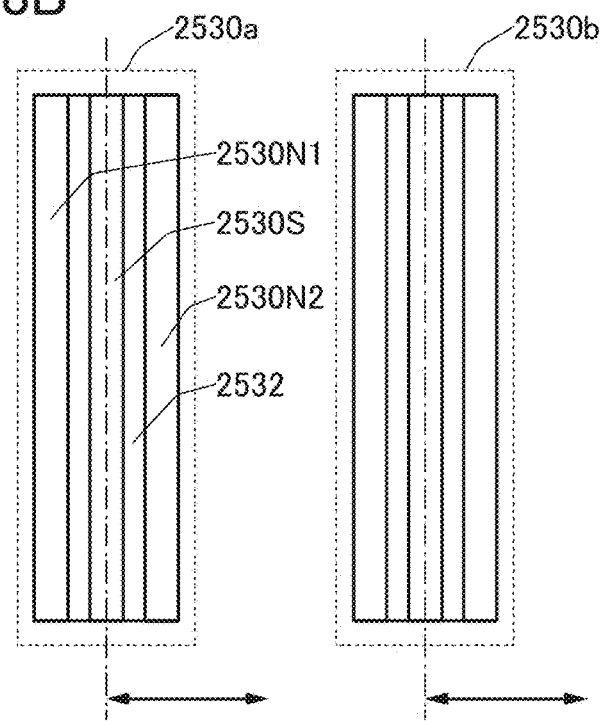

As illustrated in FIGS. 18A and 18B, the magnet unit 2530a includes a magnet 2530N1, a magnet 2530N2, a magnet 2530S, and a magnet holder 2532. The magnet 2530N1, the magnet 2530N2, and the magnet 2530S are placed over the magnet holder 2532 in the magnet unit 2530a. The magnet 2530N1, the magnet 2530N2, and the magnet 2530S are spaced. Note that the magnet unit 2530b has a structure similar to that of the magnet unit 2530a.

When the substrate 2560 is transferred into the deposition chamber 2501, the substrate 2560 is placed in contact with the substrate holder 2570.

The target 2500a, the backing plate 2510a, and the target holder 2520a are separated from the target 2500b, the backing plate 2510b, and the target holder 2520b by the member 2542. Note that the member 2542 is preferably an insulator. The member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2500a with the backing plate 2510a positioned therebetween. The target holder 2520b and the backing plate 2510b are fixed to each other with a screw (e.g., a bolt) and have the same potential. The target holder 2520b has a function of supporting the target 2500b with the backing plate 2510b positioned therebetween.

The backing plate 2510a has a function of fixing the target 2500a. The backing plate 2510b has a function of fixing the target 2500b.

Magnetic lines of force 2580a and 2580b formed by the magnet unit 2530a are illustrated in FIG. 18A.

As illustrated in FIG. 18B, the magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown by an arrow in FIG. 18B. For example, the magnet unit 2530a may be oscillated with a beat of greater than or equal to 0.1 Hz and less than or equal to 1 kHz.

The magnetic field over the target 2500a changes in accordance with oscillation of the magnet unit 2530a. The region with an intense magnetic field is a high-density plasma region; thus, sputtering of the target 2500a easily occurs in the vicinity of the region. The same applies to the magnet unit 2530b.

Here, the case where the target 2500a and the target 2500b are each an In—Ga—Zn oxide target is considered. For example, the target 2500a and the target 2500b each have an atomic ratio of In:Ga:Zn=4:2:4.1. In the case of using a sputtering apparatus provided with the above targets, the deposition model of an oxide semiconductor film of one embodiment of the present invention can be presumed in the following manner.

Note that the gases introduced into the sputtering apparatus are an argon gas and an oxygen gas. Furthermore, a potential applied to a terminal V1 connected to the target holder 2520a is lower than a potential applied to a terminal V2 connected to the substrate holder 2570. A potential applied to a terminal V4 connected to the target holder 2520b is lower than the potential applied to the terminal V2 connected to the substrate holder 2570. The potential applied to the terminal V2 connected to the substrate holder 2570 is a ground potential. A potential applied to a terminal V3 connected to the magnet holder 2532 is a ground potential.

Note that the potentials applied to the terminals V1, V2, V3, and V4 are not limited to the above-described potentials. Not all the target holder 2520, the substrate holder 2570, and the magnet holder 2532 are necessarily supplied with potentials. For example, the substrate holder 2570 may be electrically floating. Note that it is assumed that a power source capable of controlling a potential applied to the terminal V1 is electrically connected to the terminal V1. As the power source, a DC power source, an AC power source, or an RF power source may be used.

First, in the deposition chamber 2501, an argon gas or an oxygen gas is ionized to be separated into cations and electrons, and plasma is created. Then, the cations in the plasma are accelerated toward the targets 2500a and 2500b by the potential V1 applied to the target holder 2520a and the potential V4 applied to the target holder 2520b. Sputtered particles are generated when the cations collide with the targets 2500a and 2500b, and the sputtered particles are deposited on the substrate 2560.

When the targets 2500a and 2500b are each an In—Ga—Zn oxide target, the cations collide with the targets 2500a and 2500b, so that Ga and Zn each of which has a smaller relative atom mass than In are sputtered from the targets 2500a and 2500b preferentially to be deposited on the substrate 2560. Because of release of Ga and Zn, In is segregated on the surfaces of the targets 2500a and 2500b. Then, the In segregated on the surfaces of the targets 2500a and 2500b are sputtered from the targets 2500a and 2500b to be deposited on the substrate 2560.

The composite oxide semiconductor as illustrated in FIGS. 13A and 13B, FIGS. 14A and 14B, FIGS. 15A and 15B, or FIGS. 16A and 16B, in which Region A and Region B are mixed, is presumed to be formed after the above-described deposition model.

2-4. Carrier Density of Oxide Semiconductor Film

Next, the carrier density of an oxide semiconductor film will be described below.

Examples of a factor affecting the carrier density of an oxide semiconductor film include oxygen vacancies (Vo) and impurities in the oxide semiconductor film.

As the amount of oxygen vacancies in the oxide semiconductor film increases, the density of defect states increases when hydrogen is bonded to the oxygen vacancy (this state is also referred to as VoH). The density of defect states also increases with an increase in the amount of impurities in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The carrier density of a substantially intrinsic oxide semiconductor film is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Figure 19:
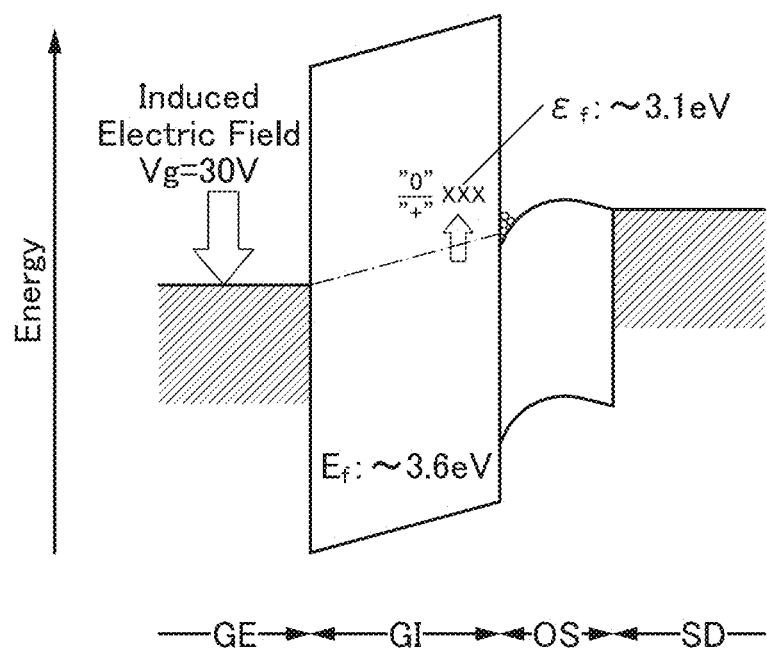
FIG. 19 illustrates energy bands in a transistor in which an oxide semiconductor is used for its channel region.

The use of the substantially intrinsic oxide semiconductor film may improve the reliability of a transistor. Here, the reason for the improvement in the reliability of a transistor which uses the oxide semiconductor film in its channel region is described with reference to FIG. 19. FIG. 19 is an energy band diagram of the transistor including the oxide semiconductor film in its channel region.

In FIG. 19, GE, GI, OS, and SD refer to a gate electrode, a gate insulating film, an oxide semiconductor film, and a source/drain electrode, respectively. In other words, FIG. 19 shows an example of energy bands of the gate electrode, the gate insulating film, the oxide semiconductor film, and the source/drain electrode in contact with the oxide semiconductor film.

In FIG. 19, a silicon oxide film and an In—Ga—Zn oxide are used as the gate insulating film and the oxide semiconductor film, respectively. The transition level ($\varepsilon$f) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor film and the silicon oxide film when the gate voltage ($V_g$) is 30 V is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor film and the silicon oxide film is lowered as the gate voltage is increased. A white circle and X in FIG. 19 represent an electron (carrier) and a defect state in the silicon oxide film, respectively.

As shown in FIG. 19, when thermal excitation of carriers occurs during the application of a gate voltage, the carriers are trapped by the defect states (X in the diagram) and the charge state of each of the defect states is changed from positive ("+") to neutral ("0"). In other words, when the value obtained by adding the thermal excitation energy to the Fermi level (Ef) of the silicon oxide film becomes greater than the transition level ($\varepsilon_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (X in FIG. 19) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Note that when the oxide semiconductor film is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor film takes a long time to be released and may behave like fixed charge. Thus, the transistor in which a channel region is formed in the oxide semiconductor film having a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor film, defect states are formed in the oxide semiconductor film. Thus, the concentration of silicon or carbon in the oxide semiconductor film and around an interface with the oxide semiconductor film (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1\times10^{18}$ atoms/cm$^3$, and preferably lower than or equal to $2\times10^{16}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

2-5. Structure of Oxide Semiconductor

Next, a structure of an oxide semiconductor is described.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS in some cases.

[a-Like OS]

An a-like OS has a structure between the structure of an nc-OS and the structure of an amorphous oxide semiconductor.

The a-like OS contains a void or a low-density region. The a-like OS has an unstable structure because it contains a void.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of the nc-OS and the density of the CAAC-OS are each higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor whose atomic ratio of In to Ga to Zn is 1:1:1, the density of single crystal InGaZnO$_4$ with a rhombohedral crystal structure is 6.357 g/cm$^3$. Accordingly, in the case of the oxide semiconductor whose atomic ratio of In to Ga to Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga to Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

As described above, oxide semiconductors have various structures and various properties. In the oxide semiconductor film of one embodiment of the present invention, two or more of an amorphous oxide semiconductor, an a-like OS, an nc-OS, and a CAAC-OS may be mixed. An example of such a case is described below.

The oxide semiconductor film of one embodiment of the present invention can include two kinds of crystal parts. That is, two kinds of crystal parts are mixed in the oxide semiconductor film. One is a crystal part (also referred to as a first crystal part) having orientation in the thickness direction (also referred to as a film-plane direction, or a direction perpendicular to a formation surface or a film surface), i.e., a crystal part having c-axis alignment. The other is a crystal part (also referred to as a second crystal part) which does not have c-axis alignment and has random orientation.

Although crystal parts are divided into the two categories for simplicity: the first crystal part having c-axis alignment and the second crystal part having no c-axis alignment, the first crystal part and the second crystal part cannot be distinguished from each other in some cases because there is not much difference in crystallinity, crystal size, and the like. That is, the oxide semiconductor film of one embodiment of the present invention can be described without a distinction between the first crystal part and the second crystal part.

For example, the oxide semiconductor film of one embodiment of the present invention includes a plurality of crystal parts, and at least one of the crystal parts may have c-axis alignment. Furthermore, in the crystal parts existing in the film, the proportion of crystal parts having no c-axis alignment may be higher than that of crystal parts having c-axis alignment. For example, in a transmission electron microscope image of a cross section of the oxide semiconductor film which is one embodiment of the present invention in the thickness direction, a plurality of crystal parts are observed and the second crystal parts having no c-axis alignment are observed at a higher proportion than the first crystal parts having c-axis alignment in some cases. In other words, the oxide semiconductor film of one embodiment of the present invention has a high proportion of second crystal parts having no c-axis alignment.

When the oxide semiconductor film has a high proportion of second crystal parts having no c-axis alignment, the following effects can be obtained.

In the case where a source which supplies sufficient oxygen is provided in the vicinity of the oxide semiconductor film, the second crystal part having no c-axis alignment can serve as an oxygen diffusion path. Thus, in the case where a source which supplies sufficient oxygen is provided in the vicinity of the oxide semiconductor film, oxygen can be supplied from the source to the first crystal part having c-axis alignment through the second crystal part having no c-axis alignment. Accordingly, the amount of oxygen vacancies in the oxide semiconductor film can be reduced. When such an oxide semiconductor film is used as a semiconductor film of a transistor, high reliability and high field-effect mobility can be obtained.

In the first crystal part, particular crystal planes are aligned in the thickness direction. Accordingly, when an X-ray diffraction (XRD) measurement is performed in a direction substantially perpendicular to the top surface of the oxide semiconductor film including the first crystal parts, a diffraction peak derived from the first crystal parts is observed at a predetermined diffraction angle ($2\theta$). However, even when the oxide semiconductor film includes the first crystal parts, a diffraction peak is not sufficiently observed in some cases because of x-rays scattering or increase in background due to a support substrate. Note that the higher the proportion of the first crystal parts in the oxide semiconductor film is, the higher the diffraction peak becomes; thus, the height (intensity) of the diffraction peak can be an indicator of crystallinity of the oxide semiconductor film.

As an example of a method for evaluating crystallinity of the oxide semiconductor film, electron diffraction can be given. For example, in the case where an electron diffraction measurement is performed on a cross section of the oxide semiconductor film of one embodiment of the present invention and an electron diffraction pattern thereof is observed, first regions including diffraction spots derived from the first crystal parts and second regions including diffraction spots derived from the second crystal parts are observed.

The first regions including diffraction spots derived from the first crystal parts are derived from crystal parts having c-axis alignment. The second regions including diffraction spots derived from the second crystal parts are derived from crystal parts having no orientation or crystal parts having random orientation. Therefore, different patterns are observed in accordance with the diameter of an electron beam, i.e., the area of an observed region in some cases. Note that in this specification and the like, electron diffraction with an electron beam having a diameter of 1 nm$\phi$, to 100 nm$\phi$, inclusive is referred to as nanobeam electron diffraction (NBED).

Note that the crystallinity of the oxide semiconductor film of one embodiment of the present invention may be evaluated by a method different from NBED. As examples of a method for evaluating crystallinity of the oxide semiconductor film, electron diffraction, x-ray diffraction, neutron diffraction, and the like can be given. Among the electron diffractions, transmission electron microscopy (TEM), scanning electron microscopy (SEM), convergent beam electron diffraction (CBED), selected-area electron diffraction (SAED), and the like can be favorably used in addition to the above NBED.

In NBED, a ring-like pattern is observed in a nanobeam electron diffraction pattern obtained by using an electron beam having a large diameter (e.g., greater than or equal to 25 nm$\phi$ and less than or equal to 100 nm$\phi$, or greater than or equal to 50 nm$\phi$ and less than or equal to 100 nm$\phi$). The ring-like pattern has luminance distribution in a radial direction in some cases. On the other hand, in an electron diffraction pattern of NBED obtained by using an electron beam having a sufficiently small diameter (e.g., greater than or equal to 1 nm$\phi$ and less than or equal to 10 nm$\phi$), a plurality of spots distributed in a circumferential direction (also referred to as $\theta$ direction) are observed at the position of the ring-like pattern. That is, the ring-like pattern obtained by using an electron beam having a large diameter is formed from an aggregate of the plurality of spots.

2-6. Evaluation of Crystallinity of Oxide Semiconductor Film

Three samples (Samples X1 to X3) each including an oxide semiconductor film were fabricated and the crystallinity of each of the samples was evaluated. Three kinds of oxide semiconductor films were formed in different conditions. First, methods for fabricating Samples X1 to X3 are described.

[Sample X1]

Sample X1 is a sample in which an approximately 100-nm-thick oxide semiconductor film is formed over a glass substrate. The oxide semiconductor film contains indium, gallium, and zinc. The oxide semiconductor film of Sample X1 was formed under the following conditions: the substrate temperature was 170° C.; an argon gas with a flow rate of 140 sccm and an oxygen gas with a flow rate of 60 sccm were introduced into a chamber of a sputtering apparatus; the pressure was set to 0.6 Pa; and an AC power of 2.5 kW was applied to a metal oxide target containing indium, gallium, and zinc (with an atomic ratio of In:Ga:Zn=4:2:4.1). Note that the percentage of oxygen flow rate under the formation conditions for Sample X1 was 30%.

[Sample X2]

Sample X2 is a sample in which an approximately 100-nm-thick oxide semiconductor film is formed over a glass substrate. The oxide semiconductor film of Sample X2 was formed under the following conditions: the substrate temperature was 130° C.; and an argon gas with a flow rate of 180 sccm and an oxygen gas with a flow rate of 20 sccm were introduced into a chamber of a sputtering apparatus. The percentage of oxygen flow rate under the formation conditions for Sample X2 was 10%. Note that the conditions other than the substrate temperature and the percentage of oxygen flow rate are the same as those for Sample X1.
[Sample X3]

Sample X3 is a sample in which an approximately 100-nm-thick oxide semiconductor film is formed over a glass substrate. The oxide semiconductor film of Sample X3 was formed under the following conditions: the substrate temperature was room temperature; an argon gas with a flow rate of 180 sccm and an oxygen gas with a flow rate of 20 sccm were introduced into a chamber of a sputtering apparatus. The percentage of oxygen flow rate under the formation conditions for Sample X3 was 10%. Note that the conditions other than the substrate temperature and the percentage of oxygen flow rate are the same as those for Sample X1.

The conditions for forming Samples X1 to X3 are shown in Table 1.

TABLE 1

|  | Target [atomic ratio] | Substrate temperature [° C.] | Pressure [Pa] | Percentage of oxygen flow rate [%] |
| --- | --- | --- | --- | --- |
| Sample X1 | In:Ga:Zn = 4:2:4.1 | 170 | 0.6 | 30 |
| Sample X2 | In:Ga:Zn = 4:2:4.1 | 130 | 0.6 | 10 |
| Sample X3 | In:Ga:Zn = 4:2:4.1 | R.T. | 0.6 | 10 |

Next, the crystallinity of Samples X1 to X3 was evaluated. In this embodiment, cross-sectional TEM observation, XRD measurement, and electron diffraction were performed to evaluate crystallinity.

[Cross-Sectional TEM Observation]

Figure 20A:
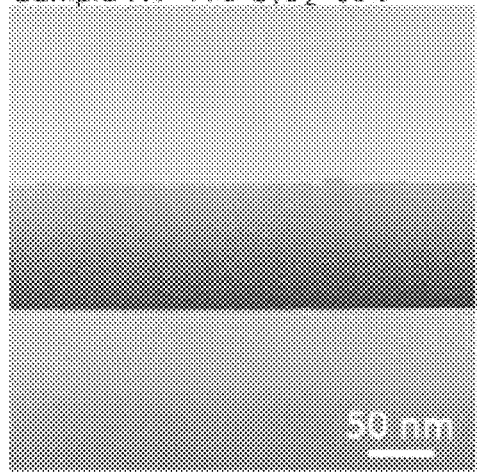
FIGS. 20A to 20C are cross-sectional TEM images and an HR-TEM image of an oxide semiconductor film.
Figure 20B:
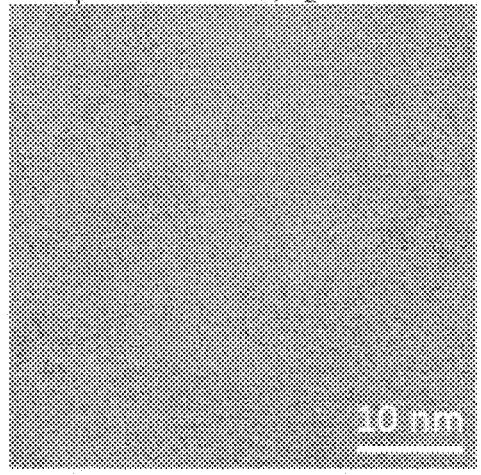

FIGS. 20A to 20C, FIGS. 21A to 21C, and FIGS. 22A to 22C show cross-sectional TEM observation results of Samples X1 to X3. FIGS. 20A and 20B are cross-sectional TEM images of Sample X1. FIGS. 21A and 21B are cross-sectional TEM images of Sample X2. FIGS. 22A and 22B are cross-sectional TEM images of Sample X3.

Figure 20C:
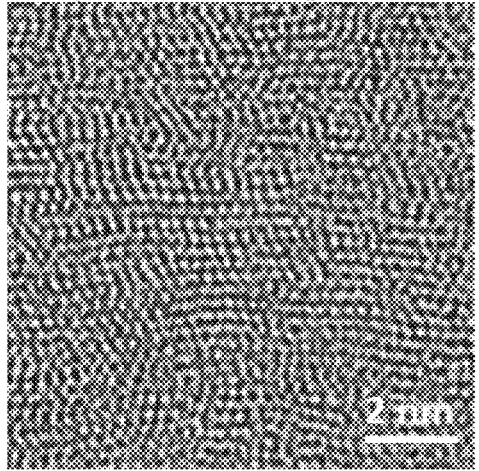

FIG. 20C, FIG. 21C, and FIG. 22C are cross-sectional high resolution transmission electron microscope (HR-TEM) images of Sample X1, Sample X2, and Sample X3, respectively. The cross-sectional HR-TEM images may be obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

As shown in FIGS. 20A to 20C and FIGS. 21A to 21C, crystal parts in which atoms are aligned in a layered manner in the thickness direction are observed in Sample X1 and Sample X2. In particular, in HR-TEM images, crystal parts in which atoms are aligned in a layered manner are easily observed. As shown in FIGS. 22A to 22C, the state where atoms are aligned in a layered manner in the thickness direction is unlikely to be observed in Sample X3.

[XRD Measurement]

Next, XRD measurement results of the samples will be described.

Figure 23A:
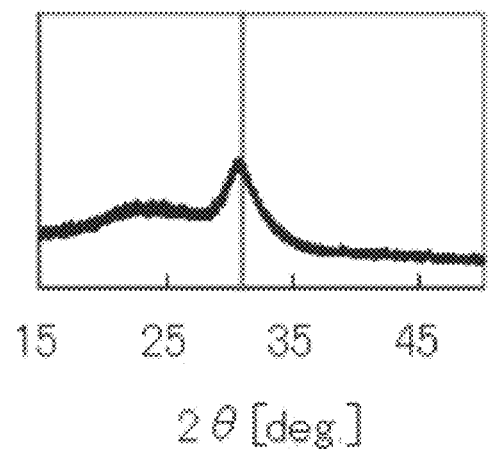
FIGS. 23A to 23C show XRD measurement results and electron diffraction patterns of an oxide semiconductor film.
Figure 25A:
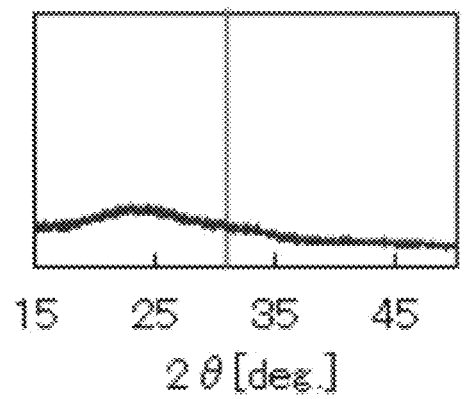
FIGS. 25A to 25C show XRD measurement results and electron diffraction patterns of an oxide semiconductor film.

FIG. 23A, FIG. 24A, and FIG. 25A show XRD measurement results of Sample X1, Sample X2, and Sample X3, respectively.

The XRD measurement was conducted by a powder method (also referred to as a θ-2θ method) which is a kind of an out-of-plane method. Note that in a θ-2θ method, X-ray diffraction intensity is measured while an incident angle of an X-ray is changed and the angle of a detector facing an X-ray source is equal to the incident angle. Note that a grazing-incidence XRD (GIXRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In FIG. 25A, FIG. 24A, and FIG. 25A, the vertical axis represents the diffraction intensity in arbitrary unit and the horizontal axis represents the angle 2θ.

As shown in FIG. 25A and FIG. 24A, a peak of diffraction intensity is observed at around 2θ=31° in each of Sample X1 and Sample X2. In contrast, as shown in FIG. 25A, in Sample X3, a peak of diffraction intensity at around 2θ=31° is unlikely to be observed. Alternatively, a peak of diffraction intensity at around 2θ=31° is extremely low or does not exist.

The diffraction angle (at around 2θ=31°) at which the peak of the diffraction intensity was observed corresponds to a diffraction angle on the (009) plane of the structure model of single crystal InGaZnO$_4$. Accordingly, the above peaks indicate that each of Samples X1 and X2 includes a crystal part where the c-axes are aligned in the thickness direction (hereinafter also referred to as a crystal part having c-axis alignment or a first crystal part). Note that it is difficult to determine, by XRD measurement, whether a crystal part having c-axis alignment is included in Sample X3.

[Electron Diffraction]

Next, electron diffraction measurement results of Samples X1 to X3 are described below. In the electron diffraction measurement, an electron diffraction pattern was obtained in such a manner that each of the samples is irradiated with an electron beam incident in a direction perpendicular to its cross section. The electron-beam diameters were set to 1 nmϕ and 100 nmϕ.

In electron diffraction, as the diameter of an incident electron beam becomes larger and the thickness of sample becomes larger, information of the sample in the depth direction is likely to be shown in the electron diffraction pattern. Therefore, the information of local regions can be obtained by reducing not only the diameter of the electron beam but also the thickness of the sample in the depth direction. In contrast, when the thickness of the sample in the depth direction is too small (e.g., the thickness of the sample in the depth direction is less than or equal to 5 nm), information of only submicroscopic region is obtained. Thus, an electron diffraction pattern obtained when a crystal exists in the submicroscopic region is similar to an electron diffraction pattern of a single crystal in some cases. When the aim is not to analyze the submicroscopic region, the thickness of the sample in the depth direction is preferably greater than or equal to 10 nm and less than or equal to 100 nm, typically greater than or equal to 10 nm and less than or equal to 50 nm.

Figure 23B:
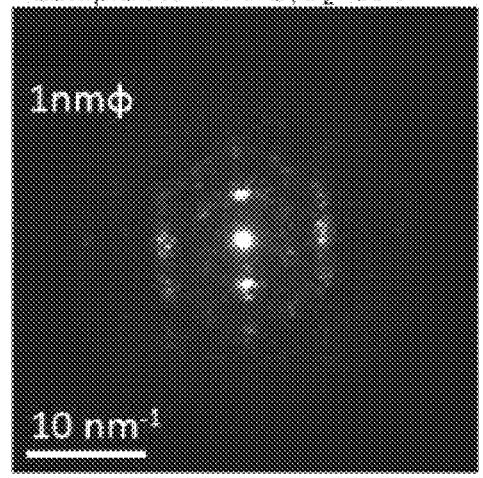
Figure 23C:
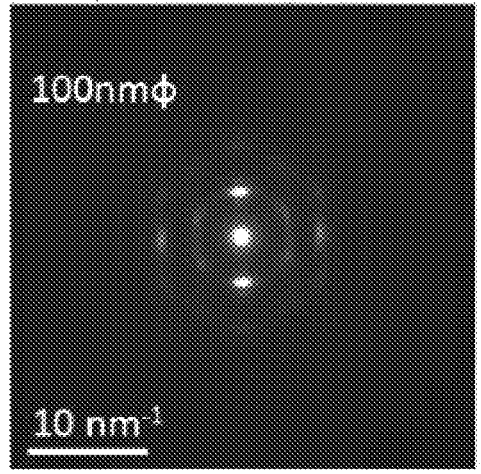
Figure 25B:
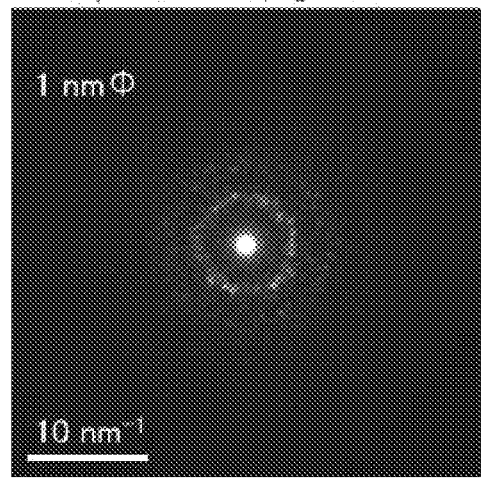
Figure 25C:
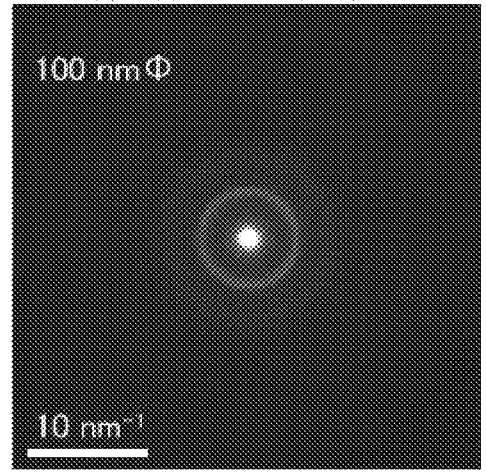

FIGS. 23B and 23C show electron diffraction patterns of Sample X1. FIGS. 24B and 24C show electron diffraction patterns of Sample X2. FIGS. 25B and 25C show electron diffraction patterns of Sample X3.

The contrast of the electron diffraction patterns shown in FIGS. 23B and 23C, FIGS. 24B and 24C, and FIGS. 25B and 25C is adjusted for clarity. In FIGS. 23B and 23C, FIGS. 24B and 24C, and FIGS. 25B and 25C, the brightest luminescent spot at the center of the pattern is derived from the incident electron beam and is the center of the electron diffraction pattern (also referred to as a direct spot or a transmitted wave).

As shown in FIG. 23B, when the diameter of the incident electron beam is set to 1 nmϕ, a plurality of spots circumferentially distributed can be observed. This indicates that the oxide semiconductor film contains a plurality of submicroscopic crystal parts having random surface orientation. As shown in FIG. 23C, when the diameter of the incident electron beam is set to 100 nmϕ, the luminances of a sequence of a plurality of diffraction spots derived from these plurality of crystal parts are averaged to be a ring-like diffraction pattern. Two ring-like diffraction patterns with different radii are observed in FIG. 23C. The rings are referred to as a first ring and a second ring in ascending order of radius. It is observed that the luminance of the first ring is higher than that of the second ring. In addition, two spots (referred to as first regions) with high luminance are observed at a position overlapping with the first ring.

The distance from the center to the first ring in a radial direction substantially corresponds to the distance from the center to a diffraction spot on the (009) plane of the structure model of single crystal $InGaZnO_4$ in a radical direction. The first regions are diffraction spots derived from c-axis alignment.

As shown in FIG. 23C, the observations of the ring-like diffraction patterns indicate that crystal parts having random orientation (hereinafter also referred to as crystal parts having no c-axis alignment or second crystal parts) exist in the oxide semiconductor film.

In addition, two first regions are presumed to have two-hold symmetry because the regions are disposed symmetrically with respect to the center point of the electron diffraction pattern and the luminances of the regions are substantially equal to each other. As described above, since the two first regions are diffraction spots which are derived from the c-axis alignment, the orientation of a straight line which passes through the two first regions and the center is aligned with that of the c-axis of the crystal part. The thickness direction is the vertical direction of FIG. 23C, which suggests the presence of crystal part in which the c-axis is aligned in the thickness direction in the oxide semiconductor film.

As described above, the oxide semiconductor film of Sample X1 is confirmed to be a film including both crystal parts having c-axis alignment and crystal parts having no c-axis alignment.

The results of the electron diffraction patterns shown in FIGS. 24B and 24C and FIGS. 25B and 25C are substantially the same as those of the electron diffraction patterns shown in FIGS. 23B and 23C. The luminance of the two spots (first regions) derived from c-axis alignment is high in the order of Sample X1, Sample X2 and Sample X3. This indicates that the proportion of crystal parts having c-axis alignment is high in that order.

[Quantification Method of Crystallinity of Oxide Semiconductor Film]

Next, an example of a quantification method of crystallinity of an oxide semiconductor film is described with reference to FIGS. 26A and 26B, FIG. 27, and FIG. 28.

Figure 26A:
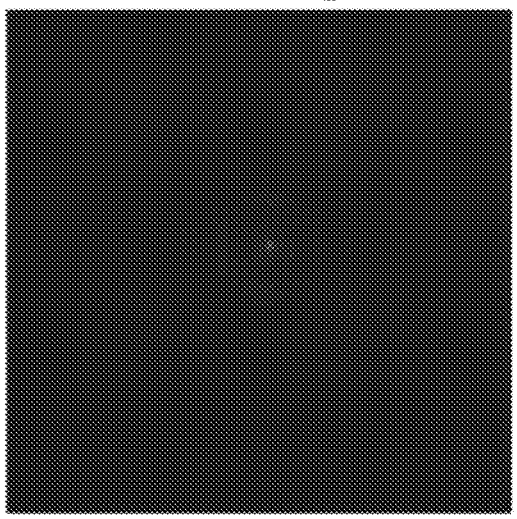
FIGS. 26A and 26B show electron diffraction patterns.

First, an electron diffraction pattern is prepared (see FIG. 26A).

Figure 26B:
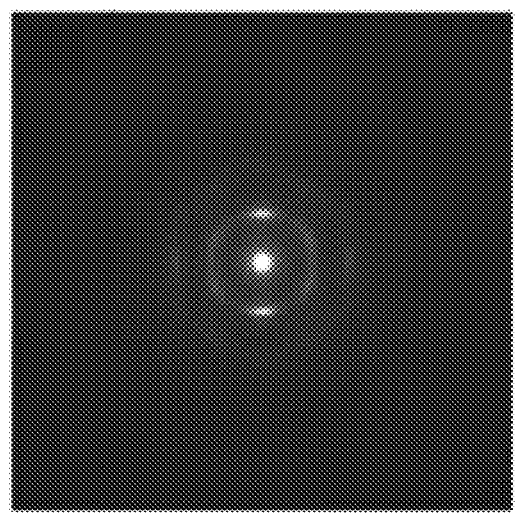

FIG. 26A shows an electron diffraction pattern obtained by measuring a 100-nm-thick oxide semiconductor film using an electron beam with a diameter of 100 nmϕ. FIG. 26B shows an electron diffraction pattern obtained by adjusting contrast of the electron diffraction pattern shown in FIG. 26A.

In FIG. 26B, two clear spots (first regions) are observed over and under a direct spot. The two spots (first regions) are derived from diffraction spots corresponding to (001) in a structure model of $InGaZnO_4$, that is, crystal parts having c-axis alignment. In addition to the first regions, a ring-like pattern (second regions) with a low luminance positioned on an approximately concentric circle of the first region is observed. The ring-like pattern is obtained when the luminances of spots derived from structures of crystal parts having no c-axis alignment (second crystal parts) are averaged by using the electron beam with a diameter of 100 nmϕ.

Here, in the electron diffraction pattern, the first regions including diffraction spots derived from the crystal parts having c-axis alignment and the second regions including diffraction spots derived from the second crystal parts are observed to overlap with each other. Thus, a line profile including the first regions and line profiles including the second regions are obtained and compared with each other, whereby the crystallinity of the oxide semiconductor film can be quantified.

The line profile including the first regions and the line profiles including the second regions are described with reference to FIG. 27.

Figure 27:
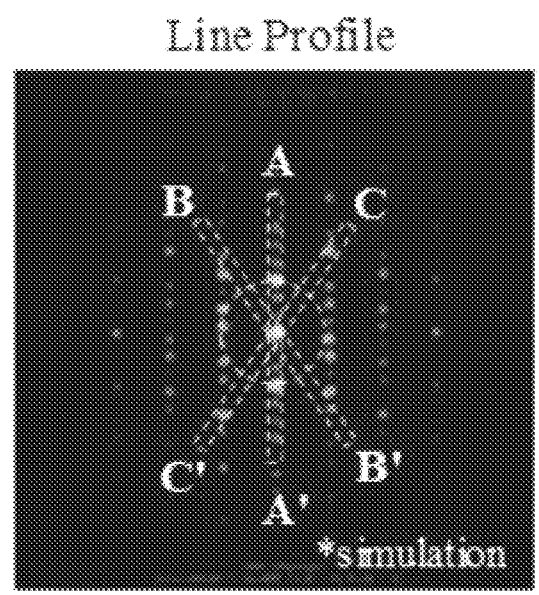
FIG. 27 shows a line profile of an electron diffraction pattern.

FIG. 27 shows a simulation pattern of electron diffraction that is obtained when an electron beam is emitted to the (100) plane of the structure model of $InGaZnO_4$. In the simulation pattern, auxiliary lines of a region A-A', a region B-B', and a region C-C' are drawn.

The region A-A' in FIG. 27 includes a straight line passing through two diffraction spots derived from the first crystal parts having c-axis alignment and a direct spot. The regions B-B' and C-C' in FIG. 27 each include a straight line passing through a region where no diffraction spot derived from the first crystal part having c-axis alignment is observed and the direct spot. An angle between the region A-A' and the region B-B' or C-C' is approximately 34°, specifically, larger than or equal to 30° and smaller than or equal to 38°, preferably larger than or equal to 32° and smaller than or equal to 36°, further preferably larger than or equal to 33° and smaller than or equal to 35°.

Figure 28:
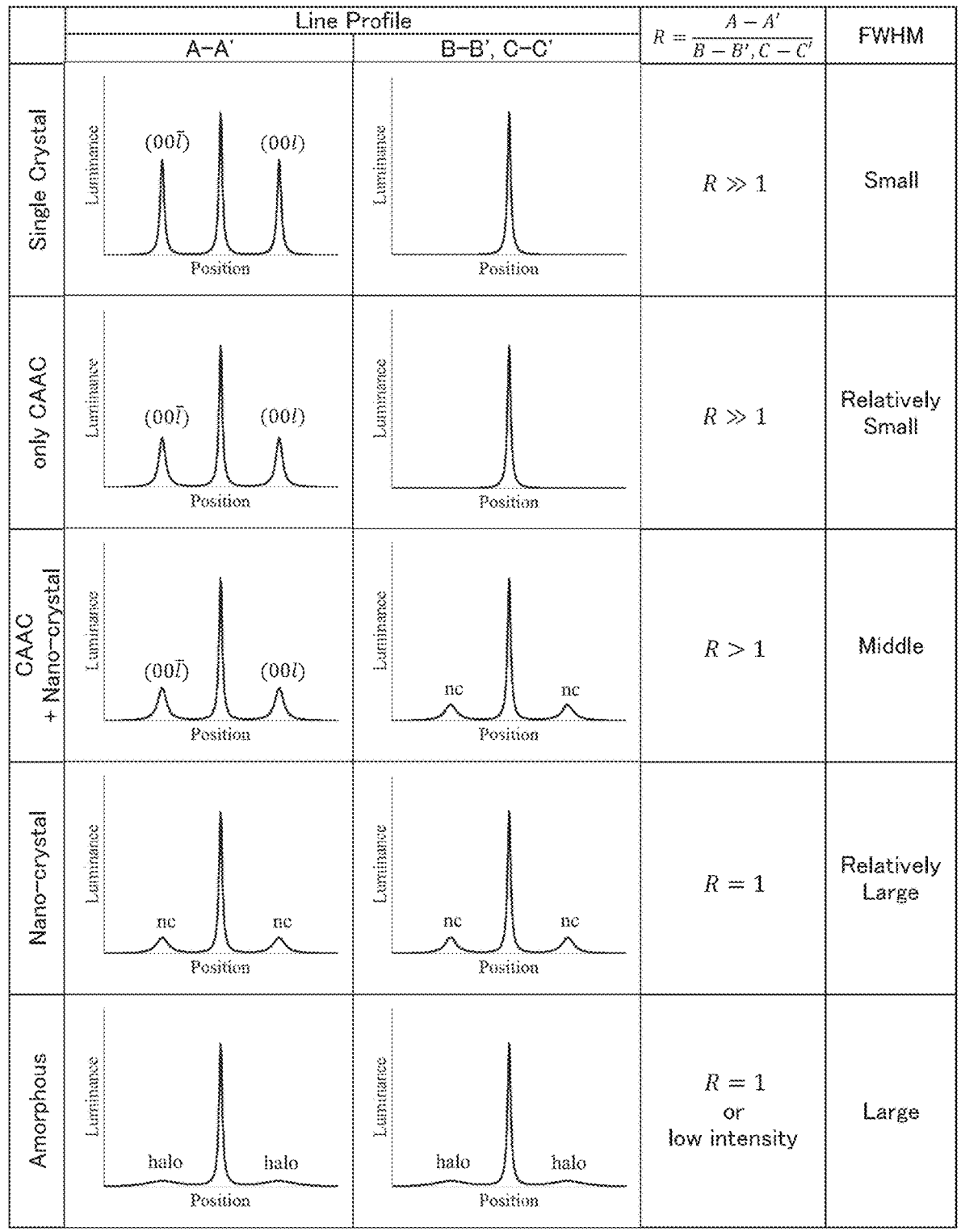
FIG. 28 shows luminance profiles of electron diffraction patterns, relative luminance R of the luminance profiles, and full widths at half maximum of the profiles.

The line profiles have the tendencies shown in FIG. 28 in accordance with the structure of the oxide semiconductor film. FIG. 28 illustrates line profiles and shows relative luminance R and a full width at half maximum (FWHM) of each line profile.

Relative luminance R in FIG. 28 is obtained by dividing the integrated intensity of luminance of the region A-A' by the integrated intensity of luminance of the region B-B' or the integrated intensity of luminance of the region C-C'. Note that the integrated intensity of the luminance of each of the regions A-A', B-B', and C-C' is obtained by removing the luminance of background derived from the direct spot which appears at the center.

When the relative luminance R is calculated, the intensity of c-axis alignment can be quantitatively defined. For example, as shown in FIG. 28, in a single crystal oxide semiconductor film, the peak intensity of diffraction spots derived from the first crystal parts having c-axis alignment in the region A-A' is high and there is no diffraction spot derived from the first crystal part having c-axis alignment in the regions B-B' and C-C'; thus, the relative luminance R is much larger than 1. The relative luminance R decreases in the order of single crystal, CAAC alone (details of CAAC will be described later), CAAC+nanocrystal, nanocrystal, and amorphous. In particular, in nanocrystal and amorphous, which have no particular orientation, the relative luminance R is equal to 1.

As the periodicity of the crystal becomes higher, the intensity of the spectrum derived from the first crystal part having c-axis alignment becomes high and the full width at half maximum of the spectrum becomes small. Thus, the full width at half maximum of single crystal is the smallest, and the full width at half maximum is increased in the order of CAAC alone, CAAC+nanocrystal, and nanocrystal. The full width at half maximum of amorphous is extremely large and the profile thereof is called a "halo".

[Analysis Using Line Profile]

As described above, the ratio of the integrated intensity of luminance of the first regions to the integrated intensity of luminance of the second regions is important information to presume the proportion of crystal parts having orientation.

Then, from electron diffraction patterns of Samples X1 to X3 that is described above, analysis with line profiles was performed.

FIGS. 29A1 and 29A2 show results of analysis with line profiles of Sample X1. FIGS. 29B1 and 29B2 show results of analysis with line profiles of Sample X2. FIGS. 29C1 and 29C2 show results of analysis with line profiles of Sample X3.

FIG. 29A1 shows the electron diffraction pattern in FIG. 23C in which the regions A-A', B-B', and C-C' are drawn. FIG. 29B1 shows the electron diffraction pattern in FIG. 24C in which the regions A-A', B-B', and C-C' are drawn. FIG. 29C1 shows the electron diffraction pattern in FIG. 25C in which the regions A-A', B-B', and C-C' are drawn.

The regions A-A', B-B', and C-C' can each be obtained by normalizing line profiles using the luminance of the direct spot as a reference. Note that the direct spot appears at the center of an electron diffraction pattern. With the regions, Samples X1 to X3 can be relatively compared.

When the profile of the luminance is calculated, a component of the luminance derived from inelastic scatterings and the like from the sample is subtracted as the background, whereby comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the lower luminance side than the straight line can be subtracted as the background.

Here, the integrated intensity of the luminance of each of the regions A-A', B-B', and C-C' is calculated from data in which the background is subtracted by the method described above. Then, the relative luminance R is obtained by dividing the integrated intensity of the luminance of the region A-A' by the integrated intensity of the luminance of the region B-B' or the integrated intensity of the luminance of the region C-C'.

Figure 30:
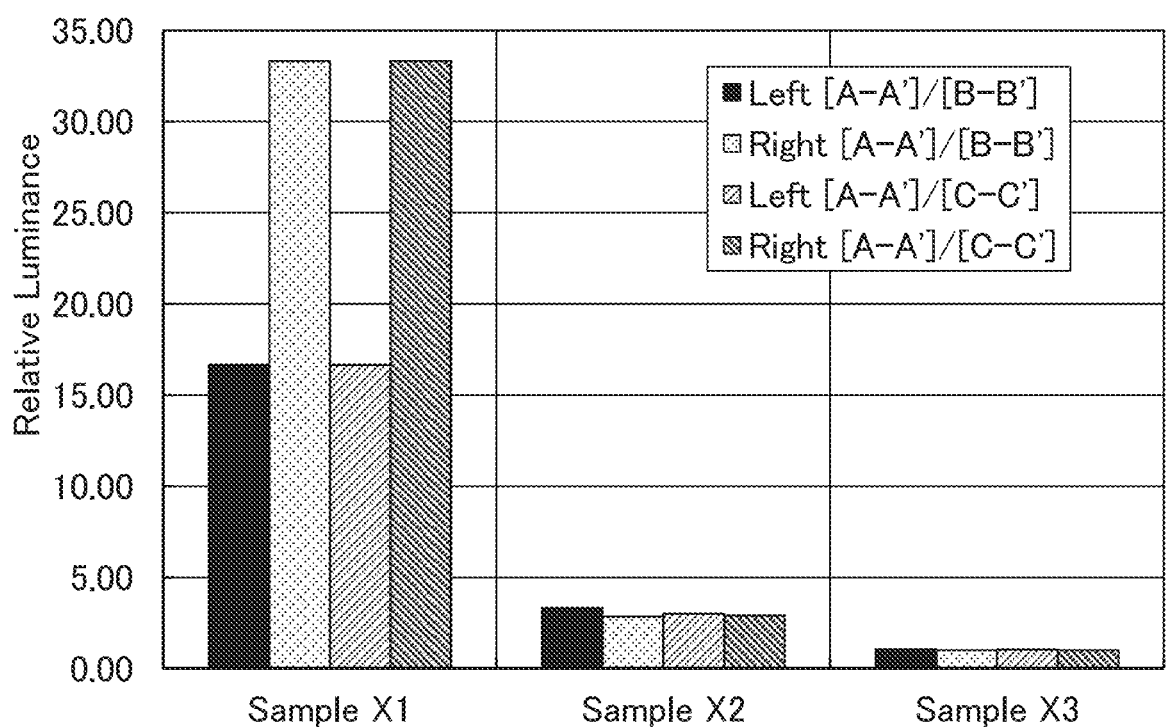
FIG. 30 shows relative luminance estimated from electron diffraction patterns of oxide semiconductor films.

FIG. 30 shows the relative luminance R of Samples X1 to X3. In FIG. 30, in a spectrum on the left side and the right side of the direct spot in the profiles of the luminance in each of FIGS. 29A2, 29B2, and 29C2, a value obtained by dividing the integrated intensity of the luminance of the region A-A' by the integrated intensity of the luminance of the region B-B' and a value obtained by dividing the integrated intensity of the luminance of the region A-A' by the integrated intensity of the luminance of the region C-C' are calculated.

As shown in FIG. 30, the relative luminance of Samples X1 to X3 is as follows. The relative luminance R of Sample X1 is 25.00. The relative luminance R of Sample X2 is 3.04. The relative luminance R of Sample X3 is 1.05. Note that the relative luminance R is an average value of relative luminances at four points. As described above, the relative luminance R is high in the order of Sample X1, Sample X2, and Sample X3.

When the oxide semiconductor film of one embodiment of the present invention is used as a semiconductor film in which a channel of a transistor is formed, the relative luminance R is preferably greater than 1 and less than or equal to 40, further preferably greater than 1 and less than or equal to 10, still further preferably greater than 1 and less than or equal to 3. With use of such an oxide semiconductor film as the semiconductor film, both high stability of electrical characteristics and high field-effect mobility in a low-gate-voltage region can be achieved.

2-7. Proportion of Crystal Part

The proportion of crystal parts in an oxide semiconductor film can be estimated by analyzing its cross-sectional TEM image.

A method for analyzing the image is described. An image is analyzed as follows. First, a high-resolution TEM image is subjected to two-dimensional fast Fourier transform (FFT), whereby an FFT image is obtained. The obtained FFT image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. Then, the proportion of crystal parts can be estimated from the proportion of the area of the remaining image. Moreover, the proportion of the area other than the crystal parts can be estimated by subtracting the remaining region from the area of the region used for calculation (also referred to as the area of an original image).

FIG. 31A1 shows a cross-sectional TEM image of Sample X1. FIG. 31A2 shows an image obtained through the analysis of the cross-sectional TEM image of Sample X1. FIG. 31B1 shows a cross-sectional TEM image of Sample X2. FIG. 31B2 shows an image obtained through the analysis of the cross-sectional TEM image of Sample X2. FIG. 31C1 shows a cross-sectional TEM image of Sample X3. FIG. 31C2 shows an image obtained through the analysis of the cross-sectional TEM image of Sample X3.

White regions in the oxide semiconductor film in the images obtained through the analysis correspond to regions including crystal parts having orientation. Black regions correspond to regions including crystal parts having no orientation or crystal parts with random orientation.

From the result shown in FIG. 31A2, the proportion of the area other than the region including crystal parts having orientation is approximately 43.1% in Sample X1. From the result shown in FIG. 31B2, the proportion of the area other than the region including crystal parts having orientation is approximately 61.7% in Sample X2. From the result shown in FIG. 31C2, the proportion of the area other than the region including crystal parts having orientation is approximately 89.5% in Sample X3.

The proportion of the region other than crystal parts having orientation in an oxide semiconductor film, which is estimated in the above manner, is preferably greater than or equal to 5% and less than 40% because the oxide semiconductor film has extremely high crystallinity and extremely high stability of electrical characteristics and hardly generates oxygen vacancies. In contrast, when the proportion of the region other than crystal parts having orientation in an oxide semiconductor film is higher than or equal to 40% and lower than 100%, preferably higher than or equal to 60% and lower than or equal to 90%, the oxide semiconductor film includes both the crystal parts having orientation and the crystal parts having no orientation at an appropriate ratio and thus can achieve both high stability of electrical characteristics and high mobility.

Here, a region other than the crystal parts that can be easily observed in a cross-sectional TEM image or a cross-sectional TEM image obtained through analysis can be referred to as a lateral growth buffer region (LGBR).

2-8. Oxygen Diffusion to Oxide Semiconductor Film

Next, the evaluation results of ease of oxygen diffusion to oxide semiconductor films are described.

The following three samples (Samples Y1 to Y3) were fabricated.

[Sample Y1]

First, an approximately 50-nm-thick oxide semiconductor film was formed over a glass substrate in a manner similar to that of Sample X1. Next, an approximately 30-nm-thick silicon oxynitride film, an approximately 100-nm-thick silicon oxynitride film, and an approximately 20-nm-thick silicon oxynitride film were stacked over the oxide semiconductor film by a PECVD method. Note that in the following description, an oxide semiconductor film and a silicon oxynitride film are referred to as OS and GI, respectively, in some cases.

Then, heat treatment was performed at 350° C. in a nitrogen atmosphere for one hour.

Next, a 5-nm-thick In—Sn—Si oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}$O) at a flow rate of 150 sccm and an oxygen gas ($^{18}$O) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Since the silicon oxynitride film contained oxygen ($^{16}$O) at a main component level, an oxygen gas ($^{18}$O) was used to exactly measure the amount of oxygen added by the oxygen addition treatment.

Then, an approximately 100-nm-thick silicon nitride film was formed by a PECVD method.

[Sample Y2]

Sample Y2 is a sample whose oxide semiconductor film was formed in different conditions from those of Sample Y1. In Sample Y2, an approximately 50-nm-thick oxide semiconductor film was formed in a manner similar to that of Sample X2.

[Sample Y3]

Sample Y3 is a sample whose oxide semiconductor film was formed in different conditions from those of Sample Y1. In Sample Y3, an approximately 50-nm-thick oxide semiconductor film was formed in a manner similar to that of Sample X3.

Through the above process, Samples Y1 to Y3 were fabricated.

[SIMS Analysis]

The concentration of $^{18}$O in Samples Y1 to Y3 was measured by secondary ion mass spectrometry (SIMS) analysis. The SIMS analysis was performed under three conditions: a condition in which Samples Y1 to Y3 were not subjected to heat treatment; a condition in which Samples Y1 to Y3 were subjected to heat treatment at 350° C. in a nitrogen atmosphere for one hour; and a condition in which Samples Y1 to Y3 were subjected to heat treatment at 450° C. in a nitrogen atmosphere for one hour.

Figure 32A:
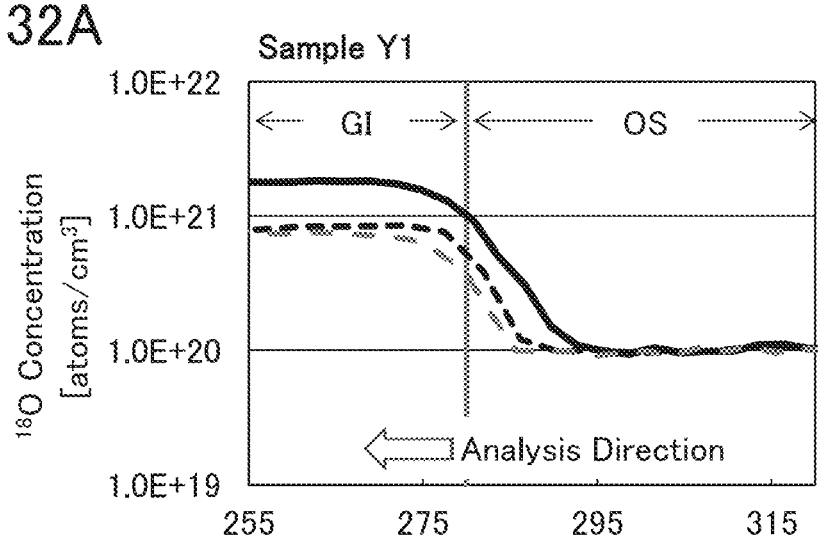
FIGS. 32A to 32C show SIMS measurement results of oxide semiconductor films.
Figure 32B:
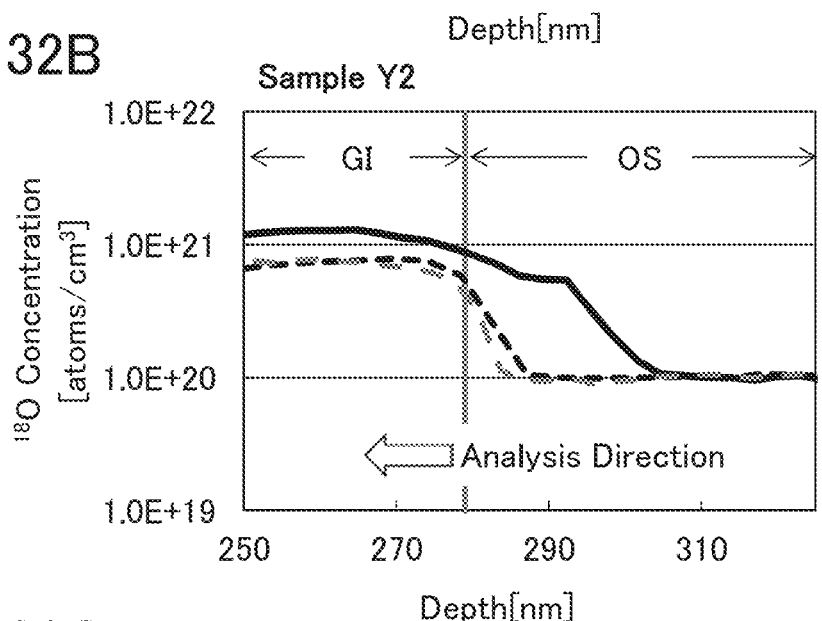
Figure 32C:
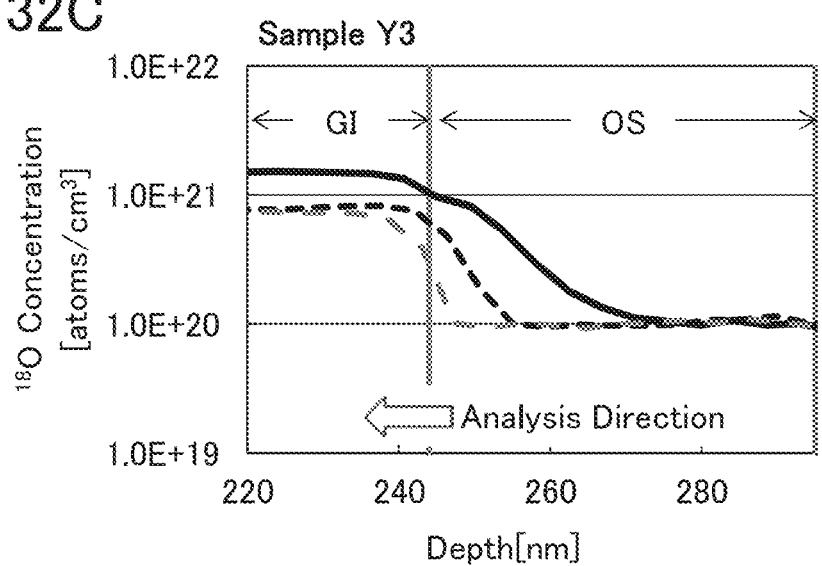

FIGS. 32A to 32C show SIMS measurement results. FIG. 32A, FIG. 32B, and FIG. 32C show SIMS measurement results of Sample Y1, Sample Y2, and Sample Y3, respectively.

FIGS. 32A to 32C show the analysis results of a region including GI and OS. Note that FIGS. 32A to 32C show results of SIMS (also referred to as substrate side depth profile (SSDP)-SIMS) analysis performed from the substrate side.

In FIGS. 32A to 32C, a gray dashed line indicates a profile of the sample in which heat treatment was not performed, a black dashed line indicates a profile of the sample in which heat treatment was performed at 350° C., and a black solid line indicates a profile of the sample in which heat treatment was performed at 450° C.

In each of Samples Y1 to Y3, it is found that $^{18}$O was diffused to GI and also to OS. Furthermore, the position where $^{18}$O was diffused was deeper in the order of Sample Y1, Sample Y2, and Sample Y3. In addition, when heat treatment was performed at 350° C. or 450° C., $^{18}$O was more deeply diffused.

From the above results, it is found that an oxide semiconductor film including both crystal parts having orientation and crystal parts having no orientation and a low proportion of crystal parts having orientation is a film which easily transmits oxygen, in other words, a film in which oxygen is easily diffused. In addition, when heat treatment is performed at 350° C. or 450° C., oxygen in a GI film is diffused to OS.

The above results show that the higher the proportion (density) of crystal parts having orientation is, the more difficult it is for oxygen to be diffused in the thickness direction, and the lower the density is, the easier it is for oxygen to be diffused in the thickness direction. The ease of oxygen diffusion to the oxide semiconductor film can be considered as follows.

In an oxide semiconductor film containing both crystal parts having orientation and submicroscopic crystal parts having no orientation, a region other than the crystal parts which can be obviously observed in a cross-sectional observation image (LGBR) can be a region in which oxygen is easily diffused, that is, can serve as an oxygen diffusion path. As a result, in the case where a source which supplies sufficient oxygen is provided in the vicinity of the oxide semiconductor film, oxygen can be easily supplied through the LGBR to the crystal parts having orientation, and the amount of oxygen vacancies in the film can be reduced.

For example, an oxide film which easily releases oxygen is formed to be in contact with the oxide semiconductor film and heat treatment is performed, so that oxygen released from the oxide film is diffused to the oxide semiconductor film in the thickness direction through the LGBR. Through the LGBR, oxygen can be supplied laterally to crystal parts having orientation. Accordingly, oxygen is easily supplied sufficiently to the crystal parts having orientation and a region other than the crystal parts in the oxide semiconductor film, which leads to an effective reduction of oxygen vacancy in the film.

For example, when a hydrogen atom which is not bonded to a metal atom exists in the oxide semiconductor film, an oxygen atom is bonded to the hydrogen atom, and then OH is formed and fixed in some cases. The state in which a certain amount (e.g., approximately $1 \times 10^{17}$ cm$^{-3}$) of hydrogen atoms trapped in oxygen vacancy (Vo) in the oxide semiconductor film (such a hydrogen atom is referred to as VoH) is formed in the deposition at a low temperature, whereby generation of OH is inhibited. A certain amount of carriers exists in the oxide semiconductor film because VoH generates a carrier. Thus, the oxide semiconductor film with an increased carrier density can be formed. Although an oxygen vacancy is formed concurrently with the deposition, the oxygen vacancy can be reduced by introducing oxygen through the LGBR as described above. In this manner, the oxide semiconductor film with a relatively high carrier density and a sufficiently reduced amount of oxygen vacancies can be formed.

A clear grain boundary cannot be observed in the oxide semiconductor film because submicroscopic crystal parts having no orientation at the time of the deposition is formed in a region other than crystal parts having orientation. The submicroscopic crystal part is positioned between a plurality of crystal parts having orientation. The submicroscopic crystal part is bonded to an adjacent crystal part having orientation by growing in the lateral direction with heat at the time of the deposition. The submicroscopic crystal part functions as a region where a carrier is generated. The oxide semiconductor film with such a structure is expected to improve field-effect mobility considerably when used in a transistor.

In addition, plasma treatment in an oxygen atmosphere is preferably performed after the oxide semiconductor film is formed and an oxide insulating film such as a silicon oxide film is formed over the oxide semiconductor film. The treatment can supply oxygen to the film and reduce the hydrogen concentration. For example, during plasma treatment, fluorine which remains in the chamber is doped at the same time to the oxide semiconductor film in some cases. Fluorine exists as a fluorine atom with negative charges and is bonded to a hydrogen atom with positive charges by Coulomb force, and then HF is generated. HF is released to the outside of the oxide semiconductor film during the plasma treatment, and as a result, the hydrogen concentration in the oxide semiconductor film can be reduced. In the plasma treatment, $H_2O$ in which an oxygen atom and hydrogen atoms are bonded is released to the outside of the film in some cases.

A structure in which a silicon oxide film (or a silicon oxynitride film) is stacked over the oxide semiconductor film is considered. Fluorine in the silicon oxide film does not affect electrical characteristics of the oxide semiconductor film because fluorine is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancies in the oxide semiconductor film can be reduced and hydrogen which is not bonded to a metal atom in the film can be reduced, which leads to the improvement of reliability. The electrical characteristics are expected to be improved because the carrier density of the oxide semiconductor film is greater than or equal to a certain amount.

<2-9. Deposition Method of Oxide Semiconductor Film>

Next, a deposition method of the oxide semiconductor film of one embodiment of the present invention is described.

The oxide semiconductor film of one embodiment of the present invention can be formed by a sputtering method under an atmosphere containing oxygen.

An oxide target that can be used for forming the oxide semiconductor film is not limited to an In—Ga—Zn-based oxide; for example, an In-M-Zn-based oxide (M is Al, Ga, Y, or Sn) can be used.

When an oxide semiconductor film containing crystal parts is formed as the oxide semiconductor film using a sputtering target containing a polycrystalline oxide having a plurality of crystal grains, an oxide semiconductor film with crystallinity is more likely to be obtained than in the case of using a sputtering target not containing a polycrystalline oxide.

The consideration of the deposition mechanism of the oxide semiconductor film is made below.

In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of an oxide semiconductor film containing nanocrystals. An oxide semiconductor film containing crystal parts having orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

At least part of this embodiment can be implemented in combination with any of the other embodiments described in this specification as appropriate.

Embodiment 3

In this embodiment, examples of a display device that includes the transistor described in the above embodiments will be described below with reference to FIGS. 33 to 40.

Figure 33:
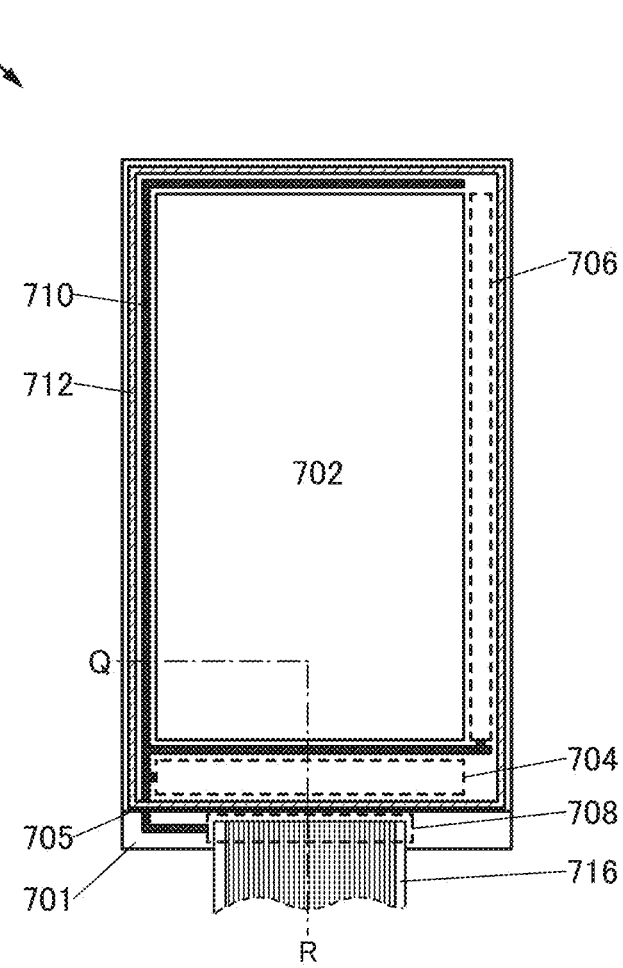
FIG. 33 is a top view illustrating one mode of a display device.

FIG. 33 is a top view illustrating an example of a display device. A display device 700 in FIG. 33 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 33, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 34:
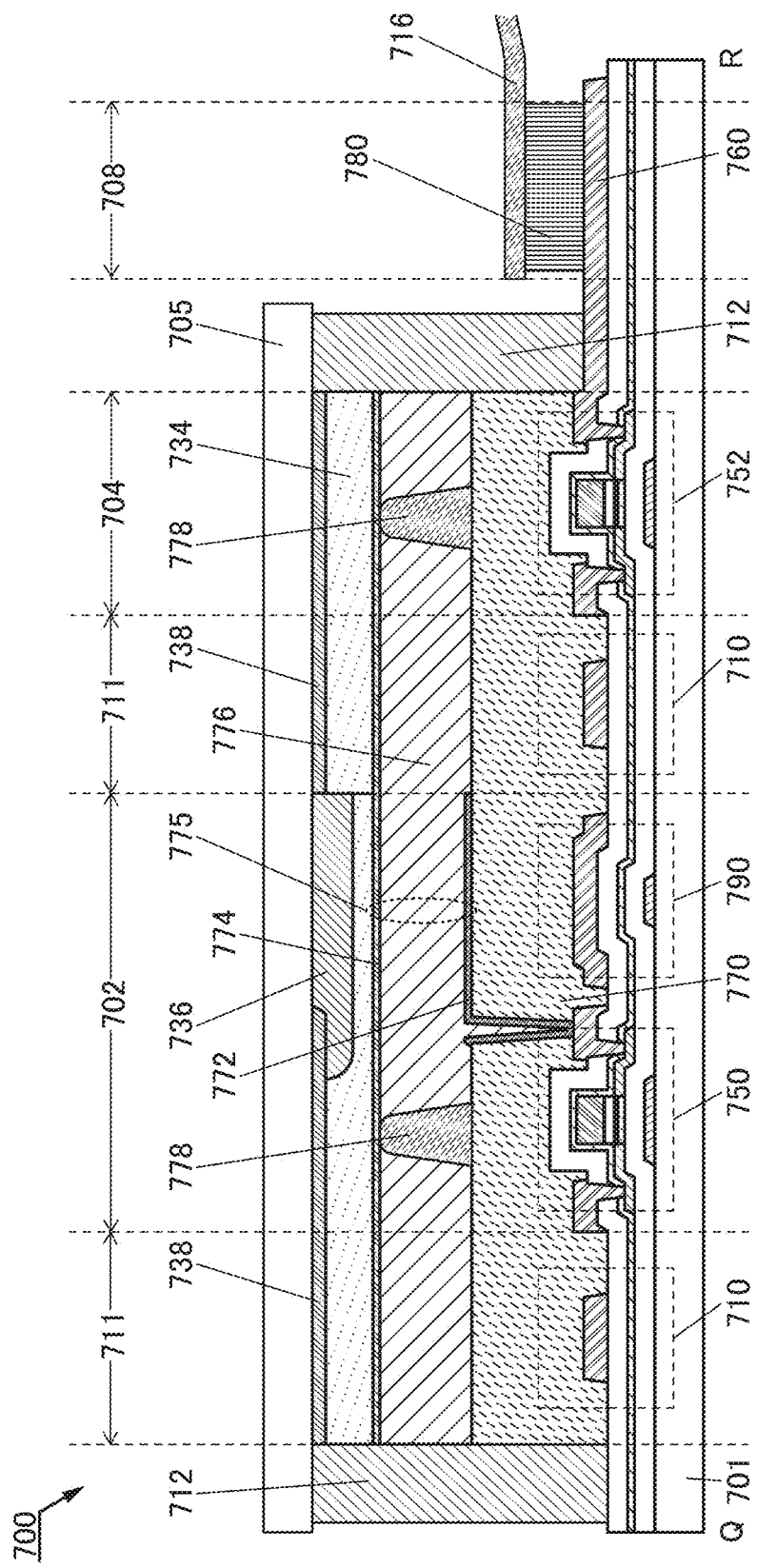
FIG. 34 is a cross-sectional view illustrating one mode of a display device.
Figure 35:
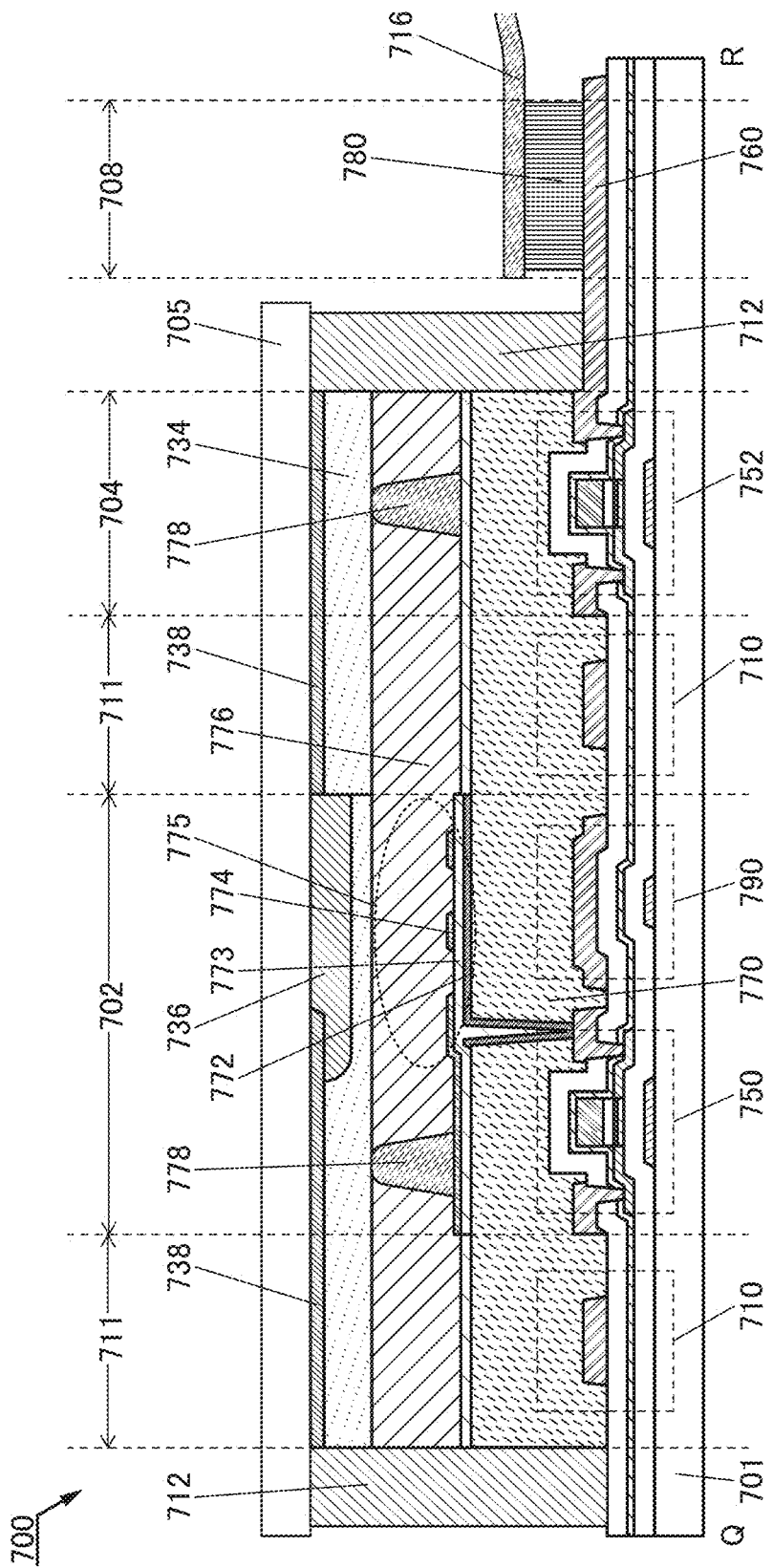
FIG. 35 is a cross-sectional view illustrating one mode of a display device.
Figure 36:
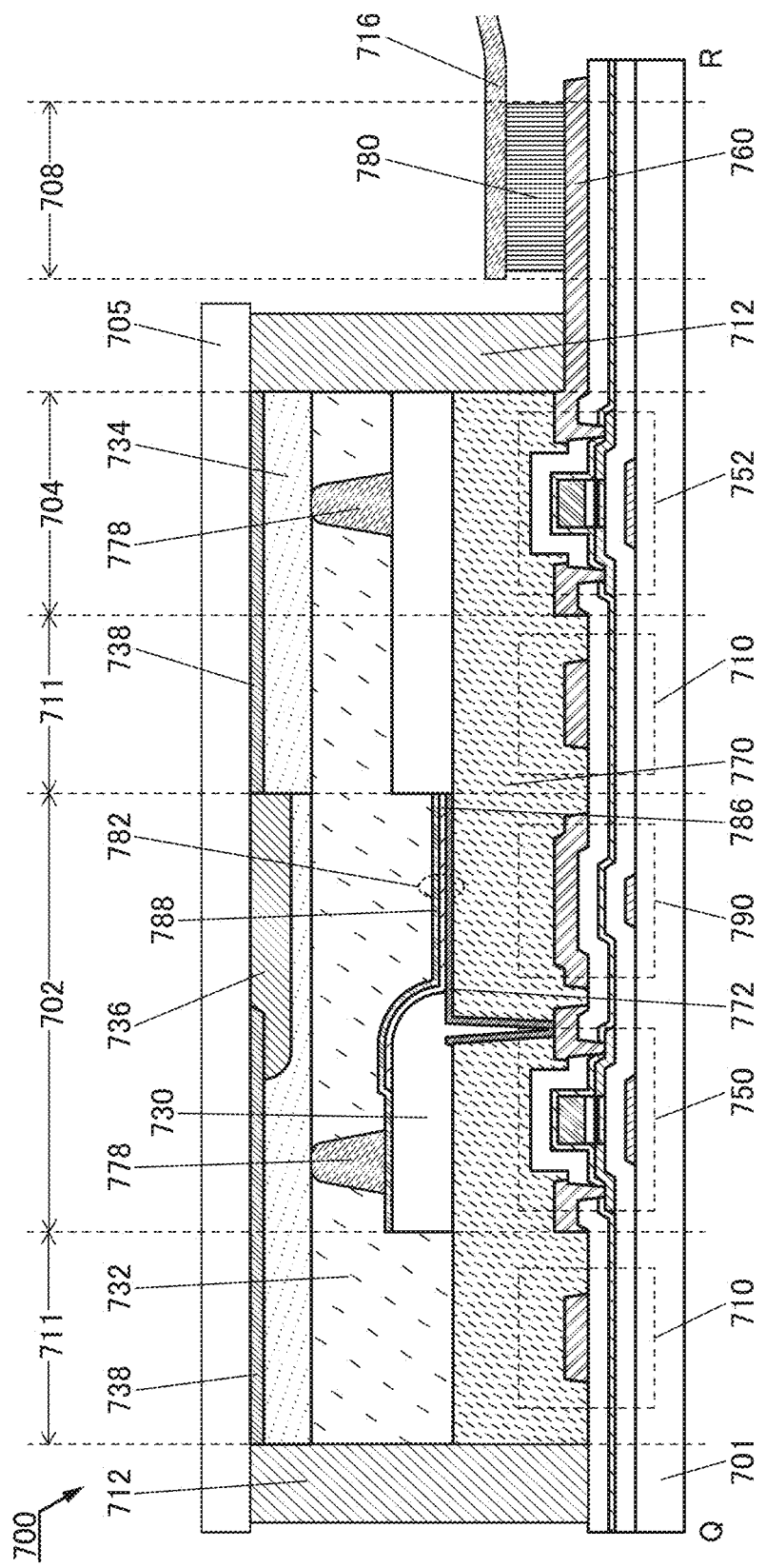
FIG. 36 is a cross-sectional view illustrating one mode of a display device.

In this embodiment, a structure including a liquid crystal element as a display element and a structure including an EL element as a display element are described with reference to FIGS. 34 to 36. FIG. 34 and FIG. 35 are each a cross-sectional view taken along a dashed-dotted line Q-R in FIG. 33 and illustrate the structure including a liquid crystal element as a display element. FIG. 36 is a cross-sectional view taken along the dashed-dotted line Q-R in FIG. 33 and illustrates the structure including an EL element as a display element.

Portions common to FIG. 34, FIG. 35, and FIG. 36 will be described first, and then, different portions will be described.

3-1. Portions Common to Display Devices

The display device 700 in FIG. 34, FIG. 35, and FIG. 36 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 150A. Note that the transistor 750 and the transistor 752 may each have the structure of any of the other transistors described in the above embodiments.

The transistor used in this embodiment includes an oxide semiconductor film that is highly purified and in which formation of oxygen vacancies are suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes or a second gate electrode of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which an insulating film functioning as a dielectric film is positioned between the pair of electrodes.

In FIG. 34, FIG. 35, and FIG. 36, a planarization insulating film 770 is provided over the transistor 750, the transistor 752, and the capacitor 790.

Although FIG. 34, FIG. 35, and FIG. 36 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

3-2. Structure Example of Display Device Including Liquid Crystal Element

The display device 700 in FIG. 34 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 34 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light.

In the case where a conductive film that reflects visible light is used as the conductive film 772, the display device 700 is a reflective liquid crystal display device. In the case where a conductive film that transmits visible light is used as the conductive film 772, the display device 700 is a transmissive liquid crystal display device.

The method for driving the liquid crystal element can be changed by changing the structure over the conductive film 772, an example of this case is illustrated in FIG. 35. The display device 700 illustrated in FIG. 35 is an example of employing a horizontal electric field mode (e.g., an FFS mode) as a driving mode of the liquid crystal element. In the structure illustrated in FIG. 35, an insulating film 773 is provided over the conductive film 772, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 34 and FIG. 35, the conductive film 772 and/or the conductive film 774 may be provided with an alignment film on a side in contact with the liquid crystal layer 776. Although not illustrated in FIG. 34 and FIG. 35, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

3-3. Display Device Including Light-Emitting Element

The display device 700 illustrated in FIG. 36 includes a light-emitting element 782. The light-emitting element 782 includes a conductive film 772, an EL layer 786, and a conductive film 788. The display device 700 illustrated in FIG. 36 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The above-described organic compound and the inorganic compound can be deposited by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIGS. 39A to 39D. FIGS. 39A to 39D are cross-sectional views illustrating the method for forming the EL layer 786.

Figure 39A:
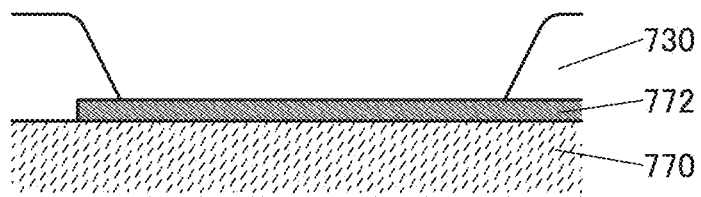
FIGS. 39A to 39D are cross-sectional views illustrating a method for forming an EL layer.
Figure 39B:
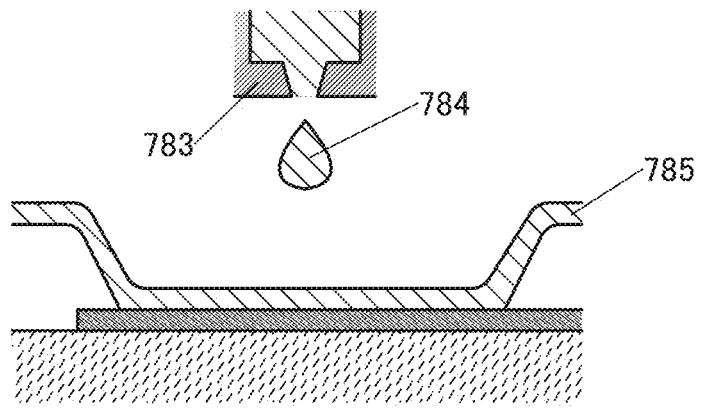

First, the conductive film 772 is formed over the planarization insulating film 770, and an insulating film 730 is formed to cover part of the conductive film 772 (see FIG. 39A).

Then, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached to the conductive film 772 (see FIG. 39B).

Note that the step of discharging the droplet 784 may be performed under reduced pressure.

Figure 39C:
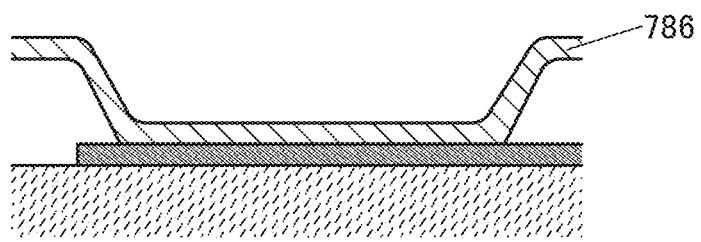

Next, the solvent is removed from the layer 785 containing the composition, and the resulting layer is solidified to form the EL layer 786 (see FIG. 39C).

The solvent may be removed by drying or heating.

Figure 39D:
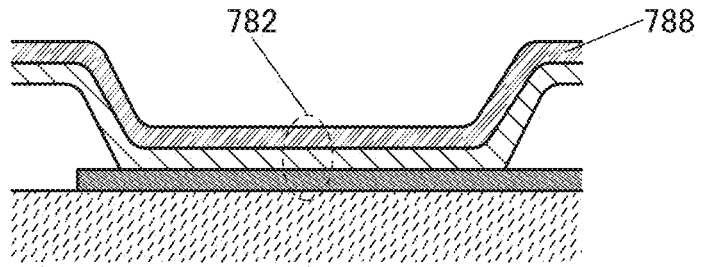

Next, the conductive film 788 is formed over the EL layer 786; thus, the light-emitting element 782 is formed (see FIG. 39D).

When the EL layer 786 is formed by a droplet discharge method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 40:
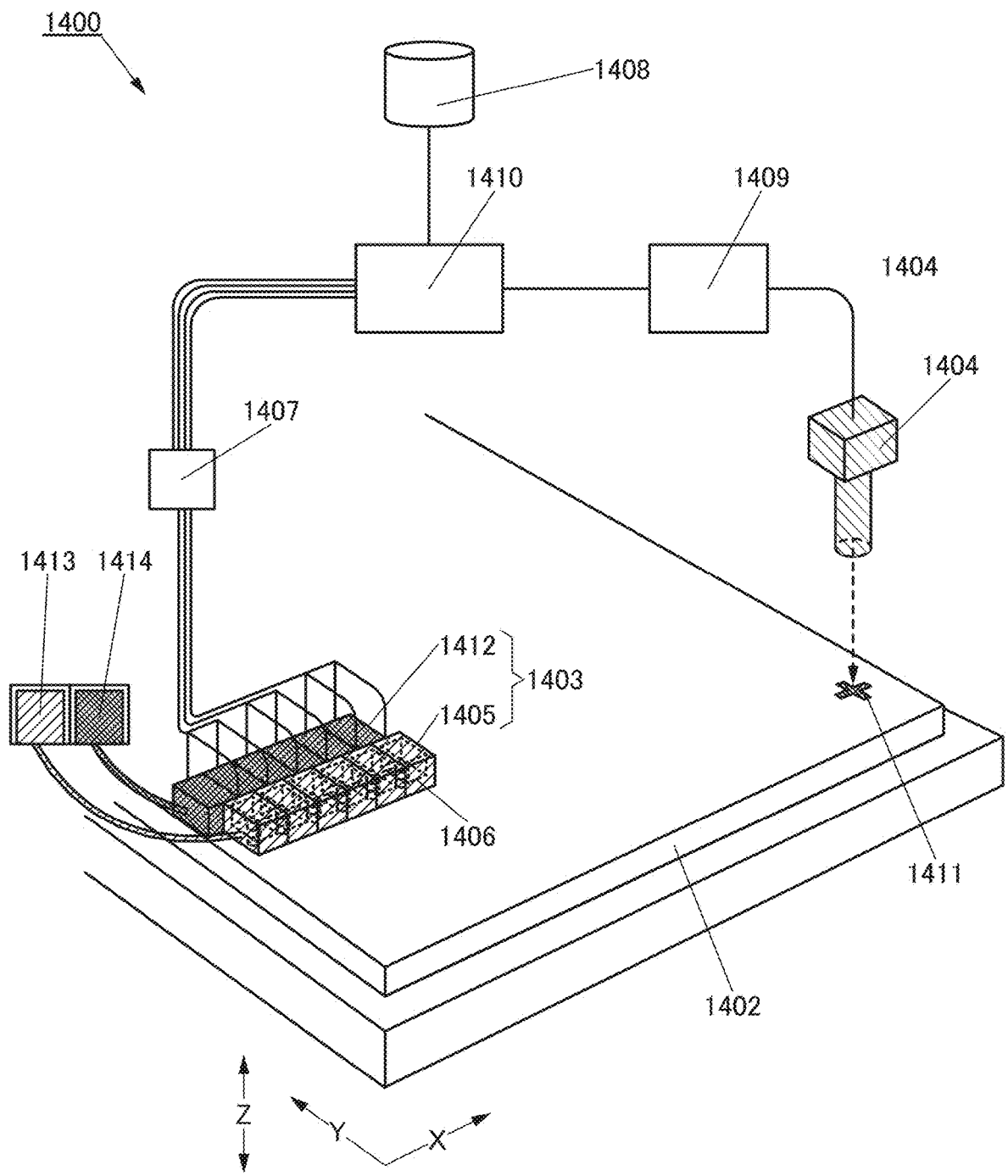
FIG. 40 is a conceptual diagram illustrating a droplet discharge apparatus.

Next, a droplet discharge apparatus used for the droplet discharge method is described with reference to FIG. 40. FIG. 40 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information about a pattern to be formed over the substrate 1402 is stored in a storage medium 1408, and a control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 40, and a region in which a pattern is drawn can be freely set. Thus, a plurality of the same patterns can be drawn over one substrate.

Furthermore, a step of discharging the composition may be performed under reduced pressure. A substrate may be heated when the composition is discharged. After discharging the composition, either drying or baking or both of them are performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that there is no particular limitation on the timing of the heat treatment and the number of times of the heat treatment. The temperature for performing each of the steps of drying and baking in a favorable manner depends on the materials of the substrate and the properties of the composition.

In the above-described manner, the EL layer 786 can be formed with the droplet discharge apparatus.

Let's go back to the explanation of the display device 700 illustrated in FIG. 36.

In the display device 700 in FIG. 36, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 36, in which the coloring film 736 is provided. For example, a structure without the coloring film 736 may also be employed in the case where the EL layer 786 is formed by separate coloring.

3-4. Structure Example of Display Device Provided with Input/Output Device

An input/output device may be provided in the display device 700 illustrated in FIG. 35 and FIG. 36. As an example of the input/output device, a touch panel or the like can be given.

Figure 37:
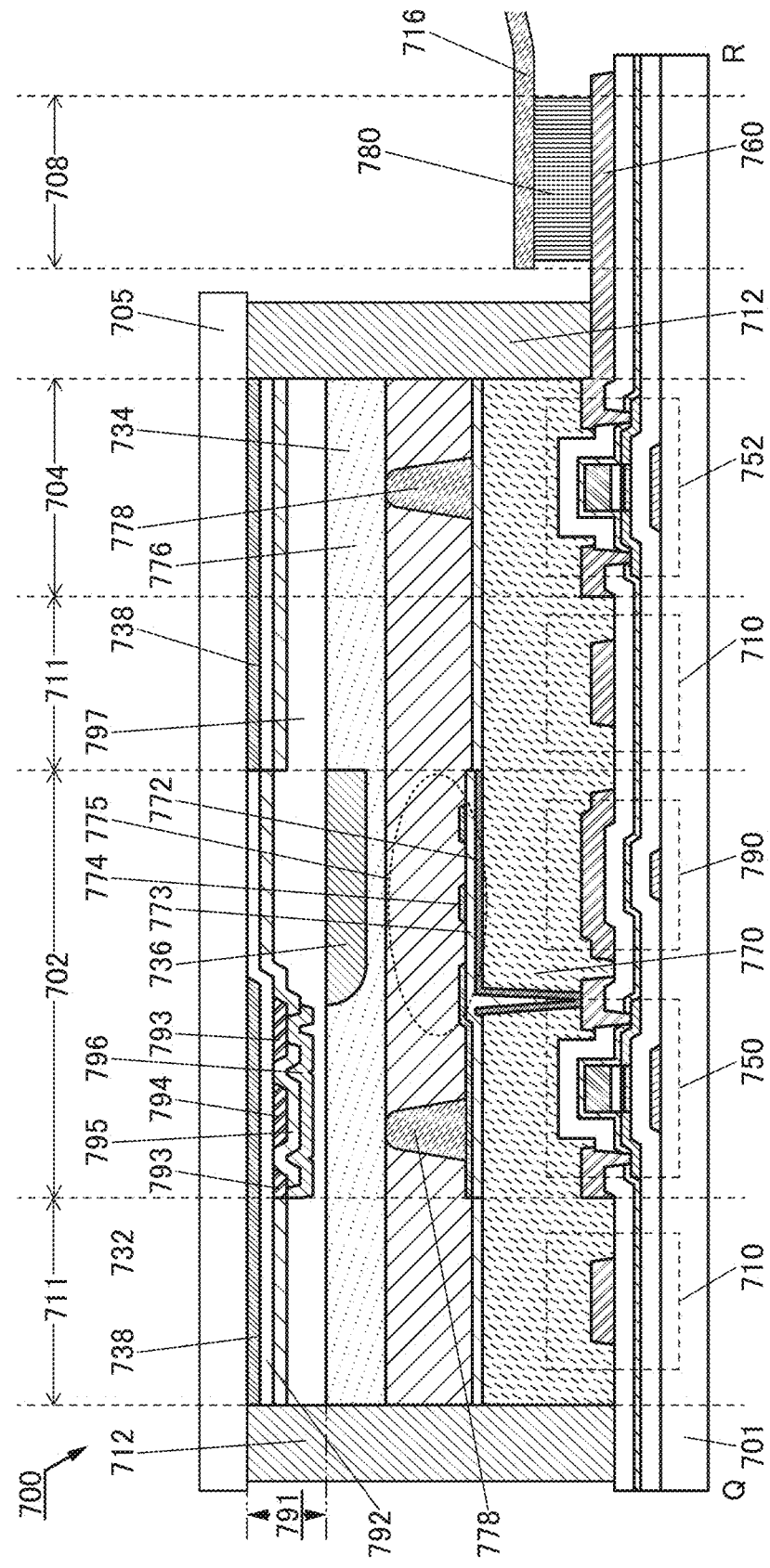
FIG. 37 is a cross-sectional view illustrating one mode of a display device.
Figure 38:
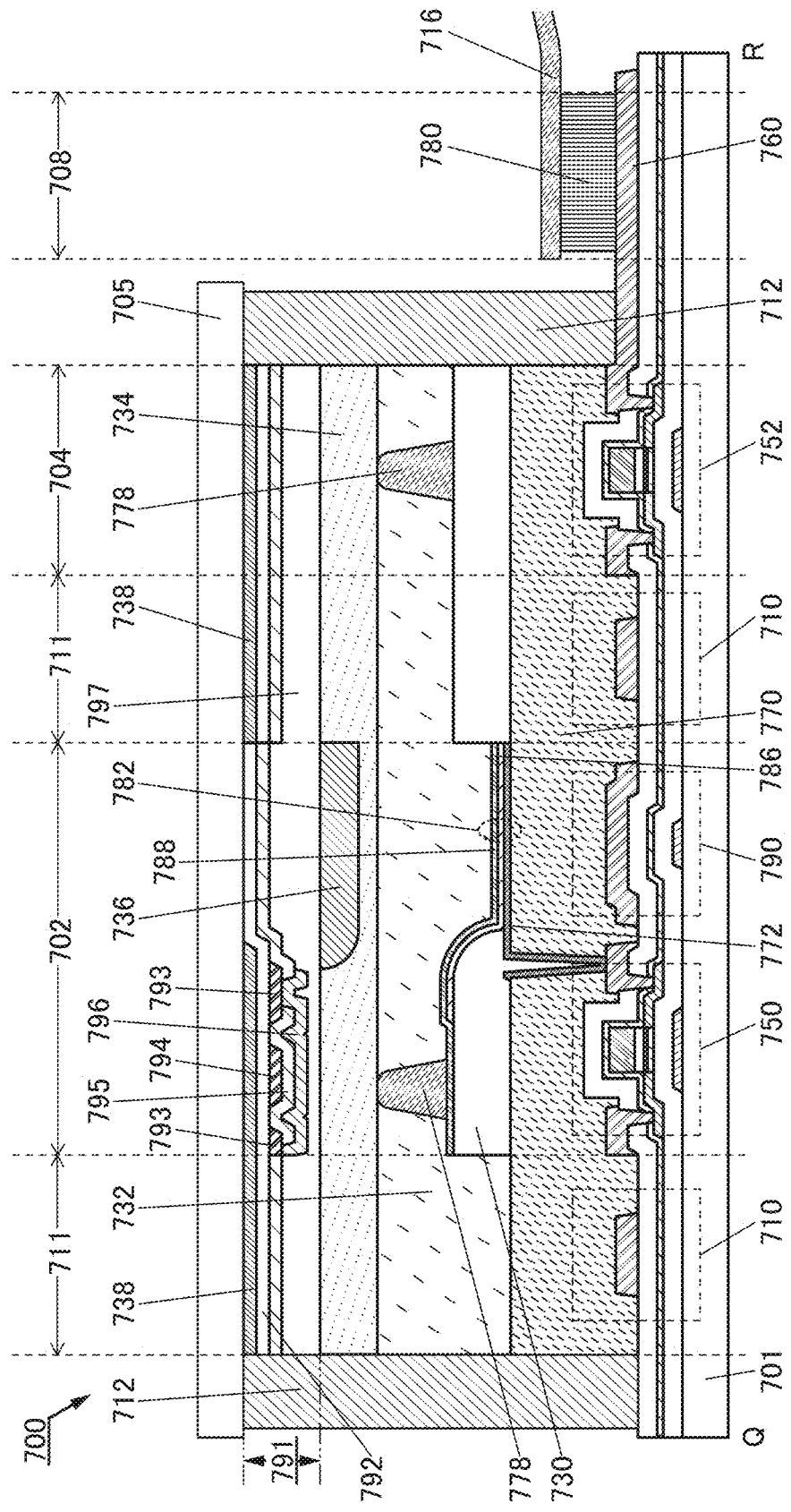
FIG. 38 is a cross-sectional view illustrating one mode of a display device.

FIG. 37 illustrates a structure in which the display device 700 illustrated in FIG. 35 includes a touch panel 791. FIG. 38 illustrates a structure in which the display device 700 illustrated in FIG. 36 includes the touch panel 791.

FIG. 37 is a cross-sectional view of the structure in which the touch panel 791 is provided in the display device 700 illustrated in FIG. 35, and FIG. 38 is a cross-sectional view of the structure in which the touch panel 791 is provided in the display device 700 illustrated in FIG. 36.

First, the touch panel 791 illustrated in FIG. 37 and FIG. 38 will be described below.

The touch panel 791 illustrated in FIG. 37 and FIG. 38 is what is called an in-cell touch panel provided between the substrate 705 and the coloring film 736. The touch panel 791 is formed on the substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 37 and FIG. 38. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 37 and FIG. 38 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 37, it is preferable that the electrode 793 do not overlap with the light-emitting element 782. As illustrated in FIG. 38, it is preferable that the electrode 793 do not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 664, 665, and 667. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 37 and FIG. 38, one embodiment of the present invention is not limited thereto. For example, a touch panel formed over the display device 700, what is called an on-cell touch panel, or a touch panel attached to the display device 700, what is called an out-cell touch panel may be used.

At least part of this embodiment can be implemented in combination with any of the other embodiments described in this specification as appropriate.

Note that the structures described in this embodiment can be combined as appropriate with any of the structures described in the other embodiments.

Embodiment 4

In this embodiment, a display device including a semiconductor device of one embodiment of the present invention will be described with reference to FIGS. 41A to 41C.

4. Circuit Configuration of Display Device

A display device illustrated in FIG. 41A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 41A:
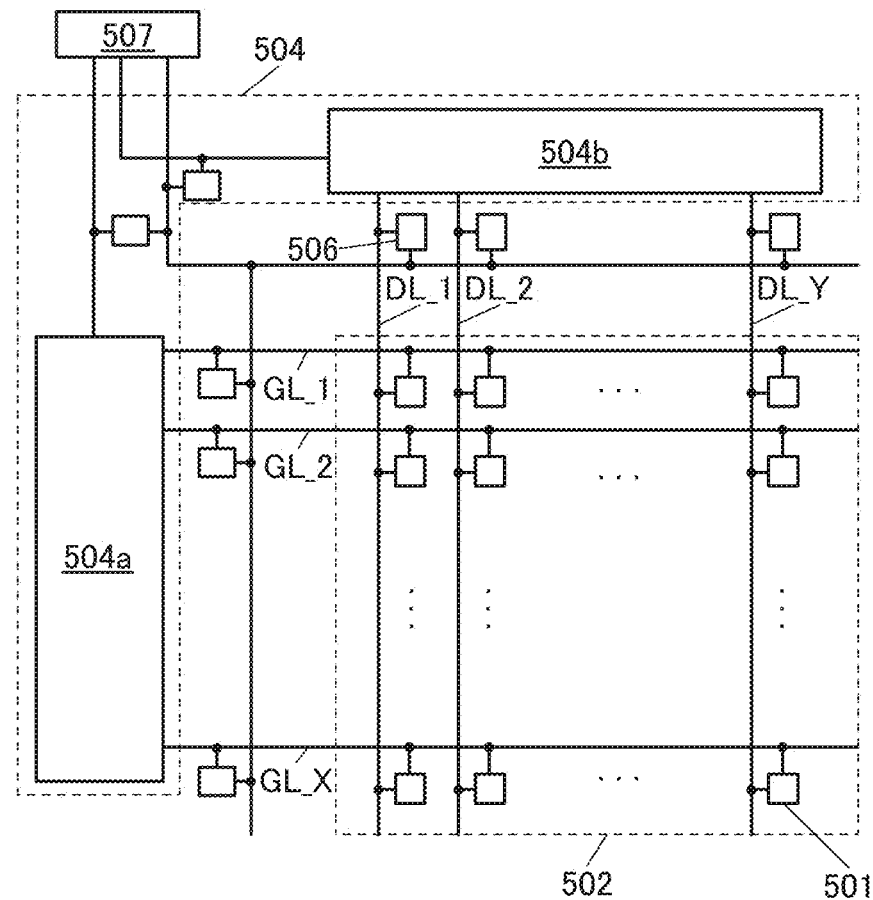
FIGS. 41A to 41C are a block diagram and circuit diagrams illustrating a display device.

The protection circuit 506 in FIG. 41A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 41A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 41A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single-crystal semiconductor film or a polycrystalline semiconductor film) may be mounted.

Figure 41B:
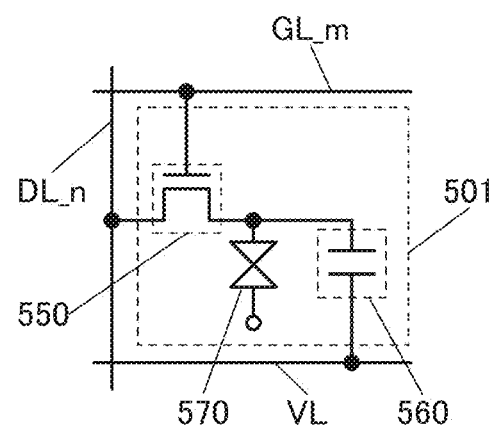

Each of the plurality of pixel circuits 501 in FIG. 41A can have the configuration illustrated in FIG. 41B, for example.

The pixel circuit 501 in FIG. 41B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 41B, the gate driver 504a in FIG. 41A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 41C:
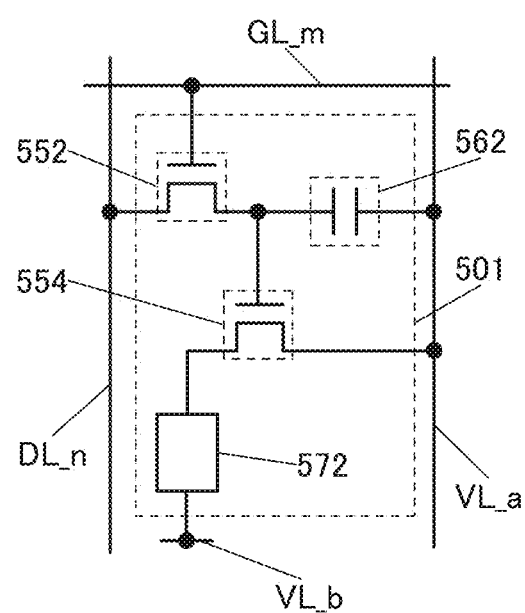

Alternatively, each of the plurality of pixel circuits 501 in FIG. 41A can have the configuration illustrated in FIG. 41C, for example.

The pixel circuit 501 in FIG. 41C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 41C, the gate driver 504a in FIG. 41A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 5

In this embodiment, a display module and electronic devices, each of which includes a semiconductor device of one embodiment of the present invention, are described with reference to FIG. 42, FIGS. 43A to 43E, FIGS. 44A to 44G, and FIGS. 45A and 45B.

5-1. Display Module

Figure 42:
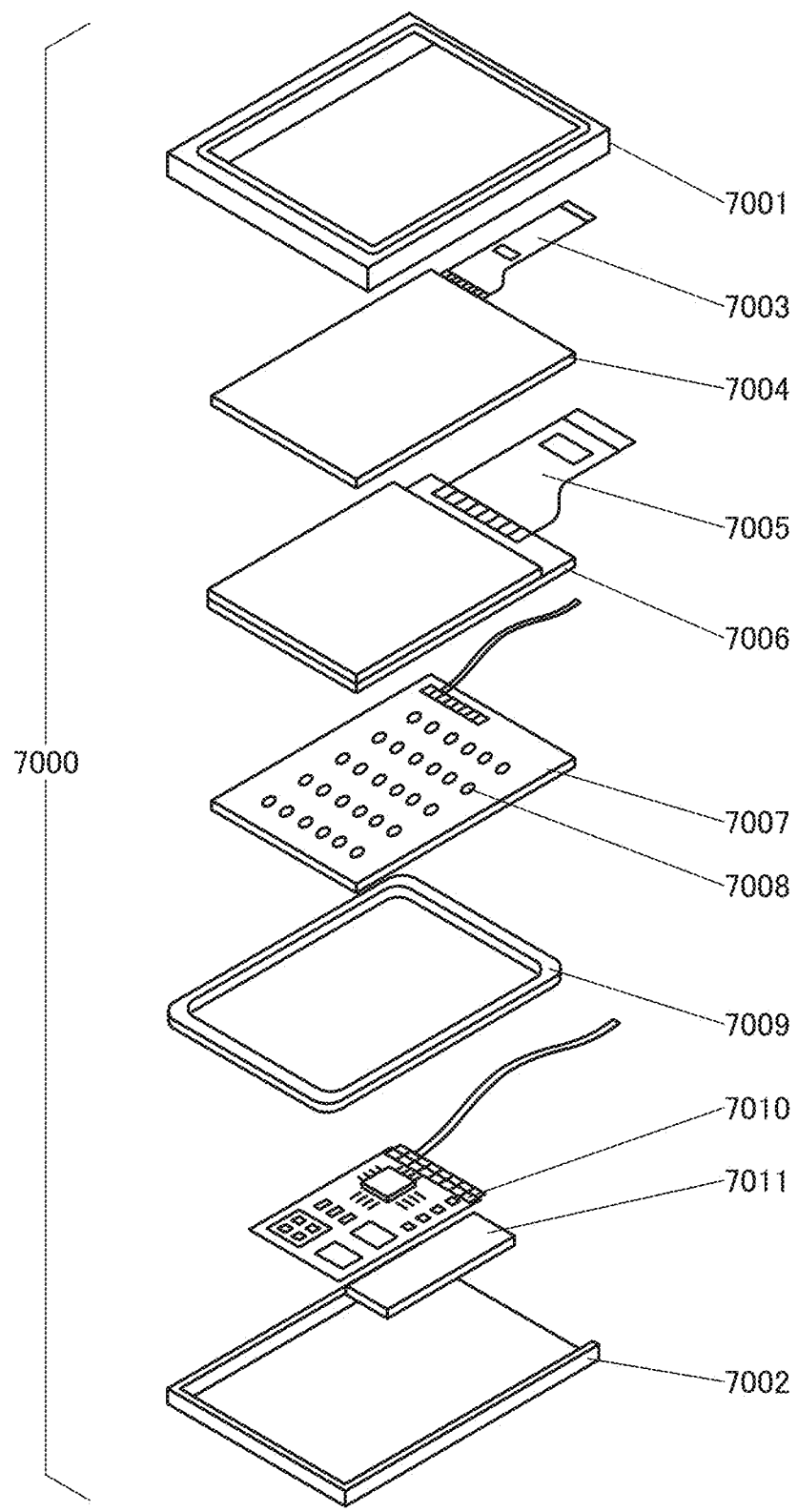
FIG. 42 illustrates a display module.

In a display module 7000 illustrated in FIG. 42, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 42, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

5-2. Electronic Device 1

Next, FIGS. 43A to 43E illustrate examples of electronic devices.

Figure 43A:
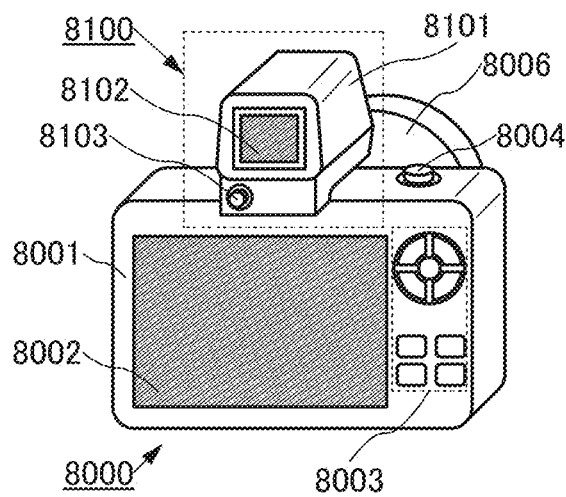
FIGS. 43A to 43E illustrate electronic devices.

FIG. 43A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 43A, the housing 8001 of the camera 8000 may include a finder having a display device.

Figure 43B:
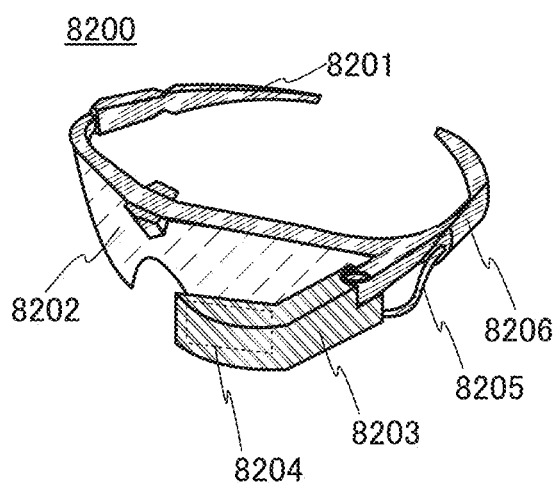

FIG. 43B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 43C:
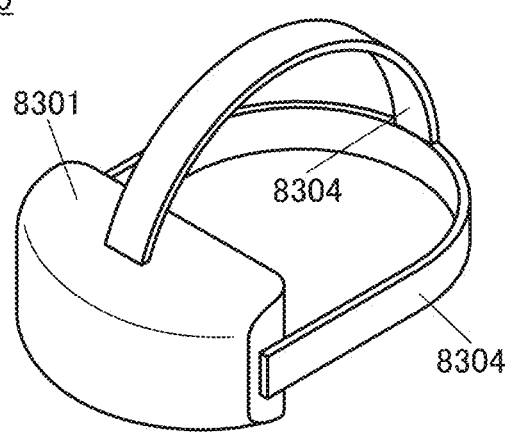
Figure 43D:
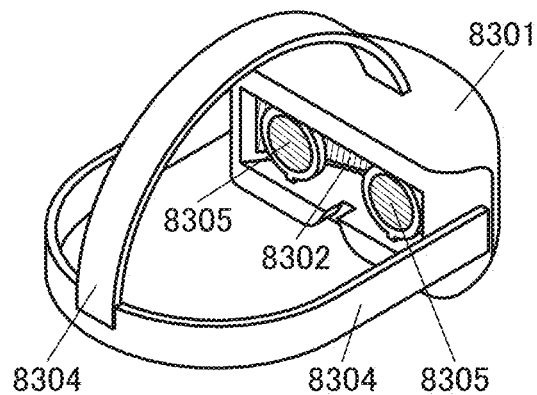
Figure 43E:
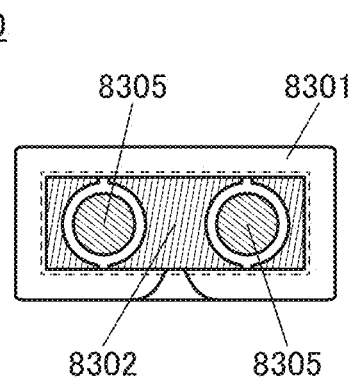

FIGS. 43C to 43E are external views of a head-mounted display 8300. The head-mounted display 8300 includes a housing 8301, a display portion 8302, a band-shaped object 8304 for fixing the display, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 43E, the user does not perceive pixels, and thus a more realistic image can be displayed.

5-3. Electronic Device 2

Next, FIGS. 44A to 44G illustrate examples of electronic devices that are different from those illustrated in FIGS. 43A to 43E.

Electronic devices illustrated in FIGS. 44A to 44G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 44A to 44G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 44A to 44G are not limited thereto, and the electronic devices can have a variety of functions. Although not illustrated in FIGS. 44A to 44G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 44A to 44G are described in detail below.

Figure 44A:
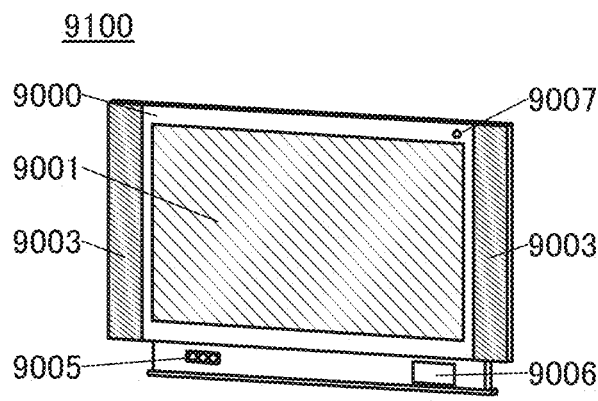
FIGS. 44A to 44G illustrate electronic devices.

FIG. 44A is a perspective view illustrating a television device 9100. The television device 9100 can include the display portion 9001 having a large screen size of, for example, 50 inches or more, or 100 inches or more.

Figure 44D:
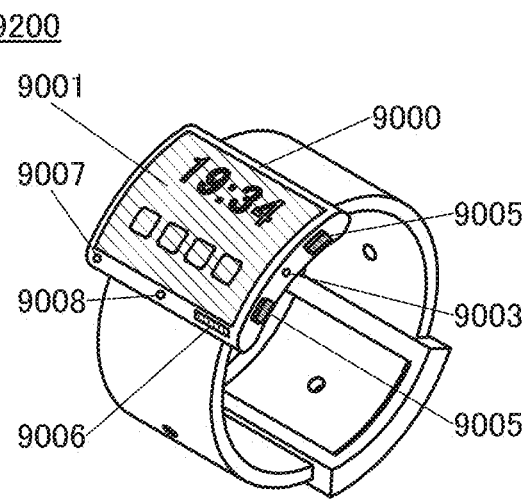
Figure 44B:
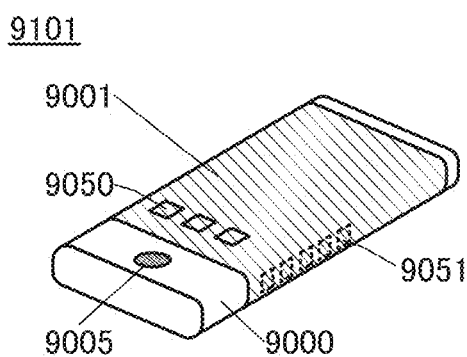

FIG. 44B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 44E:
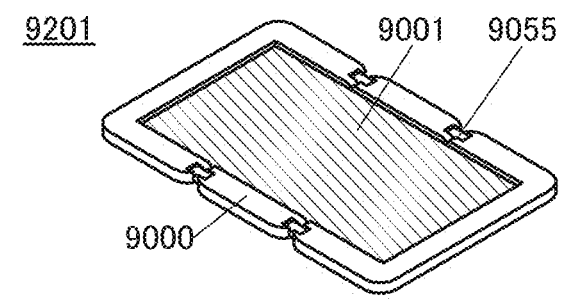
Figure 44C:
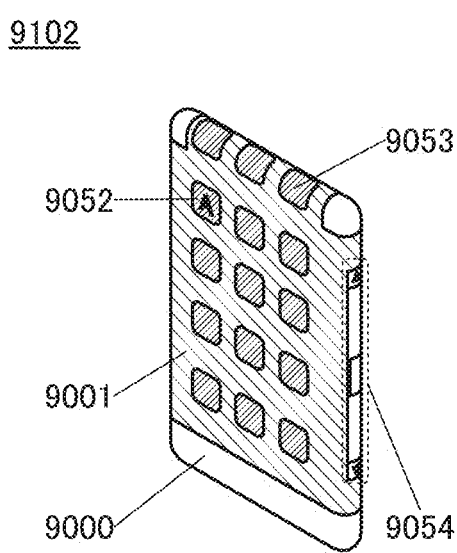

FIG. 44C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 44D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 44F:
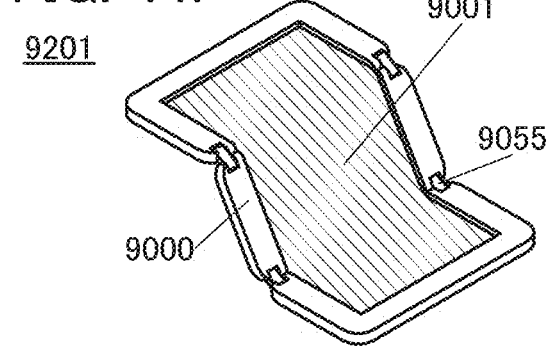
Figure 44G:
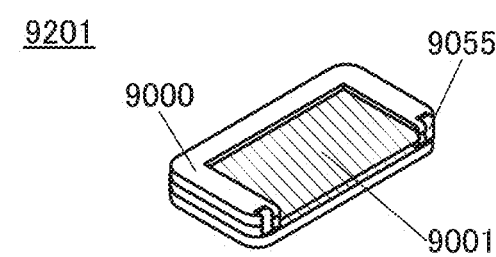

FIGS. 44E, 44F, and 44G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 45A:
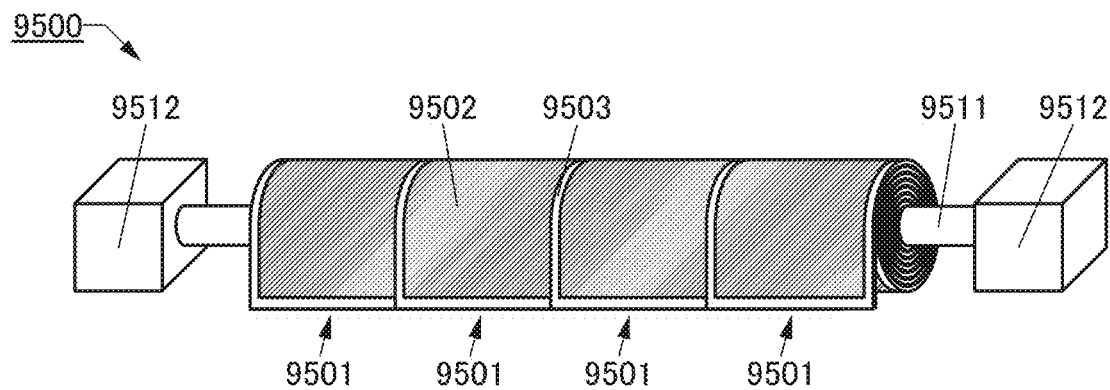
FIGS. 45A and 45B are perspective views illustrating a display device.
Figure 45B:
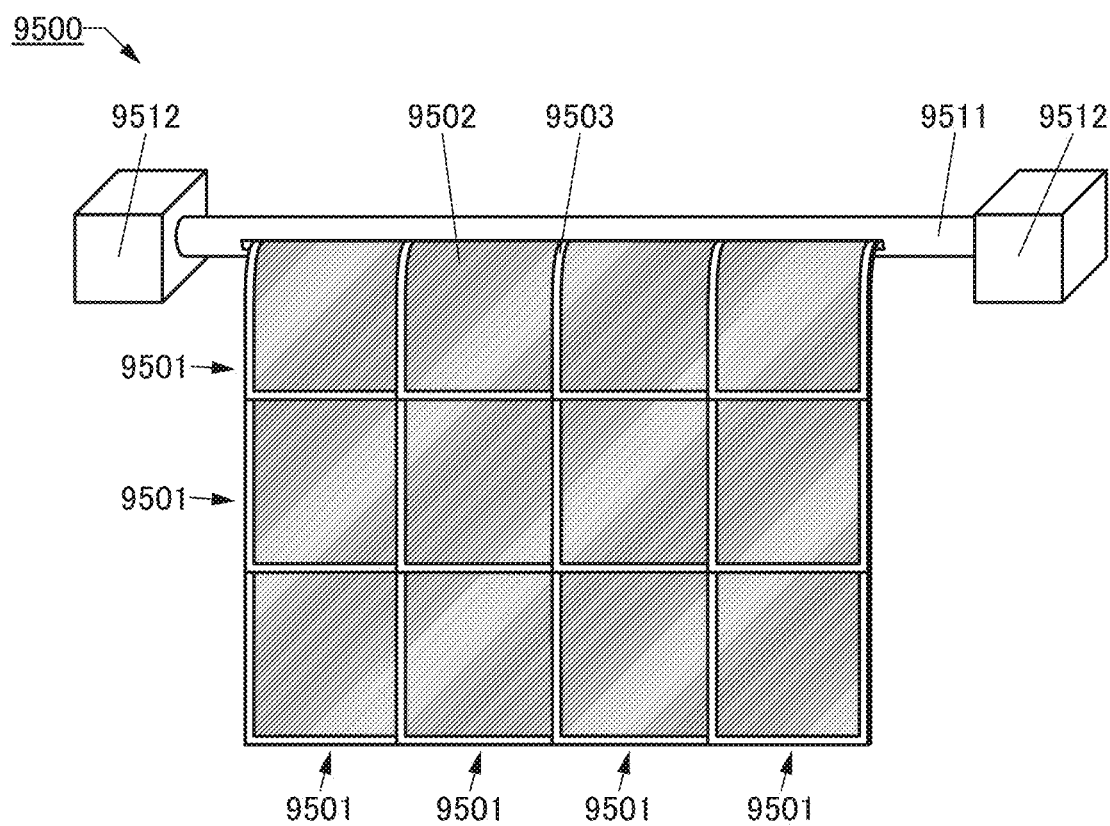

Next, an example of an electronic device that is different from the electronic devices illustrated in FIGS. 43A to 43E and FIGS. 44A to 44G is illustrated in FIGS. 45A and 45B. FIGS. 45A and 45B are perspective views of a display device including a plurality of display panels. The plurality of display panels are wound in the perspective view in FIG. 45A and are unwound in the perspective view in FIG. 45B.

A display device 9500 illustrated in FIGS. 45A and 45B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 45A and 45B, without limitation to this structure, the display regions 9502 of the adjacent display panels 9501 may overlap with each other without any space so that a continuous display region 9502 is obtained, for example.

Electronic devices described in this embodiment are characterized by having a display portion for displaying some sort of information. Note that the semiconductor device of one embodiment of the present invention can also be used for an electronic device that does not have a display portion.

At least part of this embodiment can be implemented in combination with any of the other embodiments and the other examples described in this specification as appropriate.

Example

In this example, results of elemental analysis and crystallinity evaluation of In—Ga—Zn oxide films (hereinafter referred to as IGZO films) formed by any of the methods described in the above embodiments will be described.

An IGZO film of Sample A1 of this example was formed over a glass substrate with the intended thickness set to 100 nm by a sputtering method using an In—Ga—Zn oxide target (with an atomic ratio of In:Ga:Zn=4:2:4.1). The IGZO film was formed in an atmosphere including an argon gas at 180 sccm and an oxygen gas at 20 sccm, where the pressure was controlled to 0.6 Pa, the substrate temperature was room temperature, and an alternating-current power of 2.5 kW was applied.

A cross section of the IGZO film of Sample A1 was subjected to measurement using energy dispersive X-ray spectroscopy (EDX). The EDX measurement was performed using an atomic resolution analytical electron microscope JEM-ARM200F manufactured by JEOL Ltd. under conditions where the acceleration voltage was 200 kV, and irradiation with an electron beam with a diameter of approximately 0.1 nmφ was performed. An energy dispersive X-ray spectrometer JED-2300T was used as an elemental analysis apparatus. A Si drift detector was used to detect X-rays emitted from Sample A1.

In the EDX measurement, an EDX spectrum of a point is obtained in such a manner that electron beam irradiation is performed on the point in an analysis target region of Sample A1, and the energy of characteristic X-rays of the sample generated by the irradiation and its frequency are measured. In this example, peaks of an EDX spectrum of the point were attributed to electron transitions in an In atom, a Ga atom, a Zn atom, and an O atom, and the proportions of the atoms in the point were calculated. An EDX mapping image indicating distributions of proportions of the atoms can be obtained through this process in an analysis target region of Sample A1.

Figure 46:
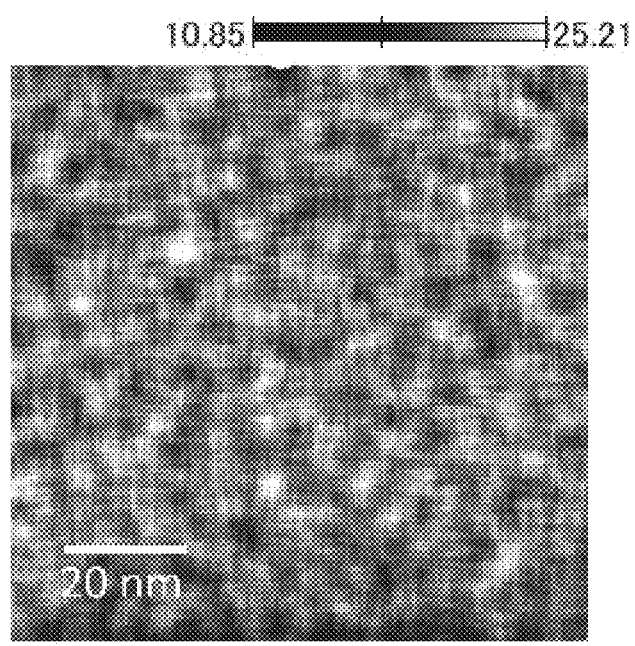
FIG. 46 shows an EDX mapping image of a cross section of a sample of Example.

FIG. 46 shows an EDX mapping image of In atoms in the cross section of the IGZO film of Sample A1. The EDX mapping image in FIG. 46 shows the proportions [atomic %] of In atoms in some points of the IGZO film. The proportions of In atoms in relatively dark regions in FIG. 46 are low, and the lowest proportion is 10.85 atomic %. The proportions of In atoms in relatively light regions in FIG. 46 are high, and the highest proportion is 25.21 atomic %.

The EDX mapping image in FIG. 46 shows the distribution of light and dark, indicating segregation of In atoms in the cross section of the IGZO film. Here, many of the relatively light regions in the EDX mapping image have a substantially circular or elliptical shape. In addition, regions formed by connection of a plurality of regions having a substantially circular or elliptical shape are observed. In other words, regions having a substantially circular or elliptical shape are formed in a net-like manner. As described above, the relatively light regions are regions where In exists at a high concentration, and correspond to Regions A described in the above embodiment. Note that each of Regions A is not so large as to cross the analysis target region longitudinally or transversely, and is formed in an island-like manner and surrounded by a relatively dark region (corresponding to Region B described in the above embodiment). Regions with an intermediate shade are also formed between Regions A and Region B, and in some portions, the boundary between Regions A and B is not clear. Many of Regions A having a substantially circular or elliptical shape have a size in the range from approximately 0.1 nm to 5 nm.

As described above, the IGZO film of Sample A1 is a composite oxide semiconductor where In-rich Regions A and In-poor Region B are formed. Regions A contribute to the on-state current and field-effect mobility of a transistor, and Region B contributes to the switching characteristics of a transistor. Therefore, with the use of the composite oxide semiconductor, a transistor with favorable electrical characteristics can be manufactured.

Furthermore, since Regions A are formed in an island-like manner and surrounded by Region B, it is possible to suppress an increase in off-state current due to connection of a source and a drain of a transistor to each other through Regions A.

Unlike the IGZO film of Sample A1, an IGZO film of Sample B1 was formed in an atmosphere including an argon gas at 140 sccm and an oxygen gas at 60 sccm, where the substrate temperature was 170° C. Note that the other conditions for forming the IGZO film of Sample B1 are similar to those for the IGZO film of Sample A1.

Figure 47A:
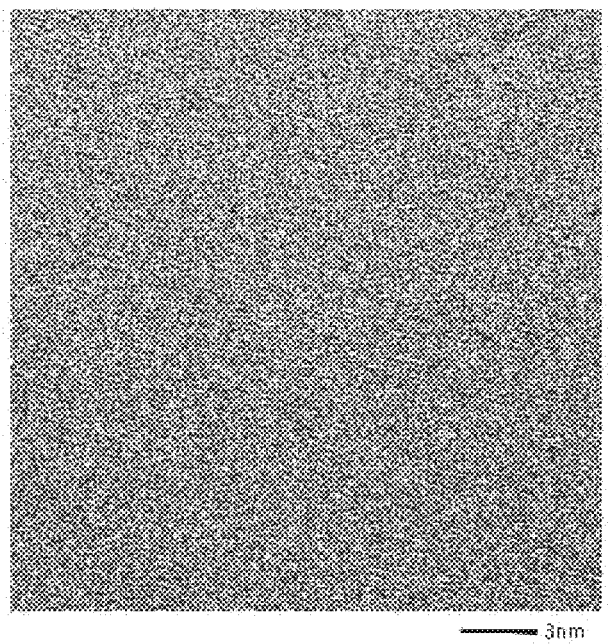
FIGS. 47A and 47B show BF-STEM images of cross sections of samples of Example.
Figure 47B:
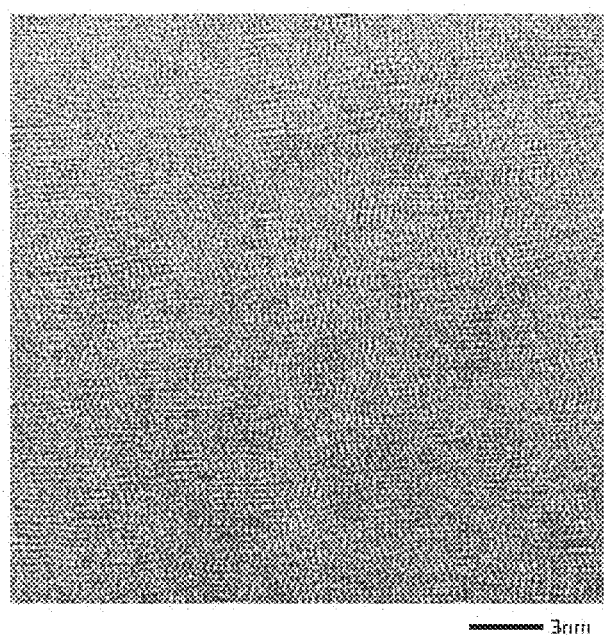

Bright-field scanning transmission electron microscopy (BF-STEM) images of cross sections of Samples A1 and B1 were taken at a magnification of 2000000 times. FIG. 47A shows the BF-STEM image of Sample A1, and FIG. 47B shows the BF-STEM image of Sample B1.

As shown in FIG. 47A, although the area is small, a layered crystal part is formed and a crystal part with c-axis alignment is also observed in the IGZO film of Sample A1. In contrast, in the IGZO film of Sample B1 shown in FIG. 47B, a layered crystal part is formed in a larger area than in the IGZO film of Sample A1. Thus, such a layered crystal part is also observed in the IGZO film of Sample A1, which shows segregation of In atoms. It is also suggested that the crystallinity of an IGZO film can possibly be improved by increasing the flow rate ratio of oxygen and increasing the substrate temperature during formation of the IGZO film.

More samples were fabricated by forming IGZO films at different oxygen flow rates and different substrate temperatures, and were subjected to crystallinity evaluation. The IGZO films of these samples were each formed at an oxygen flow rate ratio of 10% (an oxygen gas at 20 sccm and an argon gas at 180 sccm), 30% (an oxygen gas at 60 sccm and an argon gas at 140 sccm), 50% (an oxygen gas at 100 sccm and an argon gas at 100 sccm), 70% (an oxygen gas at 140 sccm and an argon gas at 60 sccm), or 100% (an oxygen gas at 200 sccm) and a substrate temperature of room temperature, 130° C., or 170° C. Note that the other conditions for forming the IGZO film of each sample are similar to those for the IGZO film of Sample A1.

The crystallinity of the IGZO film of each sample was evaluated by XRD measurement. The XRD measurement was performed using a powder method (also referred to as a θ-2θ method), which is a kind of an out-of-plane method. In a θ-2θ method, X-ray diffraction intensity is measured while an incident angle of an X-ray is changed and the angle of a detector facing an X-ray source is equal to the incident angle.

Figure 48B:
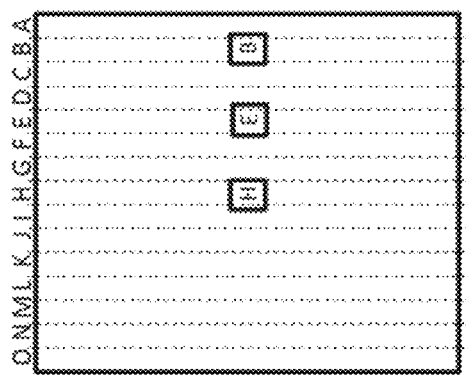
FIGS. 48A and 48B show XRD measurement results of samples of Example and XRD analysis positions.
Figure 48A:
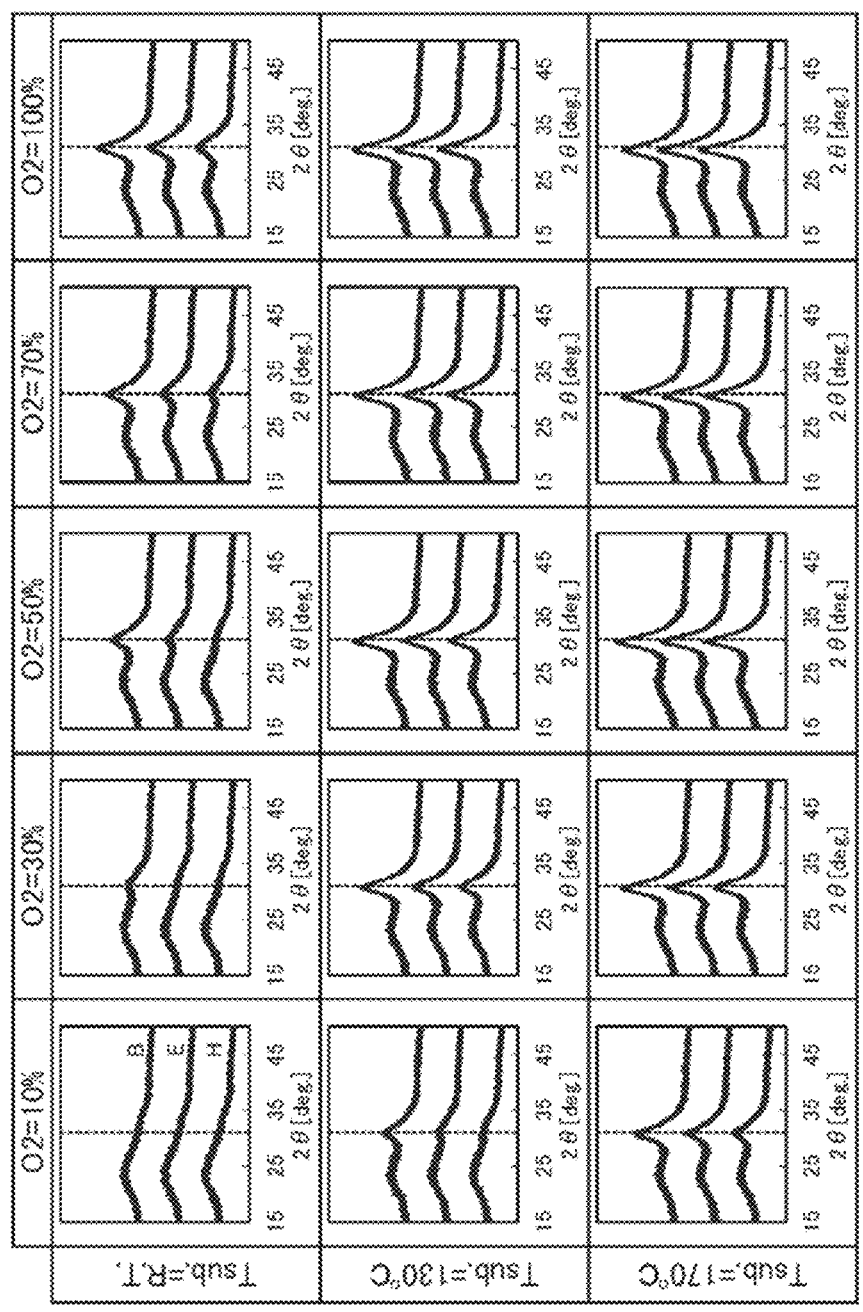

FIG. 48A shows XRD measurement results of the samples. As shown in FIG. 48B, the measurement was performed at three points within the glass substrate of each sample.

In FIG. 48A, the vertical axis represents the diffraction intensity in an arbitrary unit, and the horizontal axis represents the angle 2θ. In addition, in FIG. 48A, three XRD profiles corresponding to the three points in FIG. 48B are shown together in each graph.

As shown in FIG. 48A, from the IGZO film formed under conditions similar to those for the IGZO film of Sample A1, a diffraction intensity peak at around 2θ=31° is not clearly observed, an extremely low diffraction intensity peak at around 2θ=31° is observed, or no diffraction intensity peak at around 2θ=31° is observed. In contrast, from the IGZO film formed under conditions similar to those for the IGZO film of Sample B1, a diffraction intensity peak at around 2θ=31° is clearly observed.

Note that the diffraction angle (at around 2θ=31°) at which the diffraction intensity peak is observed corresponds to a diffraction angle on the (009) plane of the structure model of single crystal $InGaZnO_4$. Accordingly, the above-described peak observed from the IGZO film formed under conditions similar to those for the IGZO film of Sample B1 confirms that the film includes a crystal part with c-axis alignment.

In contrast, it is difficult to determine whether or not the IGZO film formed under conditions similar to those for the IGZO film of Sample A1 includes a crystal part with c-axis alignment, by XRD measurement. However, a crystal part with c-axis alignment in a microscopic region can be observed by taking a BF-STEM image or the like as shown in FIG. 47A.

As shown in FIG. 48A, the higher the oxygen flow rate ratio or the substrate temperature is during the formation of the IGZO film, the sharper the peak of its XRD profile is. This suggests that an IGZO film with higher crystallinity can be formed when the oxygen flow rate ratio or the substrate temperature is higher during formation of the IGZO film.

Note that the structure described in this example can be combined with any of the above embodiments as appropriate.

EXPLANATION OF REFERENCE

100: transistor, 100A: transistor, 102: substrate, 104: insulating film, 106: conductive film, 108: oxide semiconductor film, 108_1: oxide semiconductor film, 108_1a: oxide semiconductor film, 108_2: oxide semiconductor film, 108_2a: oxide semiconductor film, 108_3: oxide semiconductor film, 108_3a: oxide semiconductor film, 108i: region, 108n: region, 110: insulating film, 110_0: insulating film, 112: conductive film, 112_0: conductive film, 112_1: conductive film, 112_2: conductive film, 116: insulating film, 118: insulating film, 120a: conductive film, 120b: conductive film, 122: insulating film, 140: mask, 141a: opening, 141b: opening, 143: opening, 150: transistor, 150A: transistor, 160: transistor, 160A: transistor, 170: transistor, 170A: transistor, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 664: electrode, 665: electrode, 667: electrode, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure, 780: anisotropic conductive film, 782: light-emitting element, 783: droplet discharge apparatus, 784: droplet, 785: layer, 786: EL layer, 788: conductive film, 790: capacitor, 791: touch panel, 792: insulating film, 793: electrode, 794: electrode, 795: insulating film, 796: electrode, 797: insulating film, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411:

marker, 1412: head, 1413: material supply source, 1414: material supply source, 2500a: target, 2500b: target, 2501: deposition chamber, 2510a: backing plate, 2510b: backing plate, 2520: target holder, 2520a: target holder, 2520b: target holder, 2530a: magnet unit, 2530b: magnet unit, 2530N1: magnet, 2530N2: magnet, 2530S: magnet, 2532: magnet holder, 2542: member, 2560: substrate, 2570: substrate holder, 2580a: magnetic line of force, 2580b: magnetic line of force, 7000: display module, 7001: upper cover, 7002: lower cover, 7003: FPC, 7004: touch panel, 7005: FPC, 7006: display panel, 7007: backlight, 7008: light source, 7009: frame, 7010: printed-circuit board, 7011: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: object for fixing, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal, 9500: display device, 9501: display panel, 9502: display region, 9503: region, 9511: hinge, 9512: bearing.

This application is based on Japanese Patent Application serial No. 2016-048704 filed with Japan Patent Office on Mar. 11, 2016 and Japanese Patent Application serial No. 2016-125378 filed with Japan Patent Office on Jun. 24, 2016, the entire contents of which are hereby incorporated by reference.

The invention claimed is:

1. A manufacturing method of a semiconductor device, comprising:
   forming a first insulating film over a substrate;
   forming an oxide semiconductor film over the first insulating film;
   forming a second insulating film over the oxide semiconductor film;
   forming a gate electrode over the second insulating film;
   forming a third insulating film over the oxide semiconductor film and the gate electrode; and
   forming a source electrode and a drain electrode over the third insulating film and electrically connected to the oxide semiconductor film,
   wherein:
   the step of forming the oxide semiconductor film comprises:
      forming a first oxide semiconductor film;
      forming a second oxide semiconductor film over the first oxide semiconductor film; and
      forming a third oxide semiconductor film over the second oxide semiconductor film,
   the first oxide semiconductor film, the second oxide semiconductor film, and the third oxide semiconductor film are formed using the same sputtering target,
   the first oxide semiconductor film, the second oxide semiconductor film, and the third oxide semiconductor film are successively formed with a sputtering apparatus in vacuum, and
   the second oxide semiconductor film is formed under a lower oxygen partial pressure than one or both of the first oxide semiconductor film and the third oxide semiconductor film.

2. The manufacturing method according to claim 1, wherein each of the first oxide semiconductor film, the second oxide semiconductor film, and the third oxide semiconductor film comprises indium, gallium, and zinc.

3. The manufacturing method according to claim 1, wherein:
   the first oxide semiconductor film is formed with a first oxygen flow rate ratio;
   the second oxide semiconductor film is formed with a second oxygen flow rate ratio;
   the third oxide semiconductor film is formed with a third oxygen flow rate ratio; and
   the second oxygen flow rate ratio is lower than at least one of the first oxygen flow rate ratio and the third oxygen flow rate ratio.

4. The manufacturing method according to claim 3, further comprising:
   forming a pair of regions in the oxide semiconductor film after forming the gate electrode,
   wherein:
   the pair of regions has a higher conductivity than a channel formation region, and
   the source electrode and the drain electrode are electrically connected to the pair of regions, respectively.

5. The manufacturing method according to claim 1, wherein a temperature of the substrate in forming the second oxide semiconductor film is same as a temperature of the substrate in forming the first oxide semiconductor film and a temperature of the substrate in forming the third oxide semiconductor film.

6. The manufacturing method according to claim 1, wherein the substrate is a glass substrate.

7. The manufacturing method according to claim 1, wherein the second oxide semiconductor film comprises a region where a crystallinity is lower than a crystallinity of the first oxide semiconductor film and a crystallinity of the third oxide semiconductor film.

8. The manufacturing method according to claim 1, further comprising:
   forming a first conductive film over the substrate,
   wherein the oxide semiconductor film is formed over the first conductive film with the first insulating film interposed therebetween.

* * * * *